United States Patent [19]

Toyoda et al.

[11] Patent Number: 6,001,461

[45] Date of Patent: Dec. 14, 1999

[54] ELECTRONIC PARTS AND MANUFACTURING METHOD THEREOF

[75] Inventors: Hiroshi Toyoda, Kokohama; Hisashi Kaneko, Fujisawa; Masahiko Hasunuma; Takashi Kawanoue, both of Yokohama; Hiroshi Tomita, Hadano; Akihiro Kajita, Yokohama; Masami Miyauchi, Yokohama; Takashi Kawakubo, Yokohama; Sachiyo Ito, Yokohama, all of Japan

[73] Assignee: Kabushiki Kaisha Toshiba, Japan

[21] Appl. No.: 08/771,388

[22] Filed: Dec. 19, 1996

Related U.S. Application Data

[63] Continuation of application No. 08/314,493, Sep. 28, 1994, abandoned, which is a continuation-in-part of application No. 08/112,210, Aug. 26, 1993, abandoned.

[30] Foreign Application Priority Data

Aug. 27, 1992 [JP] Japan .................................. 4-228264
Mar. 15, 1993 [JP] Japan .................................. 5-080108

[51] Int. Cl.$^6$ ...................................................... B32B 9/00
[52] U.S. Cl. ........................... 428/210; 428/689; 428/697; 428/698; 428/433; 428/167; 174/258; 257/745
[58] Field of Search ................................ 257/745, 748; 428/210, 689, 697, 698, 167; 174/258

[56] References Cited

U.S. PATENT DOCUMENTS

| | | | |
|---|---|---|---|
| 4,068,022 | 1/1978 | Glick | 427/125 |
| 4,234,654 | 11/1980 | Yatabe et al. | 428/434 |
| 4,352,239 | 10/1982 | Pierce | 29/590 |

(List continued on next page.)

FOREIGN PATENT DOCUMENTS

| | | |
|---|---|---|
| 0 326 018 A3 | 8/1989 | European Pat. Off. . |
| 0 465 264 A3 | 1/1992 | European Pat. Off. . |
| 0 510 969 A3 | 10/1992 | European Pat. Off. . |
| 5524754 A3 | 1/1993 | European Pat. Off. . |
| 64-37051 | 7/1987 | Japan . |
| WO 81/01629 | 6/1981 | WIPO . |

OTHER PUBLICATIONS

Shimamura et al., Microstructure of sputter–deposited Al–Cu–Si films, May/Jun., 1981, pp. 595–599, Journal of Vacuum Science & Techn., A9 No. 3, Part I.

H. Shibata et al., Influence of Under–metal Planes on Al (111) Crystal Orientation . . . , May 28–30, 1991, pp. 33, 34, 1991 Symp. on VLSI Techn., Dig. T. Pp.

(List continued on next page.)

*Primary Examiner*—Deborah Jones
*Assistant Examiner*—Cathy F. Lam
*Attorney, Agent, or Firm*—Finnegan, Henderson, Farabow, Garrett & Dunner, L.L.P.

[57] ABSTRACT

An electronic part comprising an amorphous thin film formed on a substrate; and a metal wiring formed on the surface of the amorphous thin film; wherein an interatomic distance corresponding to a peak of halo pattern appearing in diffraction measurement of the amorphous thin film approximately matches with a spacing of a particular crystal plane defined with the first nearest interatomic distance of the metal wiring. An electronic part provided with a metal wiring formed of highly orientated crystal wherein half or more of all grain boundaries are small angle grain boundaries defined by one of grain boundaries with a relative misorientation of 10° or less in tilt, rotation and combination thereof around orientation axes of neighboring crystal grains; coincidence boundaries where a Σ value is 10 or less; and grain boundaries with a relative misorientation of 3° or less from the coincidence boundary. A method for manufacturing an electronic part, comprising the step of depositing a conductor layer which is mainly formed of one selected from Al and Cu on a substrate via an insulative layer, a barrier layer, a contact layer or an amorphous thin film layer wherein one element selected from Ga, In, Cd, Bi, Pb, Sn and Tl is supplied before or during the deposition of the conductor layer.

12 Claims, 17 Drawing Sheets

U.S. PATENT DOCUMENTS

| | | |
|---|---|---|
| 4,742,014 | 5/1988 | Hooper et al. .......................... 437/192 |
| 4,942,451 | 7/1990 | Tamaki et al. ............................. 357/67 |
| 4,965,656 | 10/1990 | Koubuchi et al. ........................ 357/71 |
| 4,970,574 | 11/1990 | Tsunenari ................................. 357/71 |
| 5,011,732 | 4/1991 | Takeuchi et al. ....................... 428/210 |
| 5,051,812 | 9/1991 | Onuki et al. .............................. 357/71 |
| 5,110,637 | 5/1992 | Ando et al. ............................. 428/428 |
| 5,233,217 | 8/1993 | Dixit et al. ............................. 257/530 |
| 5,296,297 | 3/1994 | Servais et al. .......................... 428/428 |
| 5,399,435 | 3/1995 | Ando et al. ............................. 428/428 |
| 5,498,909 | 3/1996 | Hasunuma et al. ..................... 257/754 |

OTHER PUBLICATIONS

"Microstructure and Magnetic Properties of CoCr Thin Films Formed on Ge Layer", Futamoto et al., IEEE Transactions on Magnetics, vol. MAG–21, No. 5, pp. 1426–1428, Sep. 1985.

"Electromigration Characteristics of VIAS in Ti:W/ALcu (2st%) Multilayered Metallization", J. May, IEEE Reliability Physics 1991, Cat. No. 91CH2974–4.

A Quarter–Micron Interconnection Technology Using Al–Si–Cu/TiN Alternated Layers, T. Kikkawa, et al., IEEE Int'l Electron Devices Meeting (1991).

Tungsten/Titanium Nitride Low–Resistance Interconnections Durable for High Temperature Processing, Nakasaki et al., Journal of Applied Physics (1988).

Electromigration Phenomena In Al–Si and Al–V–Si Thin Alloy Films, P. Van Engelen et al., Thin Solid Films, pp. 999–1007 (1990).

Studies of the Interaction Between Aluminum and Nickel, Chromium Andrnated Nichrome Alloy Films, A. Gershiniski, Thin Solid Films, pp. 171–181 (1988).

A Candidate for Interconnection Material, Al–Y Alloy Thin Films, Y. Ki Lee, et al., Materials Letters, vol. 10, No. 7,8, pp. 344–347 (1991).

1000Å

1000Å

- FACE-CENTERED CUBIC (FCC)

- BODY-CENTERED CUBIC (BCC)

- HEXAGONAL (HCP)

ELECTRONIC PARTS AND MANUFACTURING METHOD THEREOF

This application is a continuation of application Ser. No. 08/314,493, filed Sep. 28, 1994, which is a continuation-in-part of application Ser. No. 08/112,210, filed Aug. 26, 1993, both now abandoned.

BACKGROUND OF THE INVENTION

1. Field of the Invention

The present invention relates to electronic parts such as integrated circuit (IC) devices, and particularly to electronic parts with metal wiring having higher reliability e.g., the improved electromigration endurance, and manufacturing method thereof.

2. Description of the Related Art

Recently integration in memory IC devices represented by D-RAMs has been increasing. With the increase, wiring electrically connecting between elements becomes finer. This fineness requires wiring for a higher current density and operating temperature. At the same time, wiring is required for the further improved electromigration endurance, thereby attaining high reliability. However, the electromigration endurance is inversely proportional to a current density and operating temperature. At present, a thin film made of metal such as Al or Al alloys is frequently used for wiring. The electromigration endurance of such metal wiring has been improved by addition of a transition metal such as Cu or Ti in a trace quantity or the bamboo sheath-like grain structure (bamboo structure) which is caused by crystal grain growth. However, it is difficult to attain the reliability of wiring on the order of 0.1 micron only by this improvement in electromigration endurance. Recent investigations revealed that the electromigration endurance and stress-migration endurance due to tensile stress introduced in wiring were remarkably increased by a single-crystal wiring. As a means for attaining high reliability, it is considered that the crystalline properties of a metal thin film are as near to those of single crystal as possible.

At present, in electronic parts such as memory IC devices, metal wiring is formed on the surface of an amorphous thin film generally represented by a $SiO_2$ interlayer insulative film with or without a barrier layer. Thus a metal thin film with the high crystalline properties cannot be formed by a so-called epitaxial crystal growth method where a single-crystal thin film can be grown by continuing the crystalline arrangement of an underlayer. As a result, metal wiring with the excellent electromigration endurance and high reliability is hardly obtained.

As described above, there is a problem that conventional electronic parts hardly have metal wiring with the high reliability.

SUMMARY OF THE INVENTION

An object of the invention is to provide electronic parts allowing finer elements, higher integration, higher current density, and higher temperature of operation conditions.

Another object of the invention is to provide electronic parts with highly reliable metal wiring obtained by the formation of a metal thin film with the high crystalline properties.

A further object of the invention is to provide electronic parts with highly reliable metal wiring obtained by an underlying layer of which electrical resistance in a contact part is satisfactorily low and which can be easily processed, and a metal thin film with the high crystalline properties formed on the underlying layer.

A still further object of the invention is to provide electronic parts with highly reliable metal wiring simultaneously preventing wiring failures and shortcircuit.

A still further object of the invention is to provide electronic parts with metal wiring with the improved electromigration and stress-migration endurance.

A big problem for obtaining a metal thin film with the high crystalline properties is that many crystal nucleuses, from which growth of thin films will start, are simultaneously formed on an underlying layer to be deposited thereon at an initial stage of the deposition. At a film-growing stage, crystal growth of these crystal nucleuses is advanced by absorbing deposited particles or uniting with other nucleuses. However, the size of the crystal nucleuses growing by this mechanism is limited. A finally obtained thin film is of polycrystalline where individual crystal grains have different orientation arrangements. Accordingly, in order to form a thin film with the high crystalline properties in a large region, it is important to suppress occurrence of nucleuses as low as possible.

Here, the occurrence of nucleuses is considered based on classic argument. In the case where the surface/interfacial energy relationship between a deposited material and underlying material as shown in the equation (1) is satisfied (a wetting angle is zero), so-called layer growth can be attained and the density of nucleuses occurrence becomes zero.

$$\gamma f \leq \gamma s - \gamma i \qquad (1)$$

γf: the surface energy of a deposited material
γs: the surface energy of an underlying material
γi: the interfacial energy Here, it is said that the interfacial energy γi depends on 1) lattice matching of a deposited material and underlying material, and 2) interatomic bonding energy between a deposited material and underlying material, in crystal-crystal interface. However, in the case where an amorphous material is used as an underlying material like at the time of forming metal wiring in semiconductor devices, it has not been found on what the surface energy of underlying material and interfacial energy depends.

The inventors have eagerly investigated and examined relationships of atomic arrangement at an interface in detail. As a result, it was found that atomic or molecular arrangement at an interface significantly effected crystal arrangement of a deposited material in the case where an amorphous material is used as an underlying layer as well. Namely, diffraction by X-ray, electron beam and the like revealed that even in an amorphous material, the structure thereof is not completely disordered and there exists regular structure in a short range. As described above, the magnitude of interfacial energy, which determines atomic arrangement at an interface, is determined by the degree of lattice matching of 2 to 3 periods. This short range order is substantially the same as an interatomic distance corresponding to a peak of halo pattern which appears in diffraction measurement of an amorphous material. Thus, in this invention, it was found that this interatomic distance was matched with the spacing of atoms or molecules of a deposited material so that interface energy could be reduced, resulting in the formation of a thin film with the very high crystalline properties.

An electronic part of the present invention comprises an amorphous thin film formed on a substrate, and a metal wiring formed directly on the amorphous thin film, wherein an interatomic distance of the amorphous thin film in an ordered structure in a short range, which is determined from a peak of halo pattern appearing in a diffraction measurement, approximately matches with a spacing of a particular crystal plane including atoms with the first-nearest interatomic distance of the metal wiring. The particular crystal plane including atoms with the first-nearest interatomic distance defined in the above comprises, (111), (200) or (220) in face-centered cubic lattice (fcc), (110) in body-centered cubic lattice (bcc), and (002) or (110) in hexagonal close-packed lattice (hcp). The first nearest interatomic distance of these particular planes is illustrated in FIG. 36. At this time, it is most preferable that the interatomic distance ds of the amorphous thin film matches with the spacing df of the metal wiring. However, a slight dismatch is allowed and the following equation is preferably satisfied;

$$|df-ds|/ds \leq 0.25$$

The particular crystal plane is not limited to an orientated plane. Composition of the amorphous thin film varies the degree of match. If the amorphous thin film contains an element mainly constituting the metal wiring, a better matching can be obtained.

Another factor controlling interfacial energy is bonding energy as well as a crystal-crystal system. In other words, increase in bonding energy can reduce interfacial energy. Thus, the amorphous thin film preferably contains an element M of which the metal wiring is mainly made. Otherwise, the amorphous thin film preferably contains an element A forming an intermetallic compound with the element M, or an element B capable of continuous series of solid solution with the element M or having the range allowing a complete solid solution. Here, Al, Cu, Au, Ag, or W can be generally used as an element M.

As surface energy γs of an underlying material increases, a deposited material is more easily layer-like grown. However, since the surface energy is measured around the melting point of a material, it is substantially impossible to measure the surface energy of an amorphous material, because a crystallization temperature is lower than a melting point. It was examined what influences the surface energy of an amorphous material. As a result, it was found that it related with the surface energy thereof in a crystal state. That is, in order to increase the surface energy γs of an underlying material, the surface energy of a material in a crystal state constituting the amorphous thin film is preferably larger than the surface energy of a material constituting metal wiring (deposited material). Thus, the melting point, roughly proportional to the surface energy, of a material in a crystal state constituting the amorphous thin film is desirably high. Here, the surface energy of an amorphous material formed of a plurality of elements is defined as the sum of the fractional surface energies of individual elements.

Substrates of the invention are not particularly limited. Conventional semiconductor substrates such as a Si substrate and GaAs substrate, and glass substrates with and without ITO may be used. The shape thereof may be flat or have grooves.

For example, simple metals, alloys or conductive compounds capable of being amorphous are used for an amorphous thin film formed on a substrate. Further, they preferably have composition containing at least one of the above-mentioned elements M, A, and B. Considering the ability of forming amorphous, transition metals, metalloids, semiconductor alloys, and semiconductor compounds are preferable. Concretely there are compositions containing two or more materials selected from a metal element M, III B group elements (Sc, Y, Lanthanide), IV B group elements (Ti, Zr, Hf), V B group elements (V, Nb, Ta), VI B group elements (Cr, Mo, W), VIII group elements (Fe, Ru, Os, Co, Rh, Ir, Ni, Pd, Pt), B, C, N, O, P, Si, and Ge. Compounds with perovskite type oxide compositions can be used as an amorphous thin film.

Amorphous thin films used in this invention are an amorphous thin film where a broad diffraction intensity, namely halo peak, can be measured in diffraction measurements represented by electron diffraction such as RHEED and X-ray diffraction. Diffraction lines from fine crystals such as intermetallic compounds due to incomplete amorphous state are allowed for amorphous thin films used in this invention. Further amorphous thin films used in this invention are not required to be entirely amorphous. Crystalline thin films of which only the surface is amorphous may be used.

The thickness thereof is preferably thin, more preferably 10 to 1000 Å. However, even if thickness of 1000 Å or more, the crystalline properties of metal thin film formed thereon can be improved.

As shown in FIG. 2, this amorphous thin film 3 can be used not only as an underlying layer for a single-layer wiring but also as an underlying layer for each metal wiring 2 constituting multi-layer wirings. In addition, the film 3 can be used as an under-layer for a conductive connecting part in the longitudinal direction such as a via 4 or through hole. Further, the film 3 may be formed directly on the substrate 1; or on an interposed layer, for example, an insulative layer 5 such as a SiO$_2$ thermal oxide film, a barrier layer 6 of Ti, TiN or the like, a contact layer or another wiring above the substrate 1. Here, the interposed layer may be flat or have grooves. In this drawing, reference numeral 5 indicates an insulative film such as SiO$_2$ destined for an element isolation area, and reference numeral 7 indicates a doped layer.

Further, according to the present invention, the formation of an amorphous thin film as an underlying layer for metal wiring can considerably reduce the number of hillocks caused by thermal treatment or electromigration.

It is generally thought that hillocks normally take place due to compressive stress introduced in a thin film or metal wiring. Excess volume generating compressive stress is released as hillocks. A point where a hillock takes place is a point where stress is concentrated. Endurance against deformation of a thin film at this stress-concentrated point determines whether a hillock takes place or not. Since the conventional W or TiN thin film is of a polycrystal, crystal grain boundaries act as stress concentration parts, and cause cracks, and at these parts hillocks take place.

The inventors found that amorphous state could overcome the above inherent drawback of polycrystal. In other words, the use of amorphous thin film can increase deformation endurance in a stress concentrated part where a hillock may take place, thereby remarkably suppressing of hillocks can be attained. In the case where an amorphous thin film contains the previously mentioned element M, A or B, this effect is particularly remarkable. In this case, the reasons therefor are thought that since the bonding energy between a main element forming metal wiring and element in an amorphous thin film increases, concentrated compressive stress generated in the metal wiring can be uniformly distributed in the amorphous thin film, resulting in considerable decrease in frequency of hillock occurrence.

In the above-mentioned view of preventing occurrence of hillocks, an amorphous thin film is not required to be formed as an underlying layer for metal wiring, but may coat a part of metal wiring. For example, as shown in FIGS. 3(a), (b), (c), and (d), an amorphous thin film 101 may be formed in the upper part or periphery of metal wiring 100. In the case where an amorphous thin film is formed in the upper part of a metal film, since the effect of preventing hillocks depends on an interatomic bonding energy between the amorphous thin film and metal wiring, this effect necessarily depends on the surface state of the metal wiring prior to the formation of the amorphous thin film. For example, in the case of metal wiring mainly formed of Al, the surface is generally coated with an Al oxide. This can be confirmed by reflection high-energy electron diffraction (RHEED). Namely, RHEED observation on the surface of an Al wiring which have been exposed to the air indicates the following facts; Since an amorphous oxide film is formed on the Al wiring surface, only a halo pattern peculiar to be amorphous is obtained. However, if the surface layer is removed by Ar sputtering, a ring or orientated diffraction pattern of an Al thin film can be obtained. If an amorphous thin film is formed after such process of the Al metal surface, the hillock suppressing ability is further enhanced.

In the case where Cu is used for metal wiring as a low resistance wiring material, there is a problem of oxidation endurance against $O_2$ asher in a resist removal step. At this time, particular amorphous thin films containing Ti, Zr, Hf, V, Ta or Nb suppress distribution of oxygen into the film through grain boundaries, and improves the oxidation endurance of Cu.

According to the invention, the formation of an amorphous thin film between a substrate and metal wiring can suppress reactions caused by grain boundary diffusion in conventional technique. Among others, an Al amorphous alloy as an amorphous thin film does not form a high resistance reactive layer with metal wiring mainly formed of Al, resulting in a high reliable contact part. Further, if an alloy containing one of Ta, Nb, V, Mo and W is used as an Al amorphous alloy, a simultaneous fine wiring process for metal mainly formed of Al is possible, thereby reducing the number of processes as compared with the other amorphous alloys. At this time, the content of Al is preferably 15 at % or more for stabilizing amorphous state. The content is more preferably 15 to 80 at % to maintain the surface energy of the amorphous thin film to be high. Examples of such Al amorphous alloys are $Ta_xAl_{1-x}$ ($0.20 \leq x \leq 0.85$), $Nb_xAl_{1-x}$ ($0.20 \leq x \leq 0.85$), $V_xAl_{1-x}$ ($0.20 \leq x \leq 0.60$), $W_xAl_{1-x}$ ($0.15 \leq x \leq 0.50$) and $Mo_xAl_{1-x}$ ($0.25 \leq x \leq 0.80$). Further, since Cu amorphous alloys have excellent contact properties with metal wiring mainly made of Cu, a contact part with the high reliability can be provided. Examples of such Cu amorphous alloys are $Ti_xCu_{1-x}$ ($0.18 \leq x \leq 0.70$), $Zr_xCu_{1-x}$ ($0.18 \leq x \leq 0.70$), $Hf_xCu_{1-x}$ ($0.20 \leq x \leq 0.70$), $Y_xCu_{1-x}$ ($0.10 \leq x \leq 0.53$) and $Ta_xCu_{1-x}$ ($0.20 \leq x \leq 0.80$). Especially for metal wiring mainly made of Cu where required electrical resistance is as low as bulk material, amorphous alloys such as $V_xCo_{1-x}$ ($0.15 \leq x \leq 0.80$), $Nb_xCr_{1-x}$ ($0.25 \leq x \leq 0.45$), $Nb_xCo_{1-x}$ ($0.22 \leq x \leq 0.55$), $Ta_xCr_{1-x}$ ($0.25 \leq x \leq 0.40$), $Ta_xCo_{1-x}$ ($0.25 \leq x \leq 0.45$), $Cr_xCo_{1-x}$ ($0.50 \leq x \leq 0.70$), $Mo_xCo_{1-x}$ ($0.20 \leq x \leq 0.60$), and $W_xCo_{100-x}$ ($0.20 \leq x \leq 0.60$) are also preferably used since they do not form solid solution, and can avoid the inherent electrical resistance increase by interfacial reaction at elevated temperature for sintering. In these amorphous alloys, if a so-called metalloid element such as Si, Ge, P or B is contained, the stability of being amorphous can be further enhanced. Moreover, an amorphous thin film may be of multi-layer structure where different amorphous materials are laminated. At this time, the upper most surface is preferably formed of the above-mentioned amorphous alloys with the high surface energy; and $SiO_2$, polyimide, TEOS, SiN and the like containing B or P may be used as the underlying layer of the above multi-layer structure.

The above-mentioned metal wiring, which is formed on an amorphous thin film, is formed of crystal with the high orientation and crystalline properties which is oriented in a given plane direction. In the case of highly oriented crystal, the angle formed between the normal line direction of the close-packed plane of each crystal grain and the normal line direction of the bottom surface of metal wiring is preferably 80° or less. In the case where metal wiring is of single crystal, the angle between the close-packed plane and the wiring longitudinal direction is preferably 20° or less. At this time, metal wiring is formed such that a (111) plane of the close-packed plane in the case where metal wiring crystal structure is fcc structure; a (110) plane in the case of bcc structure; or a (0001) plane in the case of hexagonal structure is approximately parallel to the wiring longitudinal direction. Moreover, taking into account the degree of freedom in wiring design, the close-packed plane is preferably an upper plane, that is, metal wiring oriented in the close-packed plane is preferably formed.

In the present invention, metal wiring is preferably of highly oriented crystal where small angle boundary energies are distributed, which small angle boundary energies are 88% or less of general random grain boundary energies in polycrystal where general random grain boundary energy is defined by one third of the surface energy of a solid. Examples of such small angle boundaries with low grain boundary energy are small angle boundaries with a relative misorientation of 10° or less in tilt, rotation and combination thereof around orientation axes of neighboring crystal grains, coincidence boundaries where the Z value of grain boundaries is 10 or less, and grain boundaries with a relative misorientation of 3° or less from a coincidence boundary. The number of such small angle boundaries are preferably half or more of entire grain boundaries, more preferably 90% or more. Existence of such small angle boundaries results in that a site where voids form due to stress-migration is intentionally provided in metal wiring, a void volume is suppressed because of large surface energy increase with void growth at a grain boundary with low energy, and metal wiring failure is prevented. Thus, such metal wiring of highly oriented crystal has the excellent reliability even without an under amorphous thin film.

This metal wiring can be used not only in a single-layer wiring but also in multi-layer wirings and a conductive connecting part in the longitudinal direction thereof, namely, a via or through hole. Even if a material of the conductive connecting part in the longitudinal direction is different from that of a wiring layer above or under the part, continuity of the crystalline orientation of the metal wiring can be maintained, thus allowing the improved reliability. Further, this metal wiring may be of multi-layer structure where different kinds of metals or metals with different crystal states or conductive materials are laminated.

Illustrative materials for such metal wirings have the low electric resistance, and are fcc structured pure Al, pure Cu, pure Au, pure Ag, Al—Cu, Al—Ti, Al—Cr, Al—Ta, Al—Mg, Al—In, Al—Li, Cu—Be, Cu—Ag, Au—Pt, Au—Ag, Au—Pd, Au—Cu, bcc structured pure W. In the case of an alloy, the amount of addition of a solute is desirably in the range allowing a complete solid solution. In this case, Si may be contained in 1 wt % or less. Making an alloy can reduce the surface energy of metal wiring (surface energy of a deposited material γf).

Such metal wiring may contain an element in the grain boundaries, or an upper or lower layer thereof, which element has a melting point lower than that of a wiring material, which does not form an intermetallic compound with an element forming the metal wiring, and whose affinity with a substrate or interposed layer is smaller than that of an element forming the metal wiring. For example, in the case of using Al or an Al alloy for metal wiring, at least one element of Ga, In, Cd, Bi, Pb, Sn and Tl is exemplified. In the case of using Cu or a Cu alloy for metal wiring, at least one element of Pb and Tl is exemplified.

Metals with a high melting point or silicides, nitrides, oxides or carbides of metals with a high melting point may coat on the metal wiring.

Electronic parts thus constructed of the invention are manufactured in the following manner.

First, if necessary, an insulative layer, a barrier layer, a contact layer and the like are formed on a substrate. Thereafter, an amorphous thin film is formed by conventional deposition methods such as a sputter method so as to match with a spacing of a particular crystalline plane of metal wiring to be formed thereon. Subsequently, while keeping vacuum, the metal wiring is formed. If the amorphous thin film is exposed to the air, the surface is cleaned by Ar bias sputtering and the like, and then the metal wiring is formed. However, in the case where an amorphous thin film contains B, C, N, or the like and the high surface energy state of the amorphous thin film is maintained at an oxygen or nitrogen atmosphere, an oxide layer is hardly formed on the surface, even if the amorphous thin film is exposed to the air. Thus, metal wiring may be formed without surface cleaning. In the formation of metal wiring, desirable methods for forming a metal thin film by physical vapor deposition include a sputter method, bias sputter method and ion beam method. Desirable methods for forming a metal thin film by chemical vapor deposition include, for example in the case of an Al-CVD method, a thermal chemical vapor deposition (CVD) method with the use of alkylaluminum such as TIBA or alkylaluminum hydride such as DMAH as a source gas. In these methods, for example, Si or Cu may be contained in the source gas during film deposition. An alloy may be made by lamination by ion implantation or sputtering, and subsequent heat treatment after film deposition.

Further, an amorphous thin film and metal wiring may be formed thereon via an insulative layer and the like to construct multi-layer wirings.

After the film deposition, heat treatment may be conducted so that crystal can grow from seeds. In the case where seeds are Si, the following two pretreatment are preferable. One pretreatment contains a diluted-HF treatment step and thereafter, without a water rinse, a drying step in $N_2$ with a dew point of $-90°$ C. or less. Another pretreatment contains a diluted-HF treatment step, a washing step with ultra pure water where dissolved oxygen concentration is 10 ppb or less, and thereafter a drying step in $N_2$ with a dew point of $-90°$ C. or less.

Further, a graphoepitaxy method may be used with processing the surface of the substrate. It is previously described that crystal of a metal thin film formed on an amorphous thin film of an underlying layer with the high surface energy has the extremely high orientation, and is oriented in a given plane direction. It appears that if the surface energy of the under layer is high, a wetting angle of nucleuses vapor-deposited is small and thereby, for example in the case of Al, a (111) plane with low surface energy can stably grow. However, at this time, directions in a plane of the growing nucleuses are at random. Thus, control of directions in a plane is required for the higher wiring reliability. According to the invention, an amorphous thin film with grooves formed thereon is used as an underlying layer, and thereby not only the crystalline properties of a metal thin film to be formed but also control of directions in a plane are sufficiently enhanced. In the amorphous thin film, the bottom part of the grooves may be made of a material different from or identical to that of which the side wall part is made. However, it is preferable that the bottom part and side wall part of the grooves are made of different materials and difference therebetween in the surface energy is utilized at the time of forming a metal thin film. The reasons therefor are as follows; A material to be deposited orientates and grows in a part with higher surface energy than the bottom or side wall part with lower surface energy. At the same time, direction of the other axis of deposited film can be controlled at an interface with the other low-surface-energy part. As a result, a metal thin film similar to single crystal can be formed. Further, in this case, even if an amorphous thin film is subjected to thermal treatment to be crystallized before or after the deposition of a metal thin film, a metal thin film with the high crystalline properties can be obtained.

Desirable grooves are as follows: The shape of the grooves is a stripe, rectangle, square, regular triangle or combination thereof. Many of such grooves are arranged such that one side of the groove is parallel to one of the other groove with accuracy of $\pm 5°$. The width of each groove. is the average grain size of metal wiring or less and the space of each groove is also the average grain size of metal wiring or less. In the case of stripe-like grooves, the groove width and space are preferably the average grain size of metal wiring or less. Though an underlayer to form the amorphous thin film does not particularly be subject to restriction, it is preferable that the surface of the underlayer, is smooth. If there are fine undulations thereon, the amorphous thin film keep an uneven surface of the underlayer, and the direction of orientation in the metal wiring falls into disorder. Thus, the crystal properties of the metal wiring are degraded. To solve the above problem, it is desirable to flatten the surface of the underlayer prior to forming the amorphous thin film or the surface of the amorphous thin film after forming the amorphous thin film. As methods for flattening the underlayer, polishing, etching, melt-flowing and the likes are given as examples. And as methods for flattening the amorphous thin film, polishing and etching and the likes are given as examples.

When forming metal wiring on an amorphous thin film, it is important that a surface oxide is not formed on the amorphous thin film, as described above. Further, it is a matter of course that when the metal wiring is continuously formed without exposing the amorphous thin film in an air after forming, the formation of a surface oxide film on the amorphous thin film is affected by a base pressure before and after forming the amorphous thin film. Accordingly, it is important to maintain the base pressure to be $1\times10^{-6}$ Torr or less. To be concrete, it is necessary to maintain the base pressure of around $1\times10^{-7}$ Torr or $1\times10^{-8}$ Torr. A preferable method for removing a surface oxide of the amorphous thin film is plasma etching immediately before the deposition of a metal thin film. After etching, it is important to maintain the vacuum to be $1\times10^{-6}$ Torr or less. A CVD method or PVD method may be applied as a method for forming a metal thin film. A substrate temperature is preferably raised to promote migration of deposited particles by means such as resistance heating, electron beam irradiation and laser beam irradiation. Further, an oblique vapor deposition method, where a vapor deposited particle flux is oblique against a substrate, is preferable.

Further, in the case where a conductor layer formed of Al or an Al alloy, or Cu or a Cu alloy is deposited to form a metal thin film, the above metal wiring of highly oriented crystal can be obtained by supplying an element with the low surface energy before or during the deposition of the conductor layer.

Concretely, in the case of forming a metal wiring consisted of Al or Al alloy, one or two elements selected from the group of Ga, In, Cd, Bi, Pb, Sn and Tl are supplied. In the case of forming a metal wiring consisted of Cu or Cu alloy, one or two elements selected from the group of Pb and Tl are supplied. Referring to FIG. 1, when such elements are supplied to form a control layer consisting of at least one atomic layer, the relationship between $\gamma f$ and $\gamma i$ will be considered. In FIG. 1, reference number 1 is a substrate, 5 an insulative layer formed of a thermal oxide film, 50 a control layer, 2 metal wiring. In this case, since the surface energy of an element forming the control layer is low, the sum of $\gamma f$ and $\gamma i$ in the (b) state is smaller than that in the (a) state. Thus, when such elements are supplied on a substrate and a conductor layer destined for a metal wiring is deposited, the elements diffuse towards the surface of the conductor layer to minimize the free energy. As a result, the surface energy of the deposited substrate seemingly decreases and its film growth becomes similar to layer growth. Accordingly even if an underlying material is one of an insulative layer, barrier layer, contact layer and amorphous thin film layer, a metal thin film with the high crystalline properties can be formed. This effect is remarkable when the above elements are supplied during the deposition of the conductor layer. The sufficient supplying amount of the elements is half or more atomic layer. The supply of the elements promotes the surface diffusion of the deposited material to attain large grain size of crystals, too. This will be described referring to FIG. 29 in detail. FIG. 29(a) is a surface SEM photograph when Al was vapor deposited in a thickness of 500 Å on a SiO$_2$ insulative layer. FIG. 29(b) is a surface SEM photograph when Bi of 1 atomic layer was supplied at the time of Al vapor deposition. In the case where Bi is not supplied, a substrate is subjected to thermal treatment at 400° C. for 3 hours under vacuum, thereby obtaining film aggregation. However, as shown in the drawings, if Bi is supplied during deposition of a conductor layer, film aggregation can be obtained without heating a substrate immediately after the deposition.

In the case where a barrier layer, contact layer or the like, which is made of a compound or an alloy, is formed as an underlying layer on a substrate, subjected to thermal treatment, and a conductor layer is then deposited; the underlying layer is etched by plasma containing at least one element constituting the compound or alloy as a pretreatment for the deposition of the conductor layer, thereby allowing the formation of a metal thin film with the high crystalline properties and orientation. This is because the etching prevents oxidation of the surface of the underlying layer made of the compound and alloy, and active seeds on the surface so that a stable interface can be formed. For example, in the case where the underlying layer is formed of nitride, preferably the surface is etched by plasma of a mixture of an inert gas and nitrogen and a conductor layer is then deposited thereon. At this time, preferably the conductor film is deposited continuously after etching under vacuum. However, exposure to the air for a short period of time is allowable. Regarding the etching, after etching with the use of a mixture gas, this may be exposed to plasma containing only elements constituting the compound and alloy. These etching are preferably performed while supplying a bias voltage to a substrate. The desirable voltage is −100 V or less. Thereafter, illustrative methods for depositing a conductor layer are various CVD methods as well as physical vapor deposition methods such as a sputtering method and resistance heating vapor deposition method. Illustrative materials of which the conductor layer is formed are Si, WSi, MoSi, pure Al, an Al alloy, pure Cu, a Cu alloy, W, Au, and Ag. Desirable Al alloys are an Al—Cu alloy, Al—Cr alloy and Al—Mg alloy. Alternatively, these materials may be layer-like laminated.

For example, in the case of an Al-CVD method, film-deposition is preferably performed by a thermal CVD method with the use of alkylaluminum such as TIBA or alkylaluminum hydride such as DMAH as a source gas. At this time, Si or Cu may be contained in the source gas during film deposition. An alloy may be made by lamination by ion implantation or sputtering, and subsequent thermal treatment after film deposition.

The improvement in the crystalline properties of a metal thin film thus obtained allows electronic parts with metal wiring having the excellent reliability such as the high stress-migration and electromigration endurance.

Moreover, an electrical current is loaded in metal wiring via an insulative layer and the like on a substrate after the formation of metal wiring. This improves the stressmigration endurance of the metal wiring and suppresses occurrence of thermal etch pits. This current loading allows similar effects in the case where an amorphous thin film is not formed or the other film is interposed. However, in the case where grain boundaries in the metal wiring consists of small angle boundaries and twin boundaries with low grain boundary energy, the more remarkable effect derived from such current loading is obtained. Here, it is also preferable to form metal wiring of highly oriented crystal where the previously described small angle boundaries with the low grain boundary energy are distributed. Because such small angle boundaries become moveable and are easily emitted out from metal wiring, and approaches single-crystalline by a current loading. A current density ranged from $5\times10^6$ A/cm$^2$ to $2\times10^7$ A/cm$^7$ is preferable.

A reason for limiting a current density is as follows. If a current density is $5\times10^6$ A/cm$^2$ or less, the above-described effect by current loading cannot be obtained. If a current density is $2\times10^7$ A/cm$^2$ or more, an electromigration-induced void is formed due to an increased atomic flux divergence from temperature inhomogeneity by enhanced Joule-heating, resulting in a worse wiring shape and poor reliability. A proper loading period depends on the length and shape of metal wiring. However, in view of the stability of Joule-heating and dislocation emission speed, 1 minute or longer is preferable. A substrate temperature may be room temperatures or raised temperatures, preferably 300° C. or lower. If a substrate is heated to 300° C. or higher, thermal etch pits may take place.

In the case of multi-layer wirings, current-loading is preferably conducted at every time of forming metal wiring. However, current loading may be conducted simultaneously in two or more metal wirings. In this case, materials similar to metal wiring are preferably used for filling a via part (conductive connecting part). However, difference in the amount of additives is allowed as far as the difference is 10% or less per total amount of additives.

According to the present invention, as mentioned above, after an amorphous thin film and metal wiring are successively formed on a substrate to produce an electronic part of the invention, a given thermal treatment may be conducted for the purpose of further crystal grain growth in metal wiring of highly orientated crystal. At this time, the amorphous thin film is allowed to be crystallized or disappear by the thermal treatment. Since its crystalline property is improved by the crystal grain growth of the highly orientated crystal, the reliability of the metal wiring can be further improved.

Further, although the present invention relates to the improvement in the reliability of metal wiring as mentioned above, the technique of the invention can be similarly applied to an electrode part of a capacitor or resistance heater in an electronic part.

For example, in the case of forming an under electrode of a capacitor, if an interatomic distance corresponding to a peak of halo pattern appearing in diffraction measurement of an amorphous thin film of an underlying layer approximately matches with a spacing of a particular crystal plane including atoms with the first adjacent interatomic distance of the under electrode, the interface energy between the amorphous thin film and under electrode is reduced so that the under electrode with the very excellent crystalline properties can be formed. Accordingly, the crystalline properties of a dielectric thin film formed thereon is enhanced.

If an amorphous thin film is used as a resistance heater uniform and stable electrical resistance can be attained. Further if an electrode is deposited on this amorphous thin film such that the interatomic distance of the amorphous thin film approximately matches with the spacing of the electrode, the crystalline properties of the electrode are improved and electromigration induced degradation is suppressed at the time of a large current application.

Moreover, according to the present invention, a pad part connecting with metal wiring is formed of single crystal or highly orientated crystal with the previously mentioned small angle boundaries having the low grain boundary energy, like the metal wiring. At the same time, the shape of the pad part is an aggregation of fine lines successively branched from the metal wiring. As a result, the reliability of the pad part can be enhanced. Here, "successive branch" means, as shown in FIG. 4, that fine line increases in a branch-shape in the upper and lower directions of metal wiring assumed as a central axis. The number of upper branches may not be the same as that of lower branches. The branch may not be perpendicular to the metal wiring. The preferable angle θ is 90° or less. As a result, voids at the upper side of the wiring, which form and move in the wiring, successively move to fine lines above the pad part, whereas voids at the lower side of the wiring, which form and move in the wiring, successively move to fine lines under the pad part. The voids cannot grow in the wiring width or more, and remain in fine lines around the outer periphery of the pad. If an element constituting fine lines run out by voids in the fine line of the mostly outer periphery, the voids remain in the next fine line. A central part of the pad part bonded with wire connected to an external power source does not allow the defect to be accumulated, thereby extremely enlarge the lifetime of the pad part.

The structure where branch successively advances prevents rapid change of a current density in a connecting part with metal wiring, allowing attemperment of flux divergence due to change in a current density. Thus, not only voids in a (−) pad but also hillocks in a (+) pad are advantageously dispersed. Spacing between branches is not required to be equal.

The branched fine lines are preferably connected with a fine line running in the perpendicular direction. Further, the width of these fine lines is preferably more than that of metal wiring.

Moreover, it is effective for a pad part that a region where a current density is one tenth or more of metal wiring is made of an aggregation of fine lines. In a region where a current density is one tenth or less, a continuous (not-branched) pad is allowable.

DESCRIPTION OF THE PREFERRED EMBODIMENTS

Embodiments of the present invention will be described in more detail.

EXAMPLE 1

Figure 5:
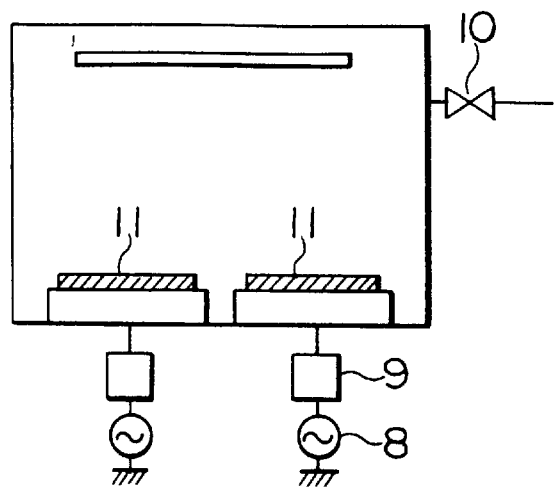
FIG. 5 is a view showing a multi-target sputter apparatus for use in the invention.
Figure 6:
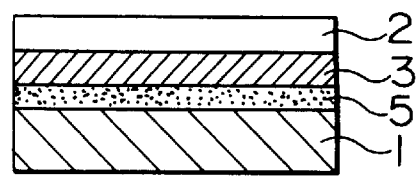
FIG. 6 is a sectional view according to Example 1.

Referring to FIGS. 5 and 6, an embodiment will be described.

Using a six-inch silicon wafer substrate 1 with a 4000 Å insulative layer 5 of a thermal oxide film ($SiO_2$), an amorphous thin film 3 and metal wiring 2 were successively formed by sputtering. First, an AlTa film was formed as an amorphous thin film 3 by means of a multi-target sputter apparatus as shown in FIG. 5. The sputtering conditions are shown below. In FIG. 5, reference numeral 8 indicates a high frequency power source, 9 a matching circuit, 10 a mass flow controller, 11 a target.

Sputter system: RF magnetron system

Target: 100 mmφ AlTa mosaic target (concentric circle like form)

Substrate temperature: Room temperature (25° C.)

Sputter gas: Ar

Gas pressure: 0.20 Pa

Applied power: 10 W/cm$^2$

Film thickness: 500 Å

Composition analysis revealed that the formed film was $Al_{40}Ta_{60}$ (hereinafter, numeral value shows ratio of an atomic composition). X-ray diffraction revealed that the film was amorphous and that an interatomic distance ds corresponding to peak of halo pattern was 2.34 Å. The following fact was found. Namely, since a spacing df of Al (111) was 2.34 Å, the relation, |df−ds|/ds=0 was satisfied. Thus, if the amorphous thin film contains an element mainly forming metal wiring and has an appreciate composition, the spacing ds can match with the spacing of a particular crystal plane of the metal wiring. In this embodiment, a mosaic target was used. However, other methods such as simultaneous sputtering with the use of a binary target and lamination of each element could produce a similar amorphous thin film.

Next, keeping vacuum, Al was sputtered on the $Al_{40}Ta_{60}$ film. The sputtering conditions are shown below.

Sputter system: RF magnetron system

Target: 100 mmφ Al target

Substrate temperature: Room temperature (25° C.)

Sputter gas: Ar

Gas pressure: 1 Pa

Applied power: 5 W/cm$^2$

Film thickness: 4000 Å

The Al film thus formed was evaluated for the orientation and crystalline properties by X-ray diffraction. The full width of half-maximum (hereinafter referred to as FWHM) of a (111) rocking curve (orientation FWHM) was 1.2° and bragg reflection other than (hhh) reflection, for example (200), (220) or the like, was not observed.

The film thus formed with a layer-structure shown in FIG. 6 was processed into a four-terminal pattern 0.5 μm in width and 1 mm in length, and subjected to an electromigration (EM) test. The test conditions were that a wiring temperature was 200° C. and a current density was 2×10$^6$ A/cm$^2$. As a result of the test, it was confirmed that even after an elapsed time of 1000 hours there was no failure and excellent reliability was obtained. When the electric resistance increased by 10% of a value just after the test starts in the EM test, it was judged that wiring failure took place. This judgement was the same in the following examples.

Similarly, various combinations of an amorphous thin film and metal wiring (an amorphous thin film/metal wiring); that is, ($Pt_{21}Zr_{79}$/Pt), ($Cu_{50}Ti_{50}$/Cu), ($Ag_{55}Cu_{45}$/Ag), and ($Fe_{80}B_{20}$/Fe); were formed. Similar evaluation of the orientation FWHM revealed that Pt, Cu and Ag were (111) orientation and the FWHMs thereof were 1.4°, 1.8° and 1.6° respectively; and Fe was (110) orientation and the orientation FWHM of (110) reflection thereof was 1.70°.

EXAMPLE 2

Like Example 1, an amorphous thin film made of $Ni_{30}Ta_{70}$ (melting point of intermetallic compound of $Ni_{30}Ta_{70}$: 1500° C.) was formed and a metal wiring made of Al (melting point: 660° C.) was formed thereon. Namely, the amorphous thin film contained an element which has a melting point higher than that of a metal wiring and which could constitute an intermetallic compound with a main element forming the metal wiring. Here, an interatomic distance ds of $Ni_{30}Ta_{70}$ corresponding to a peak of halo pattern was 2.33 Å. This approximately matches with a spacing df 2.34 Å of Al (111). As a result of evaluation similar to Example 1, (111) orientation FWHM of 0.9° and excellent crystalline properties were observed. Further, in the EM test, it was confirmed that even after an elapsed time of 1000 hours there was no failure and excellent reliability was also obtained.

Similarly, various combinations of an amorphous thin film and metal wiring (an amorphous thin film/metal wiring); that is, ($Pd_{80}Si_{20}$/Al), ($Ag_{55}Cu_{45}$/Al), and ($W_{70}Zr_{30}$/Al); were formed. Similar evaluation revealed that the (111) orientation FWHMs thereof were 1.9°, 1.8° and 1.2 respectively.

EXAMPLE 3

Like Example 1, an amorphous thin film made of a Co-based alloy, $Co_{80}Zr_9Nb_{11}$ was formed and a metal wiring made of Al was formed thereon. Here, an interatomic distance ds of $Co_{80}Zr_9Nb_{11}$ corresponding to a peak of halo pattern was 2.04 Å. This approximately matches with a spacing df 2.02 Å of Al (200). As a result of evaluation similar to Example 1, (111) orientation and excellent crystalline properties were observed. Further, in the EM test, it was confirmed that even after an elapsed time of 1000 hours there was no failure and excellent reliability was obtained.

Similarly, various combinations of an amorphous thin film and metal wiring (an amorphous thin film/metal wiring); that is, ($Co_{80}Zr_8Nb_{12}$/Al), ($Co_{85}Zr_6Nb_9$/Al), ($Co_{88}Zr_8Ta_9$/Al), and ($Co_{90}Hf_6Pd_4$/Al); were formed. Similar evaluation revealed that the (111) orientation FWHMs thereof were 1.2° and satisfactory crystalline properties was obtained.

Figure 7:
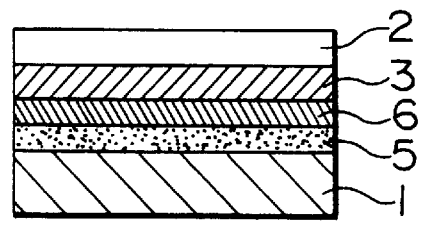
FIG. 7 is a sectional view according to Example 3.

As shown in FIG. 7, Al metal wirings 2 were formed after various combinations of the following steps; these steps were that a polycrystalline TiN/Ti layer was formed on the insulative layer 5 as a barrier layer 6, that an amorphous thin film 3 ($Co_{80}Zr_9Nb_{11}$) was formed thereon, that thereafter it was exposed to the air as shown in Table 1, and that it was then subjected to Ar bias sputtering. The crystalline orientation of these Al metal wirings were evaluated with the FWHM of an Al(111) rocking curve by X-ray diffraction using a CuKα line. As shown in Table 1, in the cases of no amorphous thin film and no Ar bias sputtering after exposure to the air, the crystalline orientation was remarkably degraded.

TABLE 1

| | Underlying material | | Surface treatment | | FWHM of a (111) rocking curve of metal wiring |
|---|---|---|---|---|---|
| | $SiO_2$ layer | TiN/Ti layer | Amorphous thin film | Exposure to air | Ar bias sputtering | |
| 1 | ○ | — | ○ | — | — | 1.2° |
| 2 | ○ | ○ | ○ | — | — | 1.2° |
| 3 | ○ | — | — | — | — | 8° or more |
| 4 | ○ | ○ | — | — | — | 4° |
| 5 | ○ | — | ○ | ○ | ○ | 1.3° |
| 6 | ○ | ○ | ○ | ○ | ○ | 1.3° |
| 7 | ○ | — | ○ | ○ | — | 8° |
| 8 | ○ | ○ | ○ | ○ | — | 8° |
| 9 | — | ○ | ○ | — | — | 1.2° |

○: Yes (existent or conducted),
—: NO (non-existent or non-conducted)

EXAMPLE 4

Like Example 1, amorphous thin films and metal wirings shown in Table 2 were formed. As also shown in Table 2, in this embodiment, amorphous thin films with larger surface energy than that of metal wiring in the crystalline state were used.

TABLE 2

| | Amorphous thin film | | | Metal wiring | | | | FWHM of a (111) rocking curve of metal wiring |
|---|---|---|---|---|---|---|---|---|
| | Composition | Interatomic distance ds (Å) | Surface energy (erg/cm²) | Composition | Spacing df (Å) | Surface energy (erg/cm²) | \|df-ds\|/ds | |
| 1 | $Ni_{62}Nb_{38}$ | 2.11 | 1826 | Al | (200) 2.02 | 866 | 0.04 | 1.1° |
| 2 | $Ni_{30}Zr_{70}$ | 2.51 | 1570 | Al | (111) 2.34 | 866 | 0.07 | 1.2° |
| 3 | $TiB_2$ | 2.01 | 1698 | Al | (200) 2.02 | 866 | 0.005 | 1.8° |
| * | $SiO_2$ | 4.78 | 605 | Al | (111) 2.34 | 866 | 0.51 | 8.2° |

*: Comparative Example

In each case, a spacing ds corresponding to a peak of halo pattern in the amorphous thin film approximately matches with a lattice distance df of Al. As a result of evaluation similar to Example 1, (111) orientation and excellent crystalline properties were obtained, as shown in Table 2. Further, in the EM test, it was confirmed that even after an elapsed time of 1000 hours there was no failure and excellent reliability was obtained.

For example, borides, carbides and nitrides of $TiB_2$ and the like were preferably used as an amorphous thin film, since their surface energy was large. The surface energy is represented by the following approximation equation;

$$\Delta E^{SV} = Y\lambda^2/4\pi^2 X_0$$

$\Delta E^{SV}$: surface energy
Y: Young's module
λ: distance between atoms where force reaches ($X_0$ is an approximate value)
$X_0$: distance between atoms At the same time, as a comparative example, a metal wiring was directly formed on $SiO_2$ in a similar way to Example 1. An interatomic distance ds of $SiO_2$ corresponding to a peak of halo pattern does not approximately match even for the nearest spacing df of (111) Al. Further, the surface energy of $SiO_2$ is smaller than that of Al. As a result of evaluation similar to Example 1, the (111) orientation FWHM was as large as 8.2° and in the EM test a wiring failure was observed within 10 hours.

EXAMPLE 5

Figure 8:
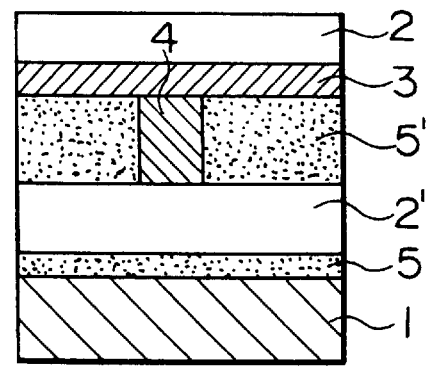
FIG. 8 is a sectional view according to Example 5.

Referring to FIG. 8, an embodiment will be described.

In this example, as shown in FIG. 8, a conductive connecting part 4, namely a via, was formed in the longitudinal direction. Concretely, first, a $SiO_2$ thermal oxide film was formed as an insulative layer 5 on a Si substrate 1 and thereafter a 4000 Å thick thin film, which was made of Al, Cu, W or $MoSi_2$, was deposited as a under-layer metal wiring 2'. On this thin film, a 3000 Å thick $SiO_2$ interlayer insulative film 5' was deposited by means of a thermal CVD method. In this interlayer insulative film 5', a via (or through hole) 4 with a diameter of 50 μm was formed by means of conventional PEP, reactive ion etching (RIE) steps.

Next, the via 4 was filled with W by a selective CVD method. After leveling by etchback, a 200 Å thick $Co_{80}Zr_9Nb_{11}$ thin film was formed as an amorphous thin film 3 of the present invention. Subsequently, if the surface of $Co_{80}Zr_9Nb_{11}$ was exposed to the air one time, it was subjected to Ar RF plasma cleaning. Then pure Al thin film was deposited as a metal wiring 2 in a thickness of 4000 Å by sputtering. The crystalline orientation of the Al thin film was evaluated with the FWHM of an Al (111) rocking curve by X-ray diffraction using a CuKα line. An incident X-ray was diaphragmed to ϕ50 μm by a collimator to examine change and distribution of FWHM near the via. As a result, FWHM did not change dependent on positions and was uniformly 1.3°, thereby exhibiting the excellent crystalline properties.

EXAMPLE 6

Figure 9:
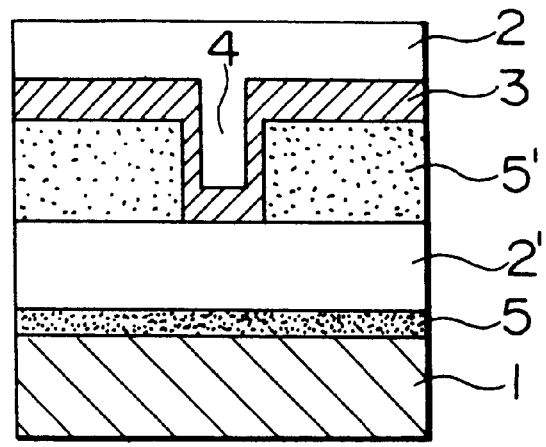
FIG. 9 is a sectional view according to Example 6.

Referring to FIG. 9, an embodiment will be described.

Like Example 5, a via 4 was formed and then, as shown in FIG. 9, $Ni_{62}Nb_{38}$ was formed in a thickness of 300 Å as an amorphous thin film 3 by sputtering. As a result, as shown in FIG. 9, although a side wall of the via become slightly thin, a Ni—Nb layer was conformably formed. Under vacuum of $1 \times 10^{-7}$ Torr, a 4000 Å thick pure Al thin film was continuously formed as a metal wiring 2 thereon by sputtering. As a result of evaluation similar to Example 5, FWHM was uniformly 1.35°.

EXAMPLE 7

Figure 10:
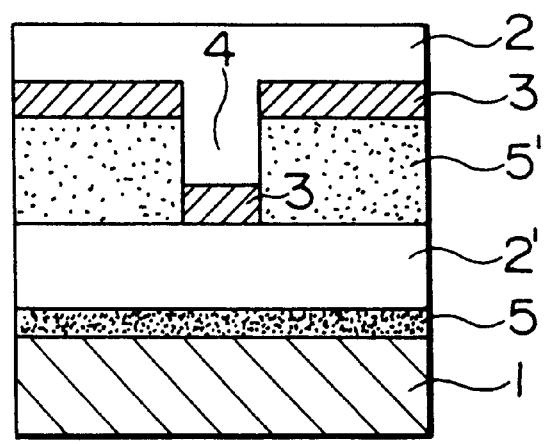
FIG. 10 is a sectional view according to Example 7.

Referring to FIG. 10, an embodiment will be described.

Like Example 5, a via 4 was formed and then, as shown in FIG. 10, $Al_{40}Ta_{60}$ was formed as an amorphous thin film 3 by sputtering. At this time, provision of a collimator between a substrate with the via and target improved the direct-advance property of particles to be deposited. Accordingly, an amorphous layer was hardly formed on a side wall of the via 4 and a 100 Å. Al-Ta amorphous thin film 3 could be formed on the bottom surface of the via 4 and interlayer insulative film 5'. After exposure to the air one time, it was subjected to Ar RF bias sputter cleaning. Then pure Al thin film was deposited in a thickness of 4000 Å as a metal wiring 2 by sputtering. As a result of evaluation similar to Example 5, FWHM was uniformly 1.1°.

EXAMPLE 8

Figure 11:
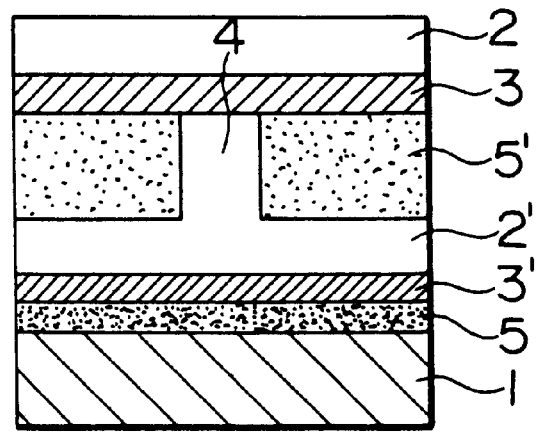
FIG. 11 is a sectional view according to Example 8.

Referring to FIG. 11, an embodiment will be described.

As shown in FIG. 11, first, an $Al_{40}Nb_{60}$ film was formed as an amorphous thin film 3' on an insulative layer 5 formed of a $SiO_2$ thermal oxide film, and thereafter under vacuum of $1 \times 10^{-7}$ Torr or less pure Al was continuously deposited to form an under-layer metal wiring 2' with a thickness of 4000 Å. The FWHM of a rocking curve of the under-layer metal wiring 2' was 1.2°. Like Example 5, a $SiO_2$ interlayer insulative film 5' and via 4 were formed on the Al under-layer metal wiring 2'. Next, the via 4 was selectively filled with Al by means of a thermal CVD method using TIBA (triisobuthyl aluminum, i-$(C_4H_9)_3Al$) as a source gas. This Al with which the via 4 was filled had the continuous crystalline orientation of the lower Al and had the same FWHM of a rocking curve as that of the under-layer metal wiring 2'. Subsequently Al—Nb was continuously deposited in a thickness of 250 Å as an amorphous thin film 3 by sputtering. After this had been exposed to the air and then subjected to bias cleaning by Ar RF plasma, an Al film was deposited in a thickness of 250 Å as a metal wiring 2 by means of a sputter or thermal CVD method using TIBA. The distribution of the crystalline orientation of this Al film was uniform and the rocking FWHM was 1.2°. Further, Al may be deposited after removing an amorphous thin film 3 corresponding to the via 4 by a conventional PEP step and ion-milling step. Even the Al film thus obtained had the uniform orientation including the via part, and the FWHM was similarly 1.2°.

On the other hand, in a comparative example, an amorphous thin film did not exist. According to this comparative example, in the both cases, the FWHM of Al on amorphous $SiO_2$ was about 8° and the uniformity in orientation thereof was not satisfactory, especially the orientation of the via part being considerably disturbed.

EXAMPLE 9

Figure 12A:
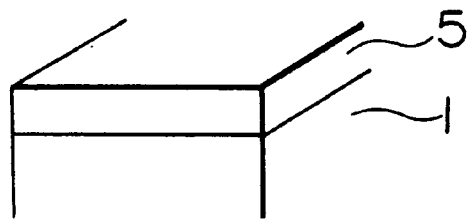
FIGS. 12(a) to (f) are sectional view showing a method for forming a wiring according to Example 9.
Figure 12B:
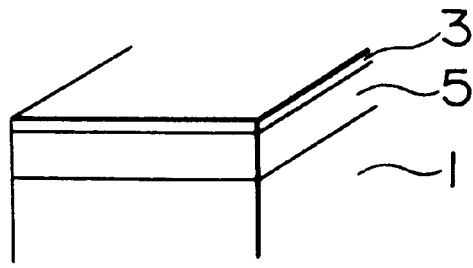
Figure 12C:
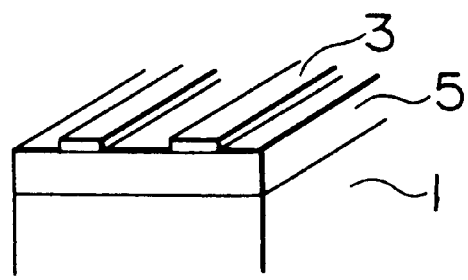
Figure 12D:
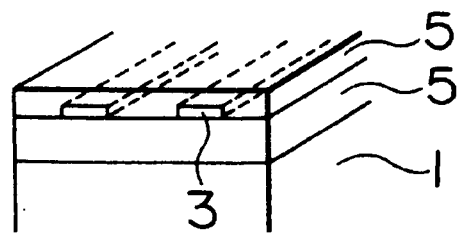
Figure 12E:
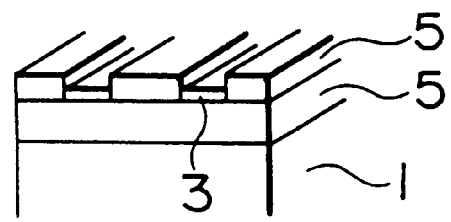
Figure 12F:
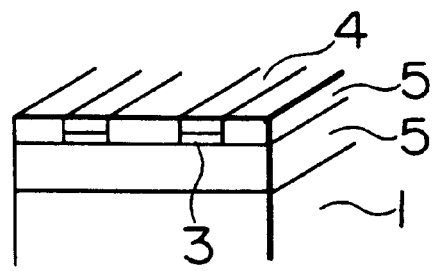
Figure 13:
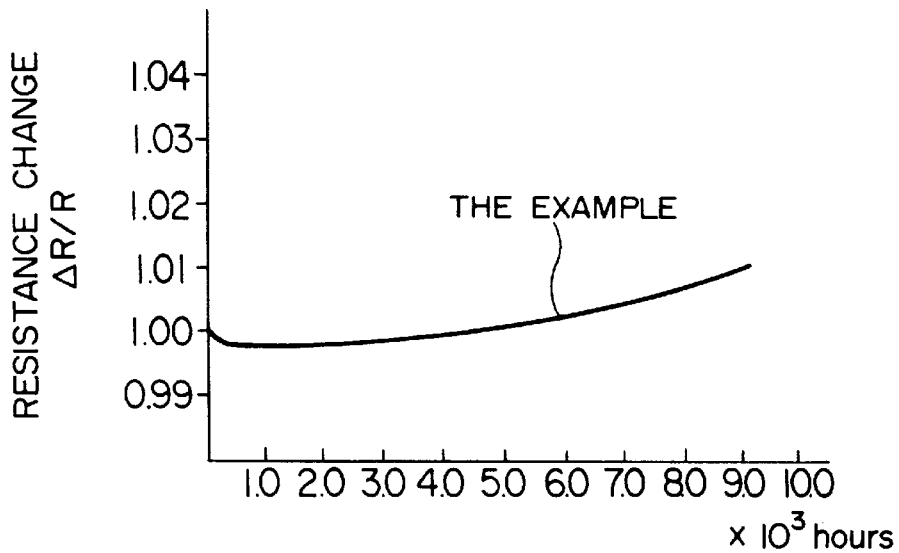
FIG. 13 is a view showing results of an accelerated test according to Example 9.

Referring to FIGS. 12 and 13, an embodiment will be described.

As shown in FIG. 12(a), an insulative layer formed of amorphous $SiO_2$ was formed on the surface of a Si substrate 1. First, a 1000 Å thick amorphous thin film 3 was deposited on the amorphous $SiO_2$ by a sputter method (FIG. 12(b)) and then the amorphous thin film 3 on parts other than parts on which wiring would be formed were removed by etching (FIG. 12(c)). A 5000 Å. thick insulative layer 5 formed of amorphous $SiO_2$ was uniformly deposited thereon (FIG. 12(d)). Next, only $SiO_2$ on the amorphous thin film 3 was removed by etching to form a groove in which wiring would be arranged (FIG. 12(e)). As a result, the bottom surfaces of the grooves were made of the amorphous thin film 3. In this embodiment, the width of the grooves, the width of the metal wiring, was 0.8 μm and the depth of the grooves was 4000 Å. An ion beam with low energy was irradiated on the above substrate 1 with the grooves to remove an oxide film on the surface of the amorphous thin film 3. Thereafter, Al was deposited by means of a thermal CVD method using TIBA to obtain a metal wiring 4 (FIG. 12(f)). Selective growth that Al was deposited only in the grooves could be performed at a substrate temperature of 300° C. or lower. Table 3 shows the Al deposition speed in the grooves against substrate temperatures in the case where an Al amorphous alloy, as the amorphous thin film 3, was formed on the groove bottom surface. The Al amorphous alloys include $Al_{30}Ta_{70}$, $Al_{40}Nb_{60}$, and $Al_{50}V_{50}$. Further, in order to confirm the selective growth, Table 3 also shows if selective growth for $SiO_2$ was performed in parts other than the grooves. As comparative examples, a film of amorphous $SiO_2$, polycrystalline silicon or polycrystalline silver was formed on the groove bottom surface. The Al deposition speeds and selective growth of the comparative examples are shown in Table 3. As compared with the Al amorphous alloys, if Al was deposited on the amorphous $SiO_2$ and polycrystalline silicon, sufficient Al deposition speed could not be obtained at 300° C. or lower and the surface morphology of the filled Al was not satisfactory (rugged surface). Moreover, as compared with the amorphous Al alloys, if Al was deposited on polycrystalline silver, the deposition speed was slower and there were parts where Al was not continuously filled in the line direction of wiring.

Next, the crystalline properties of selectively filled Al were evaluated by X-ray diffraction. The results are shown in Table 4. The Al orientation was evaluated by measuring the FWHM of a rocking curve of an Al(111) diffraction peak. Al filled in the grooves whose under-layer was formed of the Al amorphous alloy has (111) high orientation with the FWHM of about 1°.

Al filled in the grooves whose bottom was formed of the Al amorphous alloy was examined by a transmission electron microscope. The examination revealed that a diameter of Al crystal grains was about 1 μm to be substantially the same as the wiring width and that these (111) crystal grains were connected with small angle grain boundaries in the line direction of the wiring. Further, there existed a region which consisted of one crystal grain with length of 10 μm or more in the wiring line direction. This exhibits that a single-crystal Al wiring was partially obtained which had more excellent stress-migration and electromigration endurance than those of (111) high orientation.

Last, an accelerated test was conducted for studying the electromigration endurance of the Al-filled wiring obtained in the embodiment. The results are shown in FIG. 13. The test conditions are a substrate temperature of 150° C. and a current density of $1 \times 10^7$ A/cm². Based on the change in the rate of resistance change as time elapsed, the much higher reliability than a conventional Al wiring was confirmed.

TABLE 3

| | Constituent material of groove bottom surface | Al deposition speed (A/min) | | | | Selectivity for SiO$_2$ | Continuity of surface form |
|---|---|---|---|---|---|---|---|
| | | 320 (° C.) | 300 (° C.) | 280 (° C.) | 260 (° C.) | | |
| Example 9-1 | Al$_{30}$Ta$_{70}$ | 1400 | 430 | 170 | 60 | ⊚ | ⊚ |
| Example 9-2 | Al$_{40}$Nb$_{60}$ | 1400 | 430 | 170 | 60 | ⊚ | ⊚ |
| Example 9-3 | Al$_{50}$V$_{50}$ | 1400 | 430 | 170 | 60 | ⊚ | ⊚ |
| Comparative Example 9-1 | Amorphous SiO$_2$ | 110 | 30 | 10 | 0 | x | x |
| Comparative Example 9-2 | Polycrystalline Si | 150 | 50 | 20 | 0 | Δ | x |
| Comparative Example 9-3 | Polycrystalline Ag | 430 | 150 | 60 | 20 | ○ | Δ |

TABLE 4

| | Constituent material of groove bottom surface | Al(111) FWHM (°) |
|---|---|---|
| Example 9-4 | Al$_{30}$Ta$_{70}$ | 1.0 |
| Example 9-5 | Al$_{40}$Nb$_{60}$ | 1.1 |
| Example 9-6 | Al$_{50}$V$_{50}$ | 1.0 |

EXAMPLE 10

Figure 14:
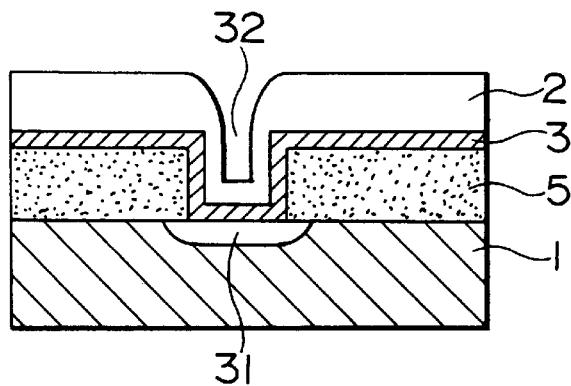
FIG. 14 is a sectional view according to Example 10.

Referring to FIG. 14, an embodiment will be described.

As shown in FIG. 14, a SiO$_2$ insulative layer 5 was formed on a semiconductor substrate 1 with a functional element 31 by means of a CVD method. A region destined for a contact part was removed by etching to from a contacting hole 32. In order to obtain the excellent contact properties, a natural oxide film which was formed on the semiconductor substrate 1 of the contacting hole bottom surface was removed by hydrofluoric acid cleaning. In order to prevent re-oxidization, it was rinsed with pure water with a low oxygen concentration and then dried by highly pure nitrogen gas purge. An Al—Ta amorphous thin film 3 was formed on the substrate by a multi-sputter apparatus. The sputtering conditions are shown below.

Sputter system: RF magnetron system
Target: 100 mmφ Al—Ta mosaic target
Substrate temperature: Room temperature (25° C.)
Sputter gas: Ar
Gas pressure: 0.20 Pa
Applied power: 10 W/cm$^2$
Film thickness: 400 Å

Composition analysis revealed that the formed film was Al$_{55}$Ta$_{45}$. X-ray diffraction revealed that the film was amorphous. Although the Al amorphous thin film 3 was formed by a sputter method in this embodiment, a similar amorphous film can be formed by a CVD method or vapor deposition method. Further although a Al—Ta mosaic target was used in the sputtering of the Al amorphous thin film 3, a similar amorphous thin film can be obtained by the other methods such as simultaneous sputtering with an Al/Ta binary target or alternate laminating Al and Ta in thin thicknesses.

Keeping vacuum, an Al film was formed thereon by a sputter method. The sputtering conditions are shown below.

Sputter system: RF magnetron system
Target: 100 mmφ Al target
Substrate temperature: Room temperature (25° C.)
Sputter gas: Ar
Gas pressure: 1 Pa
Applied power: 5 W/cm$^2$
Film thickness: 4000 Å

The Al film thus formed was evaluated for the orientation and crystalline properties by X-ray diffraction. The FWHM of a (111) rocking curve was 1.0° and excellent orientation was observed. Namely satisfactory orientation was obtained. Although the Al film was formed by a sputter method in this embodiment, similarly satisfactory layers can be obtained by means of a CVD method and vapor deposition method.

Thereafter a resist was formed in a given pattern by standard lithography technique and dry etching of the Al film and Al—Ta amorphous thin film 3 was simultaneously conducted using an etching gas containing chlorine to process the Al film into a metal wiring 2. After the processing, residue was not observed by SEM (scanning electron microscope) examination and the processability was excellent. This sample was subjected to thermal treatment for 15 minutes at 450° C. in a forming gas (N$_2$:H$_2$=9:1) and then a leak current and contact resistance in a conjunction part were measured. They were not changed by the thermal treatment and the excellent barrier property was confirmed.

EXAMPLE 11

Figure 15:
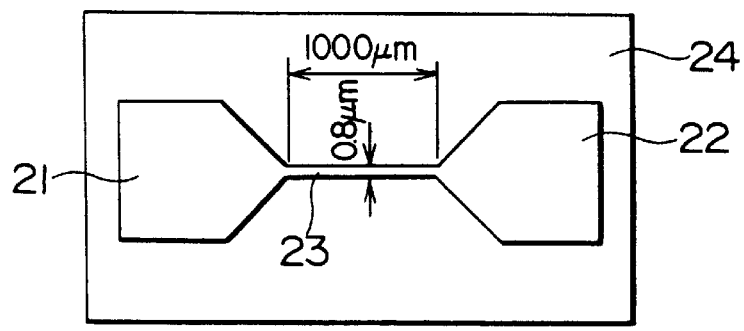
FIG. 15 is a plan view showing a test substrate with a wiring part according to Example 11.

Referring to FIG. 15, an embodiment will be described.

For examining the electromigration endurance of an Al wiring, an Al—Ta amorphous thin film and Al film were formed on a silicon substrate with a thermal oxide film under condition similar to Example 10. As shown in FIG. 15, by using this substrate, a test substrate 24 was made which had an anode 21, a cathode 22 and a 0.8 μm wide wiring part 23 connecting these electrodes. The orientation and crystalline properties of an Al film of this test substrate was evaluated by X-ray diffraction. As a result, similarly to Example 10, the FWHM of a (111) rocking curve was 1.0°.

A current at a current density of 2×10$^6$ A/cm$^2$ was flown in the test substrate 24 at a test temperature of 200° C. to measure its average failure time. The value was 1000 hours or more, thereby exhibiting that the test substrate had the high electromigration endurance.

EXAMPLE 12

In a manner similar to Example 10, Al—Mo amorphous thin film was formed on a substrate with functional elements thereon. As a result of composition analysis, it was found that the formed film was $Al_{60}Mo_{40}$. X-ray diffraction revealed that the film was amorphous. An Al film formed thereon was evaluated for the orientation and crystalline properties by X-ray diffraction. As a result, the FWHM of a (111) rocking curve was 1.1°. Satisfactory orientation was observed.

Thereafter a resist was formed in a given pattern by standard lithography technique, and dry etching of the Al film and Al—Mo amorphous thin film was simultaneously conducted using an etching gas containing chlorine to process the Al film into a metal wiring. After the processing, residue was not observed by SEM examination and the processability was excellent. This sample was subjected to thermal treatment for 15 minutes at 450° C. in a forming gas ($N_2:H_2=9:1$) and then a section of a conjunction part were measured. No alloy spike was not observed and the excellent barrier property was confirmed.

EXAMPLE 13

In a manner similar to Example 10, Al—Nb—Si amorphous thin film was formed on a substrate with functional elements thereon. As a result of composition analysis, it was found the formed film was $Al_{40}Nb_{55}Si_5$. X-ray diffraction revealed that the film was amorphous. An Al film formed thereon was evaluated for the orientation and crystalline properties by X-ray diffraction. As a result, the FWHM of a (111) rocking curve was 1.3°. Excellent orientation was observed.

Thereafter a resist was formed in a given pattern by standard lithography technique, and dry etching of the Al film and Al—Nb—Si amorphous thin film was simultaneously conducted using an etching gas containing chlorine to process the Al film into a metal wiring. After the processing, residue was not observed by SEM examination and the processability was excellent. This sample was subjected to thermal treatment for 15 minutes at 450° C. in a forming gas ($N_2:H_2=9:1$) and then a section of a conjunction part was measured. No alloy spike was observed and the excellent barrier property was confirmed. Moreover, since Si was contained, the thermal stability of the amorphous thin film was improved. Even when the amorphous thin film was subjected to further higher thermal treatment, any crystallization and reaction were not observed. In the cases of Ge, P and B, this advantageous effects were also obtained.

EXAMPLE 14

Figure 16:
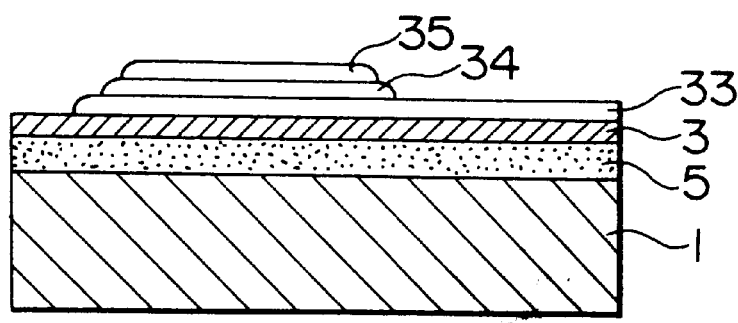
FIG. 16 is a sectional view according to Example 14.

Referring to FIG. 16, an embodiment will be described.

A six-inch silicon wafer with a 4000 Å insulative film 5 formed of a thermal oxide film was used as a substrate 1. A PtZr amorphous thin film 3 was formed by means of a multi-target sputter apparatus as shown in FIG. 5. The sputtering conditions are shown below.

Sputter system: RF magnetron system
Target: 100 mmφ PtZr mosaic target
Substrate temperature: Room temperature (25° C.)
Sputter gas: Ar
Gas pressure: 0.20 Pa
Applied power: 10 W/cm²
Film thickness: 500 Å
Composition analysis revealed that the formed film was $Pt_{21}Zr_{79}$. X-ray diffraction revealed that the film was amorphous.

Next, keeping vacuum, Pt was sputtered on the amorphous PtZr film. The sputter conditions are shown below.

Sputter system: RF magnetron system
Target: 100 mmφ Pt target
Substrate temperature: Room temperature (25° C.)
Sputter gas: Ar
Gas pressure: 1 Pa
Applied power: 5 W/cm²
Film thickness: 1000 Å

The Pt film 33 thus formed as an under electrode was evaluated for the orientation and crystalline properties by X-ray diffraction. The (111) orientation FWHM was 1.4° and satisfactory crystalline properties were observed.

Next, on this under electrode layer, a strontium titanate film 34 was formed as a dielectric thin film by means of a RF magnetron sputter method. A sintered body of strontium titanate was used as a target. The sputter conditions are shown below.

Sputter system: RF magnetron system
Target: 100 mmφ $SrTiO_3$ target
Substrate temperature: 500° C.
Sputter gas: $Ar/O_2$
Gas pressure: 1 Pa
Applied power: 5 W/cm²
Film thickness: 5000 Å

The orientation and crystalline properties of the dielectric thin film were evaluated by X-ray diffraction. The (111) orientation of Pt film 33 was continued and the (111) orientation FWHM was 1.5°. An Au film 35 was vapor deposited on this dielectric thin film as an upper electrode and the capacitor property thereof was evaluated. It was found that dielectric constant and leak current were satisfactory values. On the other hand, the orientation FWHM of a Pt film directly formed on the thermal oxide film was 9.2°. When a strontium titanate film was formed thereon under the above conditions, the orientation FWHM was 9.5°.

EXAMPLE 15

Like Example 14, using a six-inch silicon wafer substrate with a 4000 Å thermal oxide film, a $Pt_{21}Zr_{79}$ film was formed as an amorphous thin film by means of a multi-target sputter apparatus.

Next, keeping vacuum, a PtTi film was formed by sputtering as an under electrode on the amorphous $Pt_{21}Zr_{79}$ film. The sputter conditions are shown below.

Sputter system: RF magnetron system
Target: 100 mmφ Pt/Ti binary targets
Substrate temperature: Room temperature (25° C.)
Sputter gas: Ar
Gas pressure: 1 Pa
Applied power: 5 W/cm²
Film thickness: 1000 Å

The PtTi film thus formed was subjected to composition analysis. The analysis revealed that the composition thereof was $Pt_{88}Ti_{12}$. The orientation and crystalline properties thereof were evaluated by X-ray diffraction. The (111) orientation FWHM was 1.4° and satisfactory crystalline properties were observed.

Next, on this under electrode, a ferrodielectric thin film of lead titanate zirconate was grown by means of a RF magnetron sputter method. A used target was a sintered body where powder of lead titanate zirconate added with lead oxide 10 mol % rich was sintered at 1200° C. The sputtering conditions are shown below.

Sputter system: RF magnetron system

Target: 100 mmφ Pb(ZrTi)O$_3$ target (PbO 10 mol % RICH)

Substrate temperature: 600° C.

Sputter gas: Ar/O$_2$

Gas pressure: 1 Pa

Applied power: 5 W/cm$^2$

Film thickness: 5000 Å

The orientation and crystalline properties of the obtained strong dielectric thin film were evaluated by X-ray diffraction. The (111) orientation of the PtTi film was continued and the (111) orientation FWHM was 1.9°. On the other hand, the orientation FWHM of a Pt film directly formed on the thermal oxide film was 9.2°. When a lead titanate zirconate film was formed thereon under the above conditions, the orientation FWHM was 9.8°.

EXAMPLE 16

Figure 17:
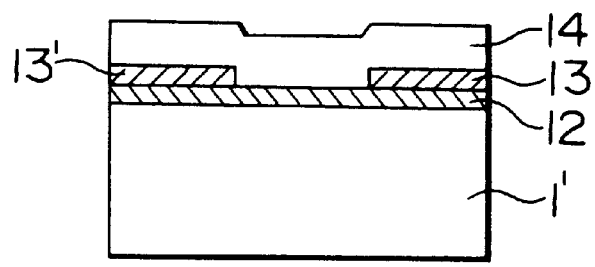
FIG. 17 is a sectional view according to Example 16.

Referring to FIG. 17, an embodiment will be described.

On a glass substrate 1', an AlTa amorphous thin film was formed as a resistance heater film 12 by means of a multi-target sputter apparatus as shown in FIG. 5. The sputter conditions are shown below.

Sputter system: RF magnetron system

Target: 100 mmφ Al/Ta binary targets

Substrate temperature: Room temperature (25° C.)

Sputter gas: Ar

Gas pressure: 0.20 Pa

Applied power: 10 W/cm$^2$

As a result of composition analysis, it was found that the formed film was Al$_{25}$Ta$_{75}$. X-ray diffraction revealed that this film was amorphous. In the same chamber, an Al thin film was sputtered thereon. The sputter conditions are shown below.

Sputter system: RF magnetron system

Target: 100 mmφ Al target

Substrate temperature: room temperature (25° C.)

Sputter gas: Ar

Gas pressure: 1 Pa

Applied power: 5 W/cm$^2$

The crystalline properties of the formed film were evaluated by X-ray diffraction. This film was an oriented film with the FWHM 1.0° of a (111) rocking curve.

Next this Al film was processed by lithography and etching steps to form electrodes 13, 13'. Further a SiO$_2$ insulative film 14 was coated thereon to prevent oxidation and improve abrasion resistance. A thermal head thus formed was actually mounted in a printer and a recording test was conducted. The test showed that fluctuation in record concentration was smaller than a conventional thermal head even in a fine pattern. In addition, an Al electrode was not degraded.

EXAMPLE 17

Figure 18:
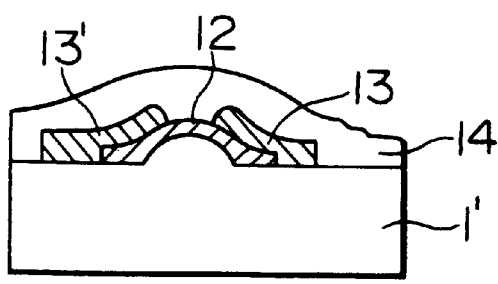
FIG. 18 is a sectional view according to Example 17.

Referring to FIG. 18, an embodiment will be described.

On a glass substrate 1' with a height, an AlNa thin film was formed as a resistance exothermic body film 12 by means of a multi-target sputter apparatus as shown in FIG. 5. The sputter conditions are shown below.

Sputter system: RF magnetron system

Target: 100 mmφ Al/Nb binary targets

Substrate temperature: Room temperature (25° C.)

Sputter gas: Ar

Gas pressure: 0.20 Pa

Applied power: 10 W/cm$^2$

As a result of composition analysis, it was found that the formed film was Al$_{40}$Nb$_{60}$. X-ray diffraction revealed that this film was amorphous.

This Al—Nb film was processed by lithography and etching steps to remain only on the height and vicinity thereof. Next this was placed in a chamber again and subjected to Ar bias cleaning. Then an Al film was sputtered. The sputter conditions are shown below.

Sputter system: RF magnetron system

Target: 100 mmφ Al target

Substrate temperature: room temperature (25° C.)

Sputter gas: Ar

Gas pressure: 1 Pa

Applied power: 5 W/cm$^2$

The crystalline properties of the Al film formed on the flat part were evaluated by X-ray diffraction. This film was an oriented film with the FWHM of 1.2° of a (111) rocking curve.

Next this Al film was processed by lithography and etching steps to form electrodes 13, 13'. Further a SiO$_2$ insulative film 14 was coated thereon to prevent oxidation and improve abrasion resistance. The recording test was conducted under the same conditions as Example 16. The test showed the excellent properties.

EXAMPLE 18

Figure 19:
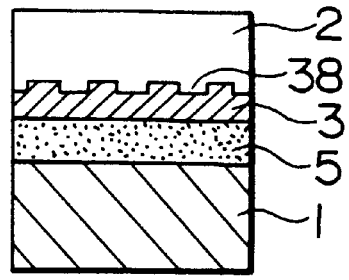
FIG. 19 is a sectional view according to Example 18.

Referring to FIG. 19, an embodiment will be described. using a six-inch silicon wafer substrate 1 with a 4000 Å insulative oxide layer 5 of a thermal oxide film, an AlTa amorphous film 3 was formed by means of a multi-target sputter apparatus as shown in FIG. 5. The sputter conditions are shown below.

Sputter system: RF magnetron system

Target: 100 mmφ Al/Ta binary targets

Substrate temperature: Room temperature (25° C.)

Sputter gas: Ar

Gas pressure: 0.20 Pa

Applied power: 10 W/cm$^2$

Film thickness: 1000 Å

Composition analysis revealed that the formed film was Al$_{45}$Ta$_{55}$. X-ray diffraction revealed that the film was amorphous.

Next, in the surface of the AlTa amorphous thin film 3, grooves 38 were formed by standard lithography and RIE steps. The depth of the grooves 38 was 100 Å and the width thereof was 1000 Å.

After the AlTa amorphous thin film 3 with the grooves 38 was subjected to Ar bias cleaning, an Al film was sputtered. The sputter conditions are shown below.

Sputter system: RF magnetron system

Target: 100 mmφ Al target

Substrate temperature: Room temperature (25° C.)

Sputter gas: Ar

Gas pressure: 1 Pa

Applied power: 5 W/cm$^2$

Film thickness: 4000 Å

The Al film thus formed was evaluated for the orientation and crystalline properties by X-ray diffraction. The (111) orientation FWHM was 1.2° and satisfactory crystalline properties were observed.

Further, observation by a transmission electron microscope (TEM) revealed that directions of Al <211> were substantially equal to the longitudinal direction of the grooves 38 formed on the amorphous thin film 3 so that the Al film 2 consisted of only small angle boundaries.

Next, this Al film was processed into a metal wiring for the EM test. Steps for preparing a test sample were as follows: As shown in FIG. 15, a test substrate 24 had an anode 21, a cathode 22 and a 0.8 µm wide wiring part 23 connecting these electrodes. The test substrate 24 was made by standard lithography and RIE steps. A current at a current density of $2 \times 10^6$ A/cm$^2$ was flown to the wiring part 23 of the test substrate 24 at a test temperature of 200° C. It was confirmed that even after the elapsed time of 1000 hours there was no failure. This exhibits that since Al film was highly oriented and the Al film was a film formed only of small angle grain boundaries, the electromigration endurance was dramatically enhanced.

EXAMPLE 19

Figure 20:
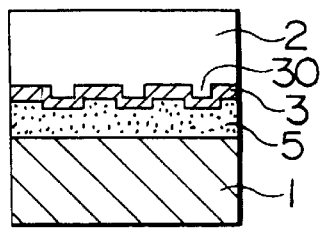
FIG. 20 is a sectional view according to Example 19.

Referring to FIG. 20, an embodiment will be described.

Using a six-inch silicon wafer substrate 1 with a 4000 Å insulative layer 5 of a thermal oxide film, grooves were formed by means of standard lithography and RIE steps.

A NiTa amorphous film 3 with grooves 30 was formed on the substrate 1 by means of a multi-target sputter apparatus as shown in FIG. 5. The sputter conditions are shown below.

Sputter system: RF magnetron system

Target: 100 mmφ Ni/Ta binary targets

Substrate temperature: Room temperature (25° C.)

Sputter gas: Ar

Gas pressure: 0.20 Pa

Applied power: 10 W/cm$^2$

Film thickness: 100 Å

Composition analysis revealed that the formed film was $Ni_{50}Ta_{50}$. X-ray diffraction revealed that the film was amorphous. A sectional surface was examined by a SEM. The examination revealed that the grooves 30 were uniformly formed in the surface of NiTa amorphous film 3, the depth of the grooves 30 being 1000 Å, the width thereof being 1000 Å.

After the NiTa amorphous thin film 3 was subjected to Ar bias cleaning, Al was sputtered in a manner similar to Example 18. The formed Al film was evaluated for the orientation and crystalline properties by X-ray diffraction. The (111) orientation FWHM was 0.9° and satisfactory crystalline properties were observed.

Observation by a transmission electron microscope (TEM) revealed that directions of Al (211) were substantially equal to the longitudinal direction of the grooves formed on the amorphous thin film so that the Al film consisted of only small angle grain boundaries.

EXAMPLE 20

Using a six-inch silicon wafer substrate with a 4000 Å thermal oxide film, an AlNb amorphous thin film was formed by means of a multi-target sputter apparatus as shown in FIG. 5. The sputter conditions are shown below.

Sputter system: RF magnetron system

Target: 100 mmφ Al/Nb binary targets

Substrate temperature: Room temperature (25° C.)

Sputter gas: Ar

Gas pressure: 0.20 Pa

Applied power: 10 W/cm$^2$

Film thickness: 1000 Å

Composition analysis revealed that the formed film was $Al_{40}Nb_{60}$. X-ray diffraction revealed that the film was amorphous.

In this AlNb amorphous thin film, grooves were formed by standard lithography and RIE steps. The depth of the grooves was 100 Å and the width thereof was 1000Å.

After the AlNb amorphous thin film with the grooves was subjected to Ar bias cleaning, Al-0.1 at % Cu was sputtered as a metal thin film. The sputter conditions are shown below.

Sputter system: RF magnetron system

Target: 100 mmφ AlCu alloy target

Substrate temperature: Room temperature (25° C.)

Sputter gas: Ar

Gas pressure: 1 Pa

Applied power: 5 W/cm$^2$

Film thickness: 4000 Å

The AlCu film thus formed was evaluated for the orientation and crystalline properties by X-ray diffraction. The (111) orientation FWHM was 0.9° and satisfactory crystalline properties were observed. When this film was subjected to thermal treatment at 450° C. for 30 minutes, the orientation was further enhanced and the (111) orientation FWHM become 0.7°.

Grain direction in a plane was examined by a transmission electron microscope (TEM). It was found that since the grooves arranged in the amorphous thin film controlled grain direction in a plane, the film was of small angle grain boundaries. Further, a metal wiring was formed in a manner similar to Example 18 for the EM test. Even after the elapse of 1000 hours there was no failure.

EXAMPLE 21

Figures 21A, 21B, 21C:
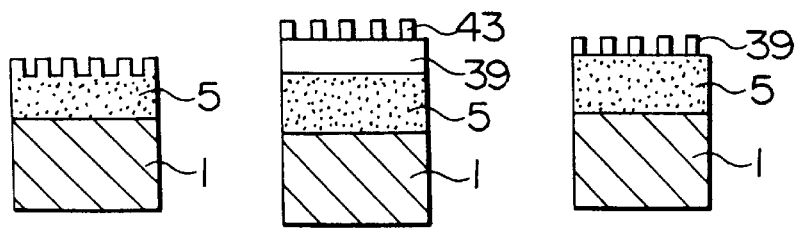
FIGS. 21(a) to (g) are sectional views according to Example 21.
Figures 21D, 21E:
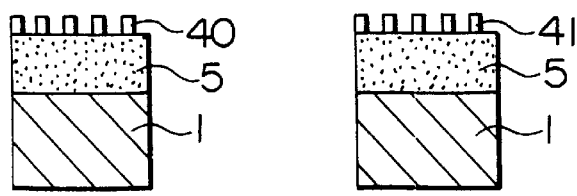
Figures 21F, 21G:
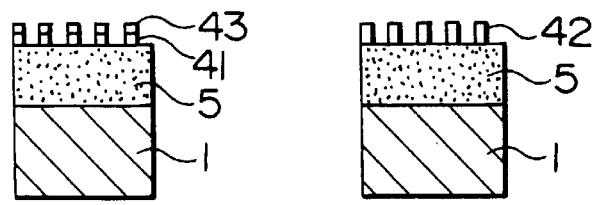
Figure 22:
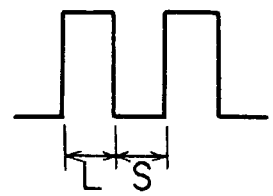
FIG. 22 is a sectional view according to Example 21.

Referring to FIGS. 21 and 22, an embodiment will be described.

A 1000 Å thick thermal oxide film was formed on a Si (100) six-inch substrate 1 as an insulating layer 5. Thereafter, the following seven samples were prepared. In a sample No. 1, the surface of amorphous $SiO_2$ (surface energy: 605 erg/cm$^2$) was processed by lithography and RIE steps to form grooves with a depth of 200 Å (L/S=0.3/0.3 µm) (FIG. 21(a)). Here, L/S is shown in FIG. 22. In a sample No. 2, polycrystalline Ta (surface energy: 2150 erg/cm$^2$) was sputtered on the thermal oxide film to form a 500 Å thick Ta film 39. Amorphous $SiO_2$ was sputtered to form a 200 Å thick $SiO_2$ film 43, and the $SiO_2$ film 43 was then processed to form grooves with a depth of 200 Å (L/S=0.3/0.3 µm) (FIG. 21(b)). In a sample No. 3, polycrystalline Ta was sputtered on the thermal oxide film to form a 200 Å thick Ta film 39. Subsequently, the Ta film 39 was processed to form grooves with a depth of 200 Å (L/S=0.3/0.3 µm) (FIG. 21(c)). In a sample No. 4, amorphous $Ni_{62}$-$Nb_{38}$ (surface energy: 1326 erg/cm$^2$) was sputtered on the thermal oxide film to form a 200 Å thick NiNb film 40. Subsequently, the NiNb film 40 was processed to form grooves with a depth of 200 Å (L/S=0.3/0.3 µm) (FIG. 21(d)). In a sample No. 5, amorphous Ta-60at % Al (surface energy: 1640 erg/cm$^2$) was sputtered on the thermal oxide film to form a 200 Å thick TaAl film 41. Subsequently, the TaAl film 41 was processed to form grooves with a depth of 200 Å (L/S=0.3/0.3 µm) (FIG. 21(e)). In a sample No. 6, amorphous Ta-60 at % Al was sputtered on the thermal oxide film to form a 100 Å thick TaAl film 41. Further amorphous $SiO_2$ was sputtered to form a 100 Å thick $SiO_2$ film 43. The $SiO_2$ film 43 and TaAl film 41 were processed to form grooves with a depth of 200 Å (L/S=0.3/0.3 µm) (FIG. 21(f)). In a sample No. 7, a 200 Å thick polysrystalline Si (surface energy: 730 erg/cm$^2$) film 42 was formed on the thermal oxide film. Subsequently, the Si film 42 was processed to form grooves with a depth of 200 Å (L/S=0.3/0.3 µm) (FIG. 21(g)). The sections of the above samples are shown in FIG. 21. For the each sample, pure Al was deposited on the above under layers at a substrate temperature of 200° C. in a thickness of 4000 Å and then processed into a four-terminal shape for the EM test. A wiring of a measurement part had the width of 1 µm and length of 2000 µm. The EM test was conducted at 150° C. in 1×10$^7$ A/cm$^2$. The results are shown in Table 5.

TABLE 5

|  | No. 1 | No. 2 | No. 3 | No. 4 | No. 5 | No. 6 | No. 7 |
|---|---|---|---|---|---|---|---|
| EM Test | x | x | ○ | ⊚ | ⊚ | ⊚ | x |

⊚: no failure up to 1000 hours
○: failed between 500 and 1000 hours
x: failure after 500 hours or less

EXAMPLE 22

A 1000 Å thick thermal oxide film was formed on Si(100) six-inch substrates and then a 200 Å thick Ta-40 at % Al film was deposited by sputtering. These samples were processed to form grooves of L/S as shown in Table 6 by RIE. The resultant samples were subjected to Ar plasma etching in a high vacuum sputter whose the degree of vacuum was on the order of 10$^{-10}$ Torr so that a surface oxide film of the Al—Ta film surface was removed by Ar plasma etching. Subsequently, a pure Al film was formed in a thickness of 4000Å. The EM test was conducted in a manner similar to Example 21. The results are shown in Table 6.

TABLE 6

| | S (µm) L/S and EM test results | | | |
|---|---|---|---|---|
| L | 0.1 | 0.2 | 0.5 | 1.0 |
| 0.1 | ⊚ | ⊚ | ○ | x |
| 0.2 | ⊚ | ⊚ | ○ | x |
| 0.5 | x | ○ | x | x |
| 1.0 | x | ○ | x | x |

⊚: no failure up to 1000 hours
○: failed between 500 and 1000 hours
x: failure after 500 hours or less

EXAMPLE 23

Referring to FIG. 23, an embodiment will be described.

Figure 23A:
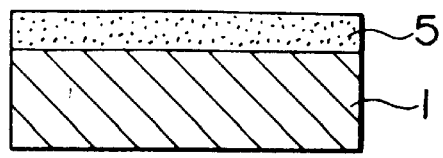
FIGS. 23(a) to (e) are sectional views showing a flow of steps according to Example 23.
Figure 23B:
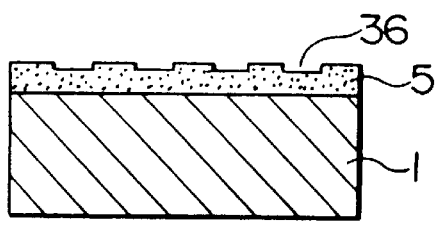

Using a six-inch silicon wafer substrate 1 with a 4000 Å insulative layer 5 of a thermal oxide film (FIG. 23(a)), grooves 36 were formed by standard lithography and RIE steps (FIG. 23(b)). The depth of the grooves 36 was 100 Å and the width thereof was 1500 Å.

Figure 23C:
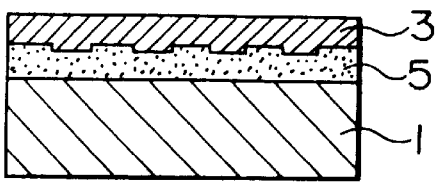
Figure 23D:
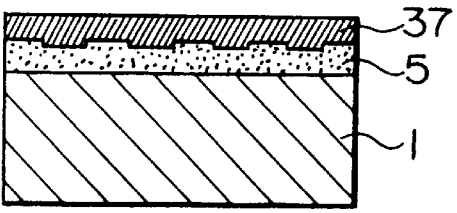
Figure 23E:
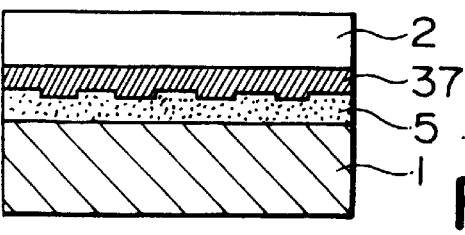

A AlTa amorphous film 3 was formed on this substrate 1 by means of a multi-target sputter apparatus as shown in FIG. 5 (FIG. 23(c)). The sputter conditions are shown below.

Sputter system: RF magnetron system
Target: 100 mmφ Al/Ta binary targets
Substrate temperature: Room temperature (25° C.)
Sputter gas: Ar
Gas pressure: 0.20 Pa
Applied power: 10 W/cm$^2$
Film thickness: 1000 Å

Composition analysis revealed that the formed film was Al$_{75}$Ta$_{25}$. X-ray diffraction revealed that the film was amorphous. Subsequently, this substrate 1 was subjected to thermal treatment at 450° C. for 30 minutes so that the AlTa amorphous thin film 3 was crystallized to form an intermetallic compound of Al$_3$Ta or a polycrystalline film 37 with small angle grain boundaries in a grain diameter of 1 to 2 µm (FIG. 23(d)). In the same chamber, an Al film was sputtered thereon (FIG. 23(e)). The sputter conditions are shown below.

Sputter system: RF magnetron system
Target: 100 mmφ Al target
Substrate temperature: Room temperature (25° C.)
Sputter gas: Ar
Gas pressure: 1 Pa
Applied power: 5 W/cm$^2$
Film thickness: 4000 Å

The Al film thus formed was evaluated for the orientation and crystalline properties by X-ray diffraction. The (111) orientation FWHM was improved to be 0.3° and almost grain boundaries remaining in the Al film were small angle boundaries.

Next, this Al thin film was processed into a metal wiring 2 for the EM test. Steps for preparing a test sample were as follows: As shown in FIG. 15, a test substrate 24 had an anode 21, a cathode 22 and a 0.8 µm wide wiring part 23 connecting these electrode. The test substrate 24 was made by standard lithography and RIE steps. A current at a current density of 2×10$^6$ A/cm$^2$ was loaded to the wiring part 23 of the test substrate 24 at a test temperature of 200° C. Even after the elapsed time of 1000 hours there was no failure. This exhibits that since the Al film was similar to single-crystal, the electromigration endurance was dramatically enhanced.

EXAMPLE 24

Using a six-inch silicon wafer substrate with a 4000 Å thermal oxide film, grooves were formed by standard lithography and RIE steps. The depth of the grooves was 500 Å and the width thereof was 5000Å. The space between the grooves was 3000 Å.

A AlNb amorphous film was formed on this substrate by means of a multi-target sputter apparatus as shown in FIG. 5. The sputter conditions are shown below.

Sputter system: RF magnetron system
Target: 100 mmφ Al/Nb binary targets
Substrate temperature: Room temperature (25° C.)
Sputter gas: Ar
Gas pressure: 0.20 Pa
Applied power: 10 W/cm$^2$
Film thickness: 400 Å

Composition analysis revealed that the formed film was Al$_{75}$Nb$_{25}$. X-ray diffraction revealed that the film was amorphous. Subsequently, this substrate was heated at 450° C. for 30 minutes so that the AlNb amorphous film was crystallized to form an intermetallic compound of Al$_3$Nb. The intermetallic compound was filled in the grooves to be of single-crystal. The surface of the resultant substrate was flatted by polishing and then was placed into a chamber again. After Ar bias cleaning, an Al-0.1 at % Cu alloy was sputtered as a metal thin film. The sputter conditions are shown below.

Sputter system: RF magnetron system
Target: 100 mmφ AlCu alloy target
Substrate temperature: Room temperature (25° C.)

Sputter gas: Ar
Gas pressure: 1 Pa
Applied power: 5 W/cm$^2$
Film thickness: 4000 Å

The AlCu film thus formed was processed into a metal wiring by a RIE step. Moreover, in the EM test under the same conditions as those of Example 23, even after the elapse of 1000 hours there was no failure.

EXAMPLE 25

Figure 24:
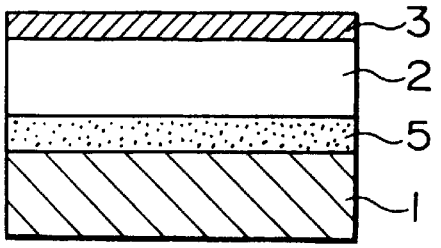
FIG. 24 is a sectional view according to Example 25.

Referring to FIG. 24, an embodiment will be described.

As shown in FIG. 24, on a Si wafer substrate 1 where a 1000 Å thick thermal oxide film was formed as an insulative layer 5, a 4000 Å thick pure Al thin film destined for a metal wiring 2 was formed by sputtering. After the formation of this Al thin film, while keeping vacuum of 1×10$^{-7}$ Torr, an Al—Ta amorphous thin film 3 was formed by sputtering using an Al/Ta mosaic target. The thickness of the layer 3 varied 100, 300, and 500 Å. At this time, after the formation of this Al thin film, some samples were exposed to the air. The exposed samples were then placed into a sputter apparatus again so that the Al—Ta amorphous thin film 3 was formed on the pure Al thin film. Prior to forming the amorphous thin film 3, a surface oxide of the exposed samples was removed by RF—Ar plasma where the substrate 1 side was an electrode. In the removal of the surface oxide, plasma etching was conducted until a clear diffraction pattern of an Al thin film was observed by RHEED for the surface of the Al thin film. The composition of the amorphous thin film 3 was $Al_{20}Ta_{80}$.

The laminated structure of the metal film 2 of a pure Al and Al—Ta amorphous thin film 3 was thus prepared. In order to examine occurrence frequency of hillocks in the metal film, these thin samples were thermal treated in a forming gas ($N_2$—$H_2$) at 450° C. for 30 minutes. Hillock density measured by an optical microscope and tracer type device for measuring a film thickness (α-STEP) are shown in Table 7. As shown in table 7, it was found that the existence of the amorphous thin film 3 considerably reduced the number of hillocks and that even when the thickness of the amorphous thin film 3 was 100 Å, this effect could be obtained.

TABLE 7

| | Structure of thin film | Thickness of films (Å) | Hillock density after termal treatment |
|---|---|---|---|
| Comparative Example | Al | 4000 | 158/1 mm |
| Example | a-AlTa//Al | 500//4000 | 1/1 mm |
| | a-AlTa/ Al | 500 /4000 | 3/1 mm |
| | a-AlTa//Al | 300//4000 | 1/1 mm |
| | a-AlTa/ Al | 300 /4000 | 4/1 mm |
| | a-AlTa//Al | 100//4000 | 2/1 mm |
| | a-AlTa/ Al | 100 /4000 | 5/1 mm |

// means that after a surface oxide was removed by Ar sputtering and the removal was confirmed by RHEED, an amorphous thin film was formed. A height peak of 500 Å or more by α-STEP was judged as a hillock and the number of such hillocks was counted.

EXAMPLE 26

On a Si wafer substrate where a 1000 Å thick thermal oxide film was formed as an insulative layer, a 4000 Å thick pure Cu thin film destined for a metal wiring was formed by sputtering. After the formation of this Cu thin film, while keeping vacuum of 1×10$^{-7}$ Torr, a Cu—Zr amorphous thin film or a Ni—Nb amorphous thin film was formed by binary target sputtering. The thickness of the amorphous Cu—Zr alloy layer or the amorphous Ni—Nb alloy layer varied 100, 300, and 500 Å. At this time, after the formation of this Cu thin film, some samples were exposed to the air. The exposed samples were then placed into a sputter apparatus again so that the Cu—Zr amorphous thin film or the Ni—Nb amorphous thin film was formed on the pure Cu thin film. Prior to forming the amorphous thin film, a surface oxide of the exposed samples was removed by RF—Ar plasma where the substrate side was an electrode. In the removal of the surface oxide, plasma etching was conducted until a clear diffraction pattern of a Cu thin film was observed by RHEED for the surface of the Cu thin film. The composition of the amorphous thin film was $Cu_{50}Zr_{50}$ or $Ni_{65}Nb_{35}$.

In order to examine the oxidization resistance of these thin films in the laminated structure of the metal wiring of the pure Cu thin film, and Cu—Zr or Ni—Nb amorphous thin film, these thin samples were subjected to thermal treatment in the air at 500° C. for 30 minutes. Here, Cu and Ni are capable of a continuous series of solid solutions. The results are shown in Table 8. As shown in Table 8, while in the pure Cu thin film the surface become rugged due to volume expansion with increase in the degree of oxidization, in the sample with the laminated Cu—Zr or Ni—Nb amorphous thin film there was no significant difference in evaluation of surface roughness by the use of a tracer type device for measuring a film thickness (α-STEP) as shown in Table 8.

TABLE 8

| | Structure of thin film | Thickness of films (Å) | Average roughness after thermal treatment (Ra, Å) |
|---|---|---|---|
| Comparative Example | Cu | 4000 | 790 |
| Example | a-CuZr//Cu | 500//4000 | 65 |
| | a-CuZr/ Cu | 500 /4000 | 78 |
| | a-CuZr//Cu | 300//4000 | 59 |
| | a-CuZr/ Cu | 300 /4000 | 55 |
| | a-CuZr//Cu | 100//4000 | 67 |
| | a-CuZr/ Cu | 100 /4000 | 72 |
| | a-NiNb//Cu | 500//4000 | 66 |
| | a-NiNb/ Cu | 500 /4000 | 71 |
| | a-NiNb//Cu | 300//4000 | 78 |
| | a-NiNb/ Cu | 300 /4000 | 68 |
| | a-NiNb//Cu | 100//4000 | 59 |
| | a-NiNb/ Cu | 100 /4000 | 61 |

// means that after a surface oxide was removed by Ar sputtering and the removal was confirmed by RHEED, amorphous thin film was formed.

EXAMPLE 27

Figure 25:
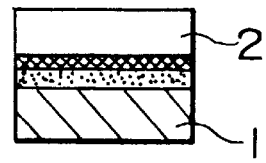
FIG. 25 is a sectional view according to Example 27.

Referring to FIG. 25, an embodiment will be described.

Using a six-inch silicon wafer substrate 1 with a 4000 Å thick insulative layer 5 formed of a thermal oxide film, Sn was vapor deposited on the substrate to form a Sn film 51 in 1 mono layer (ML) (FIG. 25). A K-cell (Knudsen-Cell) temperature was 1100° C. and a substrate temperature was 450° C. Keeping vacuum, Al was vapor deposited on the substrate 1 with the Sn film 51 to form a 1000 Å thick Al film for a metal wiring 2. A K-cell temperature was 1050° C. and a substrate temperature was room temperature.

The Al film thus formed was evaluated for the orientation by X-ray diffraction. The (111) orientation FWHM was 2.0° and satisfactory crystalline properties were observed.

Besides Sn, in the cases of Ga, In, Cd, Bi, Pb and Tl, similar effects were obtained.

EXAMPLE 28

Using a six-inch silicon wafer substrate with a 4000 Å thick insulative layer of a thermal oxide film, Pb was vapor deposited in 1 mono layer on the substrate. A K-cell temperature was 600° C. and a substrate temperature was room temperature. Keeping vacuum, a 1000 Å thick Cu film was vapor deposited on the substrate with the Pb film. A K-cell temperature was 1200° C. and a substrate temperature was room temperature.

The Cu film thus formed was evaluated for the orientation by X-ray diffraction. The (111) orientation FWHM was 4.0° and satisfactory crystalline properties were observed.

In the cases of Tl, similar effects were obtained.

EXAMPLE 29

Using a six-inch silicon wafer substrate with a 4000 Å thick insulative layer of a thermal oxide film, an Al—Ta amorphous thin film was formed by a multi-sputter apparatus. The sputter conditions are shown below.

Sputter system: RF magnetron system

Target: 100 mmφ AlTa alloy target

Substrate temperature: Room temperature (25° C.)

Sputter gas: Ar

Gas pressure: 0.20 Pa

Film thickness: 400 Å

Composition analysis revealed that the formed film was $Al_{55}Ta_{45}$. X-ray diffraction revealed that the film was amorphous.

Keeping vacuum, Sn was vapor deposited in one mono layer thereon. The vapor deposition conditions were similar to Example 27. Further keeping vacuum, a 1000 Å thick Al film was vapor deposited on the substrate with the Sn film. A K-cell temperature was 1050° C. and a substrate temperature was room temperature.

The Al film thus formed was evaluated for the orientation by X-ray diffraction. The (111) orientation FWHM was 1.6° and satisfactory crystalline properties were observed.

EXAMPLE 30

Using a (111) oriented five-inch silicon wafer substrate, Bi was vapor deposited in 0.5 and 1 mono layers (ML). A K-cell temperature was 600° C. and a substrate temperature was room temperature. Keeping vacuum, an Al film was vapor deposited on the substrates with the Bi films in a thickness of 100 Å. A K-cell temperature was 1050° C. and a substrate temperature was room temperature. For comparison, a sample where an Al film was vapor deposited directly on the substrate was prepared.

Figure 26:
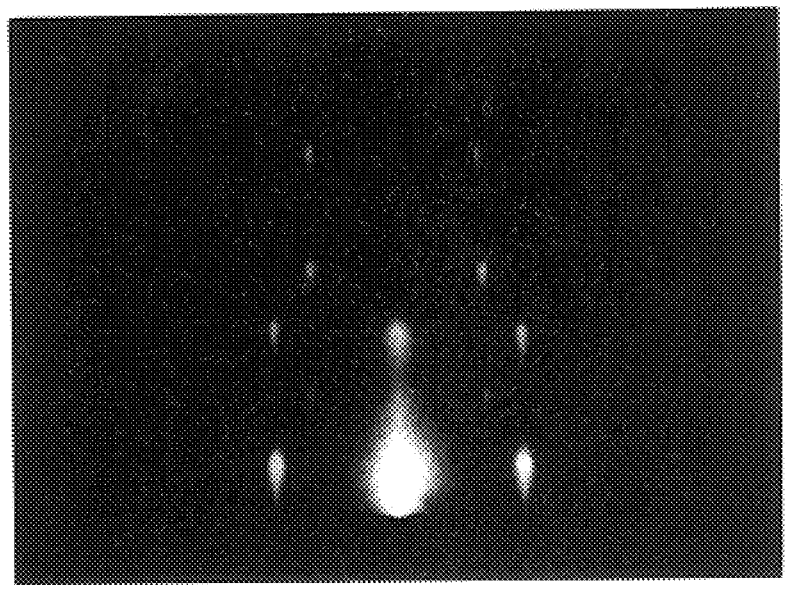
FIGS. 26(a) and (b) are RHEED photographs according to Example 30.
Figure 26:

The Al films thus formed were evaluated for the orientation and crystalline properties by RHEED and X-ray diffraction. The results are shown in FIG. 26. In the sample without Bi deposition, as shown in FIG. 26(*a*), a RHEED pattern where (111) and (100) orientations were mixed was observed. On the other hand, in the sample with Bi deposition in one atom layer, as shown in FIG. 26(*b*), (100) orientation was not observed and satisfactory crystal with the (111) orientation FWHM of 0.3° was obtained. In the sample with Bi deposition in 0.5 atom layer, although the (111) orientation FWHM was 0.5°, (100) orientation was not observed.

The surface morphology of the Al films were examined by a SEM. In the samples with Bi deposition, the high surface smoothness property was confirmed.

The compositions of the Al films were analyzed by an AES. It was found that Bi existed in the Al film surface, the Al film grain boundaries, and the interface between the Al film and thermal oxide film.

Besides Bi, in the cases of Ga, In, Cd, Sn, Pb and Tl, similar effects were obtained.

EXAMPLE 31

Using a six-inch silicon wafer substrate with a 4000 Å insulative layer of a thermal oxide film, Bi was vapor deposited in one mono layer. A K-cell temperature was 600° C. and a substrate temperature was room temperature. Keeping vacuum, an Al film was vapor deposited on the substrates with the Bi films in a thickness of 500 Å. A K cell temperature was 1050° C. and a substrate temperature was room temperature. For comparison, a sample where an Al film was vapor deposited directly on the substrate was prepared.

The surface forms of the Al films were examined by a SEM. In the sample with Bi deposition, crystal grain grew and the grain size become 1890±20 Å. On the contrary, in the sample without Bi deposition, the grain diameter of crystal grain was 980±20 Å.

The compositions of the Al films were analyzed by an AES. It was found that Bi existed in the Al film surface, the Al film grain boundary, and the interface between the Al film and thermal oxide film.

Besides Bi, in the cases of Ga, In, Cd, Sn, Pb and Tl, similar effects were obtained.

EXAMPLE 32

A six-inch silicon wafer with a 4000 Å insulative layer of a thermal oxide film was used as a substrate. Bi was vapor deposited in one mono layer on the substrate. The vapor deposition conditions were similar to Example 31. Keeping vacuum, a 500 Å thick Al film was vapor deposited on the substrates with the Bi film. A K-cell temperature was 1050° C. and a substrate temperature was 400° C. For comparison, a sample where an Al film was vapor deposited directly on the substrate was prepared.

The surface form of the Al film was examined by a SEM. In the sample with Bi deposition, crystal grain grew and the average grain size become 3130±20 Å. On the contrary, in the sample without Bi deposition, the grain diameter of crystal grain was 1230±15 Å.

Besides Bi, in the cases of Ga, In, Cd, Sn, Pb and Tl, similar effects were obtained.

EXAMPLE 33

A six-inch silicon wafer with a 4000 Å insulative layer of a thermal oxide film was used as a substrate. An Al—Ta amorphous thin film was formed by means of a multi-target sputter apparatus. The sputter conditions are shown below.

Sputter system: RF magnetron system

Target: 100 mmφ Al—Ta mosaic target

Substrate temperature: Room temperature (25° C.)

Sputter gas: Ar

Gas pressure: 0.20 Pa

Film thickness: 400 Å

Composition analysis revealed that the formed film was $Al_{55}Ta_{45}$. X-ray diffraction revealed that the film was amorphous.

Keeping vacuum, Bi was vapor deposited in one mono layer thereon. The vapor deposition conditions were similar to Example 31. Further, keeping vacuum, Al was deposited on the substrate with the Bi film to form a 500 Å thick Al film. A K cell temperature was 1050° C. and a substrate temperature was room temperature. For comparison, a sample where an Al film was vapor deposited directly on the substrate was prepared.

The Al film thus formed was examined by a SEM. In the sample with Bi deposition, crystal grain grew and the grain diameter become 2970±20 Å. On the contrary, in the sample without Bi deposition, the grain diameter of crystal grain was 960±10 Å.

EXAMPLE 34

A high resistance Si (100) and Si (111) substrate were treated with 1% HF and then washed with pure water in which the concentration of solved oxygen was 10 ppb. Subsequently, a Cu or Al film was deposited on the Si (100) substrate or Si (111) substrate respectively by a sputter apparatus in which the degree of vacuum was $1 \times 10^{-8}$ Torr or less. Ar pressure during deposition was $1 \times 10^{-3}$ Torr. Thereafter, the resultant substrates were thermal treated under vacuum at 450° C. for 1 hour to process into a four-terminal wiring 1 μm in width and 100 μm in length. The kinds of grain boundaries were identified by channelling pattern analysis of a SEM. It was found that 90% or more thereof consisted of small angle boundaries with a relative misorientation of 10° or less, twin boundaries with the Σ value of 10 or less and grain boundaries with a relative misorientation of 3° or less. Among these boundaries, only particular grain boundaries shown in Table 9 were subjected to the EM test at 200° C. and a current density of $2 \times 10^6$ A/cm². Further, after the Cu and Al films were processed into a pattern with a wiring width of 0.5 μm and an entire wiring length of 1 m, a 4000 Å thick PSG film was formed by a thermal CVD method and a 4500 Å thick SiN film was formed by a plasma CVD method. Thereafter, a stress-migration (SM) test was conducted by keeping the test samples at 150° C. for 1000 hours. The SM test exhibited the excellent result that the defective percent was 0%.

TABLE 9

| Wiring | Orientation direction | Σ value | Relative mis-orientation | Result of EM test | |
|---|---|---|---|---|---|
| Cu | (100) | 5 | 36.9° | ⊚ | |
| | | 13 | 22.6° | ○ | |
| Al | (111) | 3 | 60° | ⊚ | |
| | | | 64° | x | dislocation of 4° for coincidence boundary |
| | | | 63° | ○ | dislocation of 3° for coincidence boundary |
| | | 7 | 38.2° | ⊚ | |
| | | 13 | 27.8° | ○ | |
| | | 19 | 48.8° | x | |

⊚ lifetime 1000 hours or more
○ lifetime 500–1000 hours
x lifetime 500 hours or less

EXAMPLE 35

On a high resistance (111) silicon wafer, a (111) orientated Al film was formed in a thickness of 4000 Å by high vacuum sputtering. Before Al film deposition as shown in Table 10, the following six kinds of pretreatment silicon wafer were conducted;

1. after 1% HF treatment, rinsing with ultra pure water with the dissolved oxygen concentration of 5 ppb under an air-closed condition,
2. after 1% HF treatment, rinsing with ultra pure water with the dissolved oxygen concentration of 5 ppb under a condition of open to the air,
3. after 1% HF treatment, rinsing with ultra pure water with the dissolved oxygen concentration of 50 ppb under an air-closed condition,
4. after 1% HF treatment, rinsing with ultra pure water with the dissolved oxygen concentration of 50 ppb under a condition of open to the air,
5. after 1% HF treatment, rinsing with ultra pure water with dissolved oxygen concentration of 1 ppm under an air-closed condition, and
6. after 1% HF treatment, rinsing with ultra pure water with the dissolved oxygen concentration of 1 ppm under a condition of open to the air.

Thereafter, they were processed to form a 0.5 μm wide four-terminal pattern where the length of a measurement part was 100 μm. The electromigration endurance was measured at 200° C. and a current density of $2 \times 10^6$ A/cm². Moreover, the SM test was also conducted like Example 34.

The characteristics in contact parts were examined in the following manner. A contact with a diameter of 0.5 μm in which P was ion-plantated was used. As pretreatment, choline treatment, diluted HF treatment, and the above water-washing were successively conducted. An Al film was formed and then processed into a Kelvin pattern. After thermal treatment at 450° C. for 30 minutes in a forming gas ($N_2:H_2=8:2$), the contact resistance was measured.

Regarding the wiring processability, a shape after wiring processing was observed by a SEM. A thin piece was made from a wiring sample and the piece was subjected to selected-area diffraction by an electron microscope to examine the relative misorientation of adjacent grains. These results are shown in Table 10.

Further, for the Al film sample processed with pretreatment 1, Al film orientation was identified by a X-ray diffraction method, and the sample was processed such that the wiring line direction was in parallel with a {111} plane. The sample subjected to the above SM test was observed by a SEM. It was found that voids formed in a trapezoidal shape substantially in parallel with a wiring line direction. No failure was observed.

TABLE 10

| Kind of water rinse | | | % of relative misorientation 10° or less | Process-ability | EM failure time | SM defective (%) | Contact defective (%) |
|---|---|---|---|---|---|---|---|
| O2 | 5 ppb, | air closed | 100% | ○○○ | 1000 hrs. or more | 0% | 0% |
| | | open to air | 80% | ○○ | 200 hrs. | 1% | 0.1% |

TABLE 10-continued

| Kind of water rinse | | % of relative misorientation 10° or less | Process-ability | EM failure time | SM defective (%) | Contact defective (%) |
|---|---|---|---|---|---|---|
| O2 50 ppb, | air closed | 97% | ooo | 1000 hrs. or more | 0% | 0% |
| | open to air | 72% | oo | 160 hrs. | 2% | 0.6% |
| O2 1 ppm, | air closed | 90% | ooo | 1000 hrs. or more | 0.1% | 0% |
| | open to air | 10% | o | 10 hrs. | 5% | 3% |

EXAMPLE 36

A Cu film was deposited on a MgO (100) substrate in a thickness of 4000 Å by super high vacuum sputtering to form a Cu film. An electron microscope observation revealed that this Cu film was a {100} epitaxial film containing twin boundaries. This Cu film was processed into a four-terminal pattern 0.5 μm in width and 1 mm in length to form a metal wiring. The EM test was conducted. The test conditions were a wiring temperature of 300° C. and a current density of $2 \times 10^6$ A/cm². Although twin was observed in a wiring, there was no failure after a welding test of 1000 hours.

EXAMPLE 37

A (111) oriented Al film was formed in a thickness of 4000 Å on a high resistance (111) silicon wafer substrate by high vacuum sputtering. At this time, as a pretreatment, the substrate was treated with 1% HF, and washed with ultra pure water in which the dissolved oxygen concentration was 5 ppb under air-closed condition. Thereafter a 0.5 μm wide four-terminal pattern, where the length of a measurement part was 1000 μm, was prepared to form a metal wiring. After electrical current loading at 150° C. of five current densities shown in Table 11, thermal treatment was conducted in a forming gas ($N_2:H_2=8:2$) at 400° C. for 30 minutes. Then the resultant substrate was checked for occurrence of pits (Si spike) in the wiring. Moreover, a wiring pattern with L/S of 1 μm/1 μm was prepared and subjected to similar processes. Then, the Al (111) orientation FWHM was examined by X-ray. The results are also shown in Table 11.

TABLE 11

| Current density (A/cm2) | 0 | $1.0 \times 10^6$ | $5 \times 10^6$ | $1 \times 10^7$ | $2 \times 10^7$ | $3 \times 10^7$ |
|---|---|---|---|---|---|---|
| Amount of pits (after thermal treatment) | many | several | none | none | none | many (grown by current loading) |
| FWHM | 0.3° | 0.2° | 0.15° | 0.15° | 0.15° | 0.15° |

EXAMPLE 38

Figure 27:
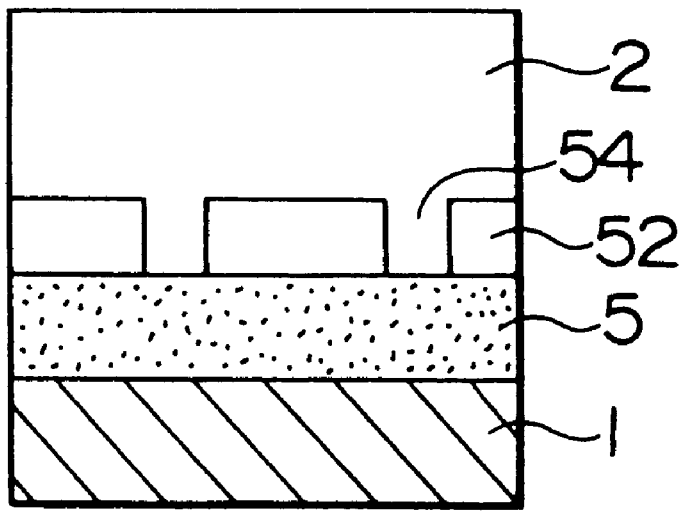
FIG. 27 is a sectional view according to Example 38.

Referring to FIG. 27, an embodiment will be described. A 1000 Å $SiO_2$ thick thermal oxide film was formed on a Si (100) substrate 1 as an insulative layer 5 and thereafter a 300 Å thick amorphous $Al_{30}Ta_{70}$ film 52 was formed by dual simultaneous sputtering. After forming the films, grooves 54 with L/S of 1500 Å/1500 Å and depth of 300 Å were formed by lithography. Moreover, after evacuating upto $1 \times 10^{-8}$ Torr or less the resultant substrate was exposed to plasma by bias cleaning where a bias voltage of −50 V was applied to the substrate for 5 minutes, thereby removing an oxide film on the Ta-Al film 52. Subsequently, an Al film was formed in a thickness of 4000 Å. For comparison, a sample was prepared by that a 4000 Å thick Al film was formed directly on $SiO_2$. The Al films of these samples were processed into a 0.5 μm wide four-terminal metal wiring pattern where the length of a measurement part was 1000 μm. After electrical current loading at 200° C. of a density of $1 \times 10^7$ A/cm² for a period of time as shown in Table 12, thermal treatment was conducted in a forming gas ($N_2:H_2=8:2$) at 400° C. for 30 minutes. Then the resultant samples were checked for occurrence of hillocks in the wiring. The results are shown in Table 12.

Each of these samples were processed into the wiring pattern with L/S of 1 m/1 μm. Similar processes were conducted. Then the Al (111) orientation FWHM was measured by X-ray. The results are also shown in Table 12.

TABLE 12

| | On $SiO_2$ | On surface processed Ta-Al | | |
|---|---|---|---|---|
| Current loading time | Failure during loading | 30 secs. | 1 min. | 10 mins. |
| Amount of hillocks | — | many | None | None |
| FWHM | 8° | 0.3° | 0.2° | 0.2° |

EXAMPLE 39

An 4000 Å thick Al film was formed on a high resistance (111) silicon wafer substrate by high vacuum sputtering and thermal CVD methods. At this time, as a pretreatment, the substrate was treated with 1% HF, rinsed with ultra pure water where the dissolved oxygen concentration was 5 ppb under air-closed condition, and then dried at $N_2$ atmosphere where the vapor concentration was 10 ppb or less. In the high vacuum sputter method, the vacuum degree was $1 \times 10^{-9}$ Torr, a dew point of Ar was −90° or less, and an Ar pressure was $1 \times 10^{-3}$ Torr at the time of forming. In the thermal CVD method, TIBA was used as a gas source. The formed Al film was observed by a TEM. As a result, the sputtered Al film contained small angle grain boundaries formed in dislocation arrays. X-ray diffraction revealed that the sputtered Al film was of single-crystal with the (111) orientation FWHM of 0.3°. On the other hand, the CVD film was of single-crystal containing no small angle grain boundaries, and had the (111) orientation FWHM of 0.17° by X-ray diffraction.

Figure 1A:
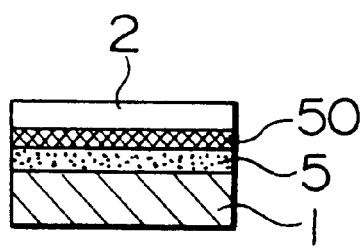
FIGS. 1(a) and (b) are sectional views for explaining functions of the invention.
Figure 1B:
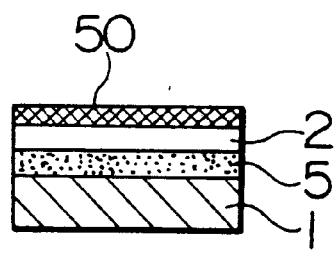
Figure 2:
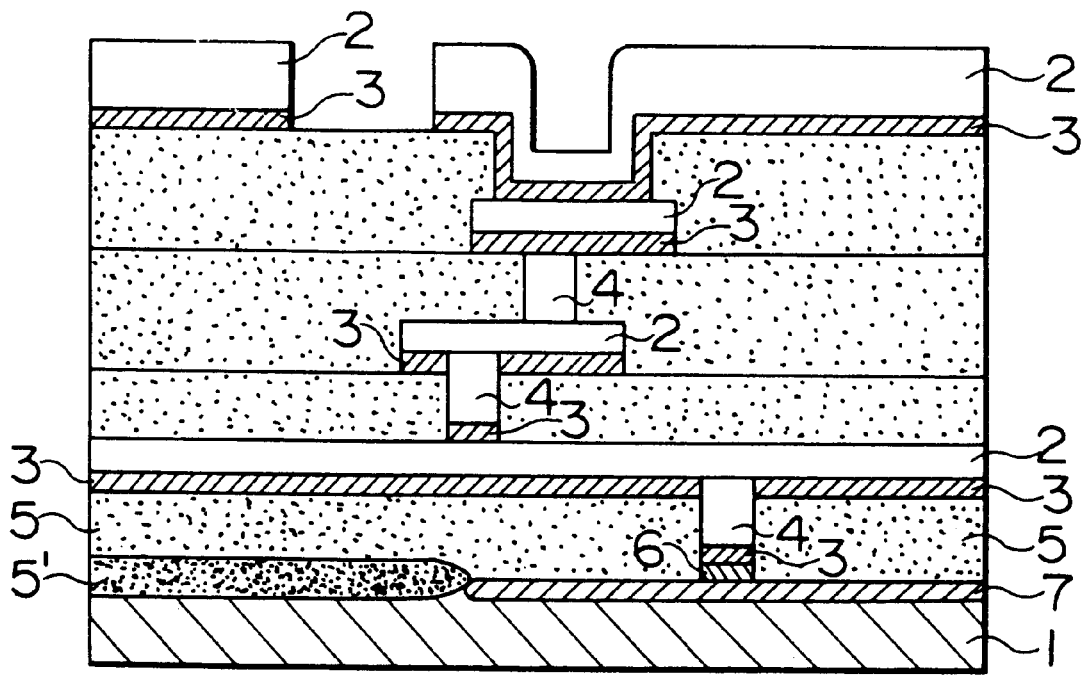
FIG. 2 is a sectional view showing a layer-structure of the invention.
Figure 3A:
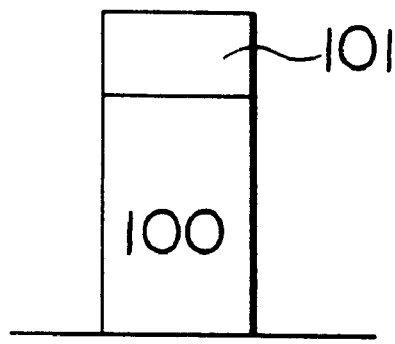
FIGS. 3(a) to (d) are sectional views showing metal wiring structure of the invention.
Figure 3B:
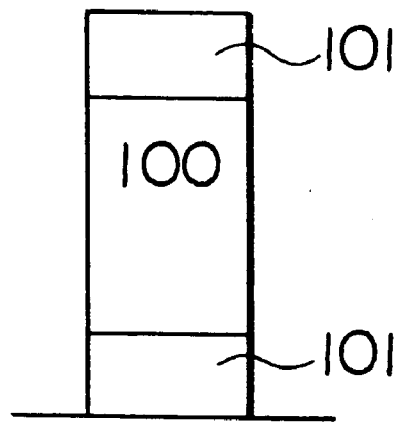
Figure 3C:
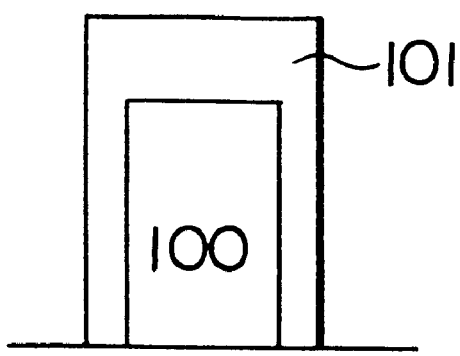
Figure 3D:
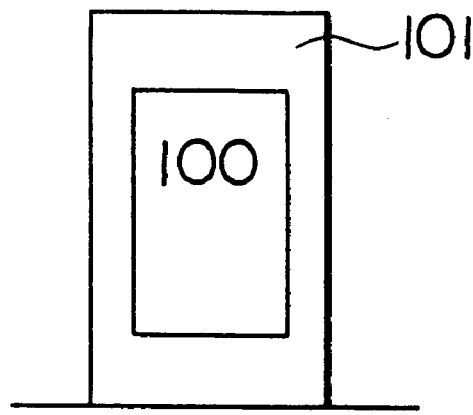
Figure 4:
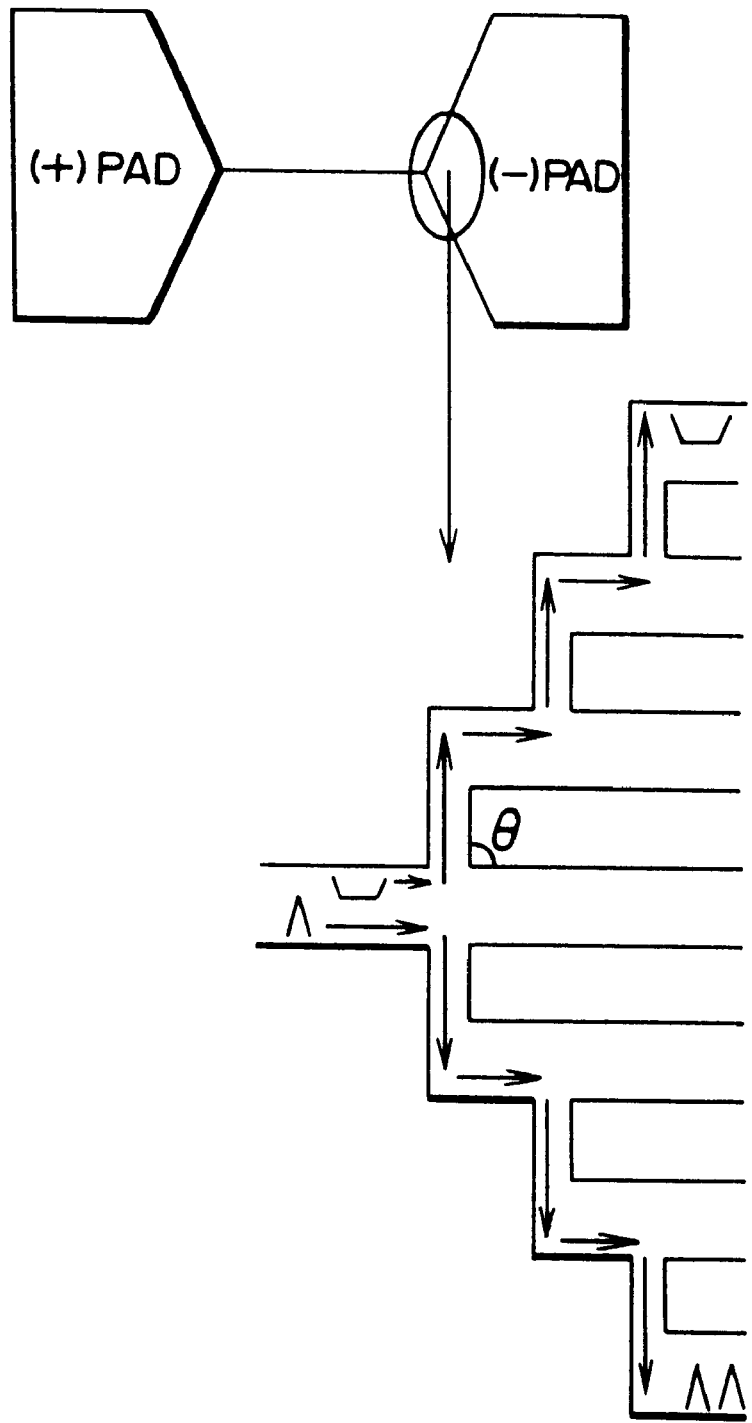
FIG. 4 is an enlarged view showing pads of the invention.

The above film was processed into a four-terminal pattern where the width of wiring part was 0.5 μm and the length thereof was 100 μm, thereby forming a metal wiring and pad part. The pad consisted of aggregation of fine lines in a shape of FIG. 4. The width of the fine line was 0.5 μm, the spacing between the fine lines was 0.5 μm, and the spacing between branch points was 0.5 μm. In such pattern, the electronmigration endurance was examined by a in situ SEM observation at a current density of $2\times10^7$ A/cm$^2$ at 200° C. As a result, in the both films, voids moved inside the wiring, passed branch points one after another in the pad part, and then reached a fine line in the outer most periphery of the pad part. Thus, fine lines in the center of pad part were sound. Neither of increase in electric resistance nor failure was observed.

Further, after the wiring processing, a 4000 Å thick SiO$_2$ film was formed on the wiring by a thermal CVD method and a 7500 Å thick SiN film was formed by a plasma CVD method. This was subjected to an identical electromigration test. Stress-migration (SM) induced voids were similarly accumulated in a fine line in the mostly outer periphery of the pad part. Neither of increase in electric resistance nor failure was observed in the centor of the pad part.

EXAMPLE 40

A Cu film was deposited in a thickness of 4000 Å on a MgO (100) substrate by super high vacuum sputtering. An electron microscope observation revealed, that this film was a {100} epitaxial film containing twin boundaries.

The above film was processed into a four-terminal pattern where the width of a wiring part was 1.0 μm and the length thereof was 100 μm, thereby forming a metal wiring and pad part. The pad part consisted of aggregation of fine lines in a shape of FIG. 4. The width of the fine line was 1.0 μm, the spacing between the fine lines was 1.0 μm, and the spacing between branch points was 1.0 μm. In such pattern, the electronmigration endurance was examined by a in situ SEM observation at a current density of $2\times10^7$ A/cm$^2$ at 250° C. As a result, voids moved inside the wiring, passed branch points one after another in the pad part, and then reached a fine line of outer most periphery of the pad part. Fine lines in the center of the pad part were sound. Neither of increase in electric resistance nor failure was observed inside the pad part.

EXAMPLE 41

A 1000 Å thick thermal oxide film was formed on a (100) Si substrate as an insulative layer, and a TiN film was then formed to be subjected to 600° C. thermal treatment in a N$_2$ atmosphere. Various bias voltages as shown in Table 13 were applied to the resultant substrate in plasma, Ar:N$_2$=1:1, of $1\times10^{-3}$ Torr. The TiN film was subjected to sputter-etching. Thereafter a 4000 Å thick Al film was deposited by sputtering. The Al film was processed into a four-terminal pattern 0.5 μm in width and 1 mm in length, thereby forming a metal wiring. The EM test was conducted. The test conditions were a wiring temperature of 200° C. and a current density of $2\times10^6$ A/cm$^2$. The results are shown in Table 13. For comparison, there were two type samples. One sample was prepared without sputter-etching of the TiN film. Another sample was prepared with exposure to N$_2$ plasma after sputter-etching. These results are shown in Table 13.

TABLE 13

|  | Etching bias voltage | EM endurance |
|---|---|---|
| Plasma etching | −50 V | ⊚ |
|  | −100 V | o |
|  | −120 V | x |

TABLE 13-continued

|  | Etching bias voltage | EM endurance |
|---|---|---|
| plasma etching + N2 plasma processing | −50 V | ⊚ |
| Without etching | — | x |

⊚: no failure up to 500 hours
o: failed between 300 and 500 hours
x: faulure after 300 hours or less

EXAMPLE 42

After a 1000 Å SiO$_2$ thermal oxide film was formed on a Si (100) six-inch substrate as an insulative layer, amorphous thin films of compositions as shown in Table 14 were formed by sputtering with the use of a mosaic target or by simultaneous sputtering with the use of a multi target. Subsequently, a 4000 Å thick Cu film was formed. Since the various amorphous thin films destined for an underlying layer were exposed to the air, the surface of the amorphous thin films was cleaned by sputter-etching prior to forming the Cu film for the purpose of removing an oxide film on the surface. The conditions of this surface cleaning were an Ar gas pressure of $1.0\times10^3$ Torr, a 100 MHz RF power output of 100 W, a substrate bias voltage of −50 V and cleaning time of 4 minutes.

The crystalline properties of the underlying layer was confirmed by RHEED. It was confirmed that the underlying layer was an amorphous thin film.

After the surface cleaning, the Cu film was formed under the following conditions:

degree of vacuum: less than $1\times10^{-8}$ Torr

Ar gas pressure: $1.0\times10^{-3}$ Torr

100 MHZ RF power output: 400 W cathode bias voltage: −300 V film forming speed: 40 Å/second.

The crystalline properties of the formed Cu film were evaluated by X-ray. For evaluation of the EM endurance, this was processed into a four-terminal pattern with a wiring width of 1 μm and wiring length of 300 μm, thereby forming a metal wiring. The electromigration test was then conducted at a current density of $2\times10^6$ A/cm$^2$ at a wiring temperature of 300° C. These results are also shown in Table 14.

As a comparative example, a Cu film was formed directly on a SiO$_2$ thermal oxide film. The comparative example was similarly evaluated. The results are also shown in Table 14.

If an underlying layer may have composition slightly different from those of Table 14 as far as the underlying material was amorphous, similar results can be obtained. Further, a little amount of an additive may be added to improve the corrosion resistance, processability and barrier property.

If after forming an amorphous thin film, a Cu film was subsequently formed while keeping vacuum of $1\times10^{-8}$ Torr or less, surface cleaning is not necessary.

TABLE 14

| Underlying material composition (at %) | RHEED | Cu (111) orienta- tion FWHM | Intensity ratio of Cu X-ray I (200)/I(111) | EM endurance |
|---|---|---|---|---|
| Cu$_{75}$Zr$_{25}$ | a | 1.5 | — | ⊚ |
| Cu$_{50}$Zr$_{50}$ | a | 1.5 | — | ⊚ |
| Cu$_{60}$Zr$_{40}$ | a | 1.8 | — | ⊚ |

TABLE 14-continued

| Underlying material composition (at %) | RHEED | Cu (111) orientation FWHM | Intensity ratio of Cu X-ray I (200)/I(111) | EM endurance |
|---|---|---|---|---|
| $Cu_{30}Zr_{70}$ | a | 1.7 | — | ⊚ |
| $Ni_{35}Ta_{65}$ | a | 1.7 | — | ⊚ |
| $W_{70}Zr_{30}$ | a | 1.2 | — | ⊚ |
| $Ta_{50}Zr_{50}$ | a | 1.4 | — | ⊚ |
| $Mo_{70}Zr_{30}$ | a | 1.3 | — | ⊚ |
| $SiO_2$ | a | 10.1 | 0.039 | x | a: amorphous
⊚: even after the elapsed time of 1000 hours, no failure takes place
x: within 100 hours, a failure takes place

EXAMPLE 43

Figure 28:
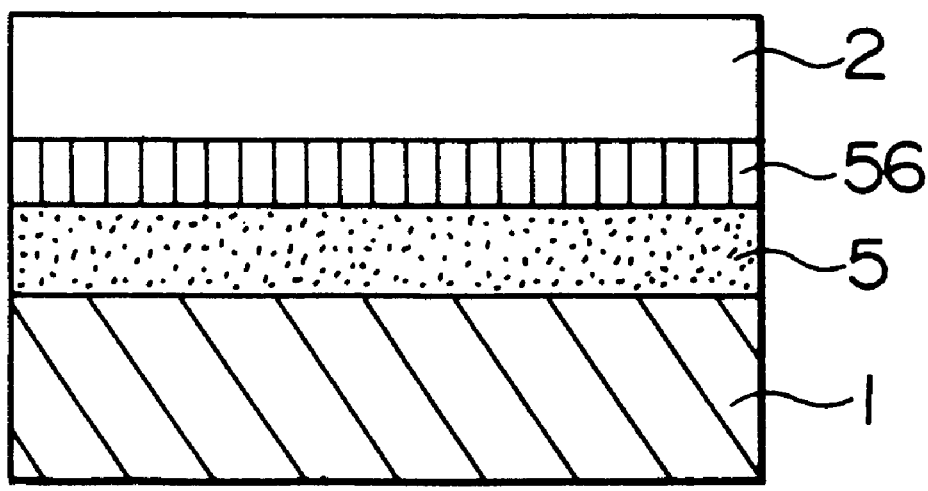
FIG. 28 is a sectional view according to Example 43 and Example 44.

Referring to FIG. 28, an embodiment will be described.

100 Å thick alloy thin films 56 of TiNb, TiTa, ZrNb, ZrTa, TiW, ZrMo, TiY and ZrY were formed on Si substrates 1 with a 1000 Å thick insulative layer 5 of a thermal oxide film by multi-target sputtering system using an Ar gas. An electric power applied to each target was adjusted such that the compositions of the alloy thin films 56 were $Ti_{50}Nb_{50}$, $Ti_{50}Ta_{50}$, $Zr_{50}Nb_{50}$, $Zr_{50}Ta_{50}$, $Ti_{50}W_{50}$, $Zr_{50}Mo_{50}$, $Ti_{50}Y_{50}$, and $Zr_{50}Y_{50}$. Subsequently, keeping vacuum, the gas was replaced with a $N_2$ gas and the surface of the alloy thin film 56 was exposed to $N_2$ plasma by RF discharge where a substrate 1 was an electrode. Then the crystalline properties of the metal thin film 56 was evaluated by RHEED. It was found that an amorphous layer was formed at least on the surface. Auger electron spectroscopy (AES) analysis revealed that the amorphous layer contained the nitrogen. Thus it was supposed that the amorphous layer consisted of amorphous nitride. For comparison, a sample which was not $N_2$ plasma processed was prepared. These alloy thin films thus formed were exposed to the air, and thereafter a 4000 Å thick metal film 2 of a pure Al or pure Cu thin films was deposited on the alloy thin films 56. Prior to forming the metal film 2, some thereof were subjected to etching of the alloy thin film 56 surface of an underlying layer by Ar plasma. Next, the crystalline properties of the obtained pure Al or pure Cu thin film were evaluated with the FWHM of Al and Cu (111) rocking curve by X-ray diffraction using a CuKα line. The results are shown in Table 15. As a result, even if the alloy thin films 56 subjected to $N_2$ plasma process were exposed to the air, an Al or Cu thin film 2 with the high (111) crystalline orientation could be formed on the alloy thin films 56 without Ar plasma etching of the surface,

TABLE 15

| Alloy thin film | N2 plasma process | Ar surface etching | (111) orientation FWHM Al | (111) orientation FWHM Cu |
|---|---|---|---|---|
| TiNb | o | o | 0.8 | 1.53 |
|  | o | x | 0.85 | 1.57 |
|  | x | o | 0.75 | 1.46 |
|  | x | x | 6.3 | 8.2 |
| TiTa | o | o | 0.8 | 1.55 |
|  | o | x | 0.75 | 1.53 |
|  | x | o | 0.75 | 1.48 |
|  | x | x | 5.9 | 7.5 |
| ZrNb | o | o | 0.56 | 1.32 |
|  | o | x | 0.61 | 1.33 |
|  | x | o | 0.52 | 1.27 |
|  | x | x | 6.7 | 8.4 |

TABLE 15-continued

| Alloy thin film | N2 plasma process | Ar surface etching | (111) orientation FWHM Al | (111) orientation FWHM Cu |
|---|---|---|---|---|
| ZrTa | o | o | 0.66 | 1.44 |
|  | o | x | 0.68 | 1.53 |
|  | x | o | 0.72 | 1.37 |
|  | x | x | 6.82 | 8.1 |
| TiW | o | o | 0.72 | 1.54 |
|  | o | x | 0.75 | 1.43 |
|  | x | o | 0.93 | 1.72 |
|  | x | x | 6.91 | 9.65 |
| ZrMo | o | o | 0.81 | 1.73 |
|  | o | x | 0.79 | 1.67 |
|  | x | o | 0.89 | 1.88 |
|  | x | x | 5.69 | 8.71 |
| TiY | o | o | 0.77 | 1.42 |
|  | o | x | 0.75 | 1.39 |
|  | x | o | 0.81 | 1.45 |
|  | x | x | 4.29 | 7.21 |
| ZrY | o | o | 0.63 | 1.12 |
|  | o | x | 0.70 | 1.08 |
|  | x | o | 0.71 | 1.05 |
|  | x | x | 4.60 | 6.81 | o: conducted
x: non-conducted

EXAMPLE 44

100 Å thick thin films of carbide alloys as shown in Table 16 were formed on a Si substrate 1 with a 1000 Å thick insulative layer of a thermal oxide film by multi-target sputtering system using metal targets and a carbon target. An electric power applied to each target was adjusted such that the compositions of the carbide alloy thin films become those as shown in Table 16. Then the crystalline properties of the thin film surface was evaluated by RHEED to obtain halo pattern suggesting that this was amorphous. The carbide alloy thin film thus obtained were exposed to the air, and thereafter a 4000 Å thick metal wiring of a pure Al or pure Cu thin films was formed on these carbide alloy thin films. Prior to forming the metal films, some thereof were subjected to etching of the carbide alloy thin film furface of an underlying layer by Ar plasma. The crystalline properties of the pure Al or pure Cu thin film were evaluated with the FWHM of Al and Cu (111) rocking curve by X-ray diffraction using a CuKα line. The results are shown in Table 16. As a result, even if the carbide alloy thin films were exposed to the air and the surface thereof was not previously subjected to Ar plasma etching, the Al or Cu thin film with the high (111) crystalline orientation could be formed on the carbide alloy thin films.

TABLE 16

| Carbide alloy thin film | Ar surface etching | (111) orientation FWHM Al | (111) orientation FWHM Cu |
|---|---|---|---|
| TiNbC2 | o | 0.9 | 1.45 |
|  | x | 0.92 | 1.62 |
| TiTaC2 | o | 0.58 | 1.23 |
|  | x | 0.55 | 1.21 |
| ZrNbC2 | o | 0.54 | 1.22 |
|  | x | 0.63 | 1.33 |
| ZrTaC2 | o | 0.78 | 1.41 |
|  | x | 0.82 | 1.55 |
| TiWC2 | o | 0.73 | 1.43 |
|  | x | 0.74 | 1.35 |

TABLE 16-continued

| Carbide alloy thin film | Ar surface etching | (111) orientation FWHM | |
|---|---|---|---|
| | | Al | Cu |
| ZrMoC2 | o | 0.82 | 1.73 |
| | x | 0.77 | 1.67 | o: conducted
x: non-conducted

EXAMPLE 45

A six-inch silicon wafer with a 1000 Å thermal oxide film was used as a substrate and Bi was vapor deposited on the substrate. The vapor deposition conditions were similar to those of Example 31. Keeping vacuum, Al was vapor deposited in a thickness of 200 Å to 1000 Å on the substrate deposited with Bi. A K-cell temperature was 1200° C. and a substrate temperature was room temperature. After the film formation, the substrate temperature was raised to 400° C. and subjected to thermal treatment for 3 hours.

The surface morphology and grain size of the Al film was examined by a SEM and TEM. As a result, a grain size of an Al film with Bi was 7810±30 Å, while a grain size of an Al film without Bi was 1680±20 Å. Namely, it was confirmed that a grain size of an Al film with Bi was larger than that of an Al film without Bi.

In the case of Ga, In, Cd, Sn, Pb or Tl, similar results were obtained.

EXAMPLE 46

A six-inch silicon wafer with a 1000 Å thermal oxide film was used as a substrate. Al was deposited on the substrate in thicknesses of 200 Å to 1000 Å, and 1 ML of Bi was deposited simultaneously at beginning of the Al deposition while rotating the substrate. The Bi deposition conditions were similar to those of Example 31. The Al deposition conditions were that a K-cell temperature was 1200° C. and a substrate temperature was room temperature.

Figure 29A:
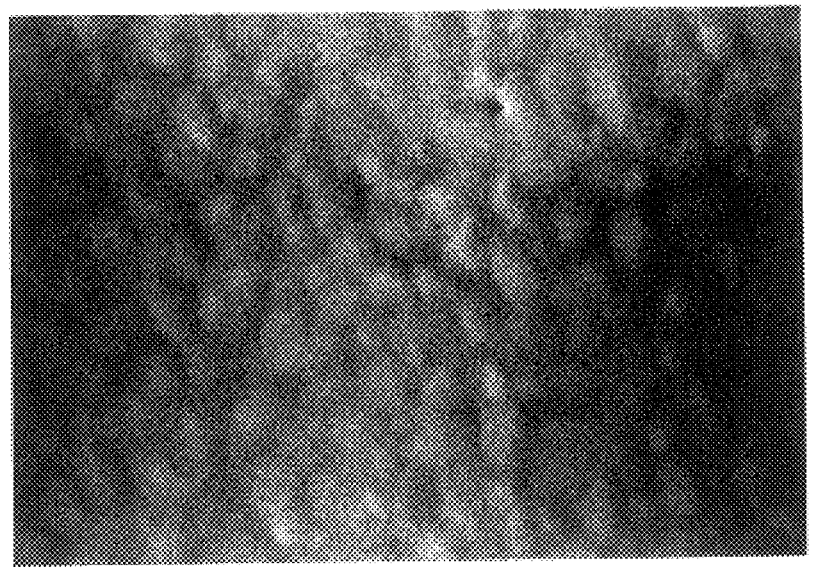
FIGS. 29(a) and (b) are SEM photographs according to Example 46.
Figure 29B:
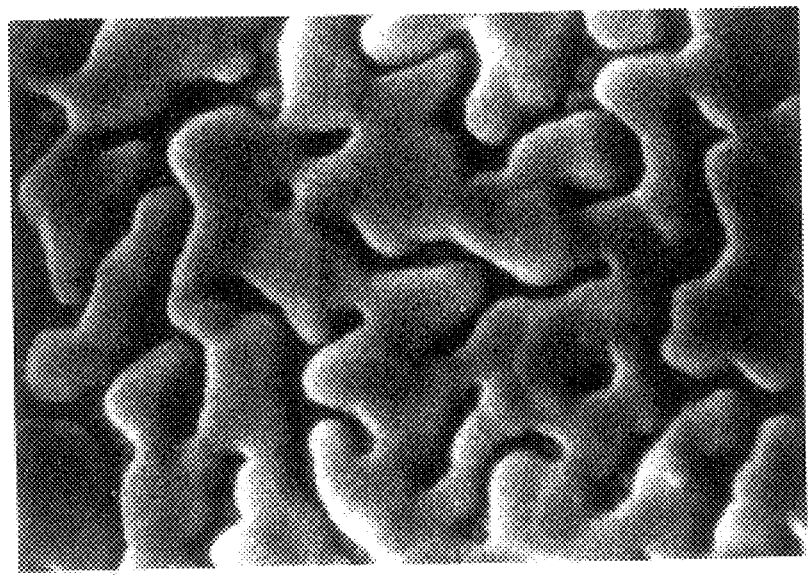

The surface morphology and grain size of the Al film was examined by a SEM and TEM. As a result, a grain size of an Al film with Bi was 4370±20 Å, while a grain size of an Al film without Bi was 1170±15 Å. Namely, it was confirmed that a grain size of an Al film with Bi was larger than that of an Al film without Bi. SEM photographs of these samples are shown in FIGS. 29(a) and (b). FIG. 29(a) shows a SEM photograph of the surface of the sample where a 500 Å Al film was formed on $SiO_2$. FIG. 29(b) shows a SEM photograph of the surface of the sample where a 500 Å Al film with 1 ML Bi formed on $SiO_2$.

Even if Bi was deposited at the middle time of the Al deposition or before the end thereof, the similar effects could be obtained.

In the case of Ga, In, Cd, Sn, Pb or Tl, similar results were obtained.

EXAMPLE 47

A six-inch silicon wafer with a 1000 Å thermal oxide film was used as a substrate. A film of Al crystal grains with (111) orientation against the substrate was formed on the substrate by a thermal CVD apparatus. The film forming conditions are shown below.

Source gas: Triisobuthyl aluminum
Method for supplying the source gas: Bubbling system by Ar
Substrate temperature: 400° C.
Ar gas flow amount: 20 sccm The density of Al crystal grains forming the film under these conditions was $5 \times 10^7$ to $1 \times 10^8/cm^2$.

Bi was vapor deposited on the substrate under conditions similar to those of Example 31. Keeping vacuum, Al was vapor deposited in a thickness of 200 Å to 1000 Å on the substrate deposited with Bi. A K-cell temperature was 1200° C. and a substrate temperature was room temperature.

The surface morphology of the Al film was observed by a SEM and TEM. As a result, a grain size of an Al film with Bi was 3610±15 Å, while a grain size of an Al film without Bi was 1140±20 Å. Namely, it was confirmed that a grain size of an Al film with Bi was larger than that of an Al film without Bi.

Moreover, the Al film thus formed was evaluated for the orientation by X-ray diffraction. The (111) orientation FWHM was 1.0°. On the other hand, the (111) FWHM of the Al film without pre-deposition of the Al small crystal grains by CVD method was 2.0°. Therefore, the existence of (111) oriented Al small grains improves the final continuous Al film (111) orientation.

In the case of Ga, In, Cd, Sn, Pb or Tl, similar results were obtained.

EXAMPLE 48

Figure 30A:
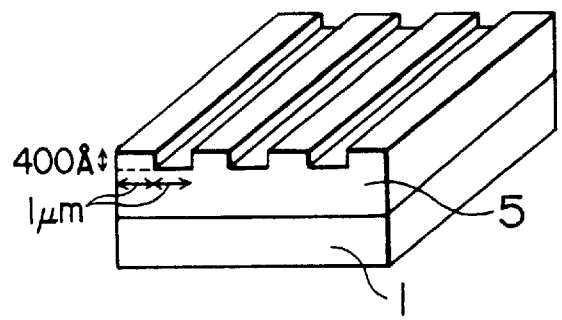
FIGS. 30(a) to (d) are views according to Example 48.
Figure 30B:
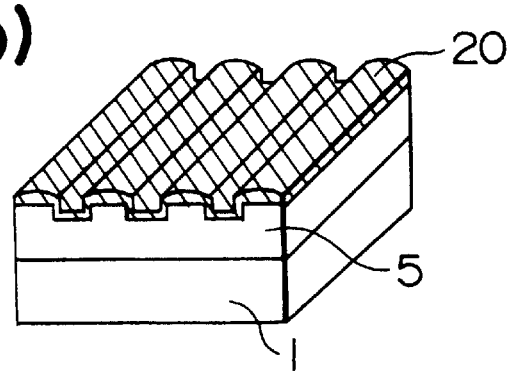

Grooves as shown in FIG. 30(a) were formed on a six-inch silicon wafer with a 4000 Å thermal oxide film. Al was vapor deposited on the substrate in a thickness of 200 Å. For Al deposition, a K-cell temperature was 1200° C. and a substrate temperature was room temperature. The Al morphology was observed by a SEM. As shown in FIG. 30(b), it was found that Al 20 was uniformly deposited on both the grooves and $SiO_2$ surface other than the grooves.

Further, Al was vapor deposited to form a 200 Å thick Al film on a similar substrate with grooves under the above conditions. A substrate temperature was room temperature. Subsequently, keeping vacuum, thermal treatment at 400° C. for 3 hours was conducted. As shown in FIG. (c), it was found that the grooves of the substrate were substantially completely filled with a metal wiring 2 made of Al, and Al 20 hardly remained on the $SiO_2$ surface other than the grooves.

Figure 30C:
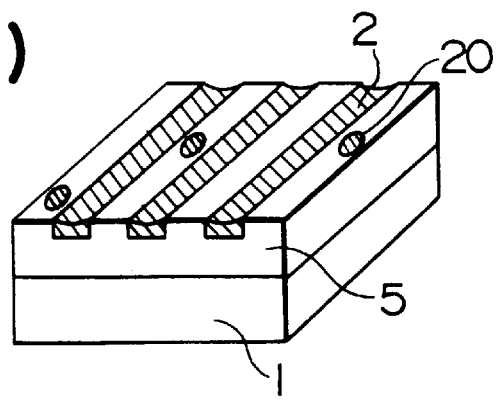
Figure 30D:
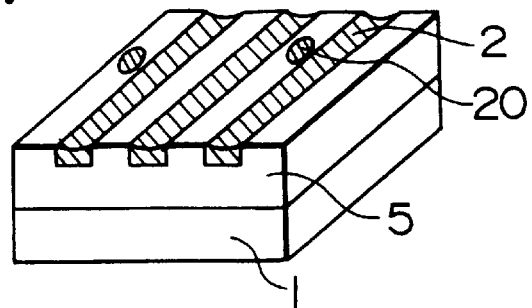

Next, Al was deposited on a similar substrate with grooves in thicknesses of 200 Å and 1 ML of Bi was simultaneously deposited at beginning of the Al deposition. The Bi vapor deposition conditions were similar to those of Example 31. The Al deposition conditions were the same as those mentioned above. A substrate temperature was room temperature. As shown in FIG. 30(d), it was found that the grooves of the substrate were substantially completely filled with a metal wiring 2 made of Al, and Al 20 hardly remained on the $SiO_2$ surface other than the grooves. Namely, although the observation was conducted immediately after the film formation at room temperature, the existence of Bi permitted to obtain similar effects of the thermal treatment.

In the case of Ga, In, Cd, Sn, Pb or Tl, similar results were obtained.

EXAMPLE 49

A six-inch silicon wafer with a 4000 Å thermal oxide film was used as a substrate. An AlTa film was formed by means of a multi-target sputter apparatus as shown in FIG. 5. The sputter conditions are shown below.

Sputter system: RF magnetron system

Target: 100 mm$\phi$ Al/Ta binary targets

Substrate temperature: Room temperature (25° C.)

Sputter gas: Ar

Gas pressure: 0.20 Pa

Applied power: 10 W/cm$^2$

Film thickness: 50 Å

Composition analysis revealed that the formed film was $Al_{25}Ta_{75}$. X-ray diffraction revealed that the film was amorphous.

Next, Al was sputtered on the amorphous AlTa thin film as a conductive thin film. The sputter conditions are shown below.

Sputter system: RF magnetron system

Target: 100 mm$\phi$ Al target

Substrate temperature: Room temperature (25° C.)

Sputter gas: Ar

Gas pressure: 1 Pa

Applied power: 5 W/cm$^2$

Film thickness: 4000 Å

The Al film thus formed was evaluated for the orientation by X-ray diffraction. It was found that the Al film was a (111) orientated film where the FWHM of an Al (111) peak rocking curve was 1.0°. When this thin film was subjected to thermal treatment at 300° C. for 15 minutes, the FWHM was improved to be 0.8°. Further when this thin film was subjected to thermal treatment at 500° C. for 15 minutes, the amorphous underlying layer reacted with the conductive thin film to form $Al_3Ta$ phase and the amorphous thin film layer disappeared. However, it was found that the specific resistance was unchanged and orientation of the conductive thin film were further improved to be 0.6°, and the highly orientated film was formed on the thermal oxide film.

Next, this conductive thin film was processed into a wiring for the EM test. Steps for preparing a test sample were as follows: As shown in FIG. 15, a test substrate 24 had an anode 21, a cathode 22 and a 0.8 $\mu$m wide wiring part 23 connecting these electrode. The test substrate 24 was made by standard lithography and RIE steps. An electrical current of $2 \times 10^6$ A/cm$^2$ was loaded to the wiring part 23 of the test substrate 24 at a test temperature of 200° C. It was confirmed that even after the elapsed time of 1000 hours there was no failure. This exhibits that since (111) orientation of the Al thin film which was the conductive thin film was improved, the electromigration endurance was dramatically enhanced.

EXAMPLE 50

A six-inch silicon wafer with a 4000 Å thermal oxide film was used as a substrate. An AlNb film was formed by means of a multi-target sputter apparatus similar to Example 48. The sputter conditions are shown below.

Sputter system: RF magnetron system

Target: 100 mm$\phi$ Al/Nb binary targets

Substrate temperature: Room temperature (25° C.)

Sputter gas: Ar

Gas pressure: 0.20 Pa

Applied power: 10 W/cm$^2$

Film thickness: 500 Å

Composition analysis revealed that the formed film was $Al_{75}Nb_{25}$. X-ray diffraction revealed that the film was amorphous. Al was sputtered on the amorphous $Al_{75}Nb_{25}$ thin film as a conductive thin film in similar manner to Example 49. The Al film thus formed was evaluated for the orientation by X-ray diffraction. It was found that the Al film was a (111) orientated film where the FWHM of a rocking curve was 1.5°. Further, this thin film was subjected to thermal treatment at 400° C. for 15 minutes. As a result, the amorphous thin film layer was crystallized and the amorphous thin film layer disappeared. At the same time the FWHM was improved to be 0.9°. The EM test was conducted under the same conditions as those of Example 49. Even after the elapsed time of 1000 hours there was no failure.

EXAMPLE 51

A six-inch silicon wafer with a 4000 Å thermal oxide film was used as a substrate. A CuTi film was formed by means of a multi-target sputter apparatus similar to Example 49. The sputter conditions are shown below.

Sputter system: RF magnetron system

Target: 100 mm$\phi$ Cu/Ti binary targets

Substrate temperature: Room temperature (25° C.)

Sputter gas: Ar

Gas pressure: 0.20 Pa

Applied power: 10 W/cm$^2$

Film thickness: 500 Å

Composition analysis revealed that the formed film was $Cu_{50}Ti_{50}$. X-ray diffraction revealed that the film was amorphous. This amorphous CuTi thin film was exposed to the air and thereafter cleaned by Ar plasma. An Al-0.1 at % Cu alloy was sputtered as a conductive thin film. The sputter conditions are shown below.

Sputter system: RF magnetron system

Target: 100 mm$\phi$ AlCu alloy target (Cu 0.1 at m %)

Substrate temperature: Room temperature (25° C.)

Sputter gas: Ar

Gas pressure: 1 Pa

Applied power: 5 W/cm$^2$

Film thickness: 4000 Å

The AlCu film thus formed was evaluated for the orientation by X-ray diffraction. It was found that the AlCu film was a (111) orientated film where the FWHM of a rocking curve was 0.9°. Further, this thin film was subjected to thermal treatment at 400° C. for 15 minutes. As a result, the amorphous thin film layer was crystallized and the amorphous thin film layer disappeared. At the same time, the (111) orientation of the AlCu film was further improved and the FWHM become 0.6°.

EXAMPLE 52

A TiN/Ti layer was formed on a six-inch silicon wafer as a diffusion prevention layer. An AlTa film was formed thereon by sputtering. The sputter conditions are shown below.

Sputter system: RF magnetron system

Target: 100 mm$\phi$ Al/Ta binary targets

Substrate temperature: Room temperature (25° C.)

Sputter gas: Ar

Gas pressure: 0.20 Pa

Applied power: 10 W/cm$^2$

Film thickness: 100 Å

Composition analysis revealed that the formed film was $Al_{40}Ta_{60}$. X-ray diffraction revealed that the film was amorphous. Al was sputtered on the amorphous AlTa film as a conductive thin film under the same conditions as those of Example 49. The Al film thus formed was evaluated for the orientation by X-ray diffraction. It was found that the Al film was a (111) orientated film where the FWHM of a rocking curve was 1.3°. Further, this thin film was subjected to thermal treatment at 500° C. for 15 minutes. As a result, the amorphous thin film layer reacted with the conductive thin film to form $Al_3Ta$ phase and the amorphous thin film layer disappeared. However, the specific resistance was not increased and orientation of the conductive thin film were improved and the FWHM become 0.8°. This exhibited that the TiN/Ti layer suppressed reaction with silicon. The EM test was conducted under the same conditions as those of Example 49. Even after the elapsed time of 1000 hours there was no failure.

EXAMPLE 53

A six-inch silicon wafer with a 4000 Å thermal oxide film was used as a substrate. A 100 Å thick amorphous $V_xAl_{100-x}$, $Nb_xAl_{100-x}$, $Ta_xAl_{100-x}$, $Mo_xAl_{100-x}$, or $W_xAl_{100-x}$ layer was formed on the substrate by means of a multi-sputter apparatus of Example 49 while controlling electric power to be applied to a target of Al, and V, Nb, Ta, Mo or W. Compositions of these amorphous layers are shown in Table 17. It was confirmed by X-ray diffraction that each layer was amorphous. As shown in Table 17, if the atomic concentration of V, Nb, Ta, Mo or W was extremely high or low in the amorphous layer, an inherent halo peak of amorphous state was not observed. These samples were placed in the sputter apparatus again, and then cleaned by Ar plasma. Thereafter a pure Al film was deposited in a thickness of 4000 Å. The (111) orientation FWHM of the deposited Al thin film was evaluated by X-ray diffraction. The results are also shown in Table 17. An ability of the amorphous layer to control (111) orientation was confirmed. Subsequently, these thin films were processed by standard PEP and RIE steps into a pattern with a 0.8 μm wide wiring as shown in FIG. 15 for the electromigration (EM) accelerated test. The EM accelating test was conducted under conditions, a test temperature of 200° C., a current density of $2 \times 10^6$ A/cm². When the electric resistance of the wiring increased by 10% of the resistance just after the test started, it was judged that this increase was a wiring failure. As apparent from Table 17, in the Al wirings of the invention which were formed on the amorphous underlying films, no failure was observed even after the elapsed time of 1000 hours. This shows that the Al wirings of the invention had the high electromigration endurance. As a comparative example, Al was formed directly on the thermal oxide film without deposition of an amorphous under film, and processed into the same pattern for the EM accelating test. Under the same test conditions, in these comparative examples, failures were observed within 10 hours.

TABLE 17

| $V_xAl_{100-x}$ | | | | | | | | | |
|---|---|---|---|---|---|---|---|---|---|
| Underlying film composition, X | 10 | 20 | 30 | 40 | 50 | 60 | 70 | | |
| Existence of halo peak | x | ○ | ○ | ○ | ○ | ○ | x | | |
| Al (111) FWHM | 6.6° | 2.6° | 2.0° | 1.5° | 1.3° | 1.5° | 7.0° | | |
| EM endurance | x | Δ | Δ | ○ | ○ | ○ | x | | |
| $Nb_xAl_{100-x}$ | | | | | | | | | |
| Underlying film composition, X | 10 | 20 | 30 | 40 | 50 | 70 | 80 | 85 | 90 |
| Existence of halo peak | x | ○ | ○ | ○ | ○ | ○ | ○ | ○ | x |
| Al (111) FWHM | 6.4° | 2.6° | 1.5° | 1.2° | 1.1° | 1.0° | 1.6° | 2.0° | 6.5° |
| EM endurance | x | Δ | ○ | ○ | ○ | ○ | ○ | Δ | x |
| $Ta_xAl_{100-x}$ | | | | | | | | | |
| Underlying film composition, X | 10 | 20 | 30 | 50 | 70 | 80 | 85 | 90 | |
| Existence of halo peak | x | ○ | ○ | ○ | ○ | ○ | ○ | x | |
| Al (111) FWHM | 6.3° | 2.5° | 1.8° | 1.5° | 1.1° | 1.0° | 1.5° | 6.2° | |
| EM endurance | x | Δ | ○ | ○ | ○ | ○ | ○ | x | |
| $Mo_xAl_{100-x}$ | | | | | | | | | |
| Underlying film composition, X | 20 | 25 | 30 | 45 | 60 | 70 | 80 | 90 | |
| Existence of halo peak | x | ○ | ○ | ○ | ○ | ○ | ○ | x | |
| Al (111) FWHM | 7.0° | 2.7° | 2.0° | 1.7° | 1.5° | 1.3° | 2.8° | 10.0° | |
| EM endurance | x | Δ | Δ | ○ | ○ | ○ | Δ | x | |
| $W_xAl_{100-x}$ | | | | | | | | | |
| Underlying film composition, X | 10 | 15 | 20 | 30 | 40 | 50 | 60 | | |
| Existence of halo peak | x | ○ | ○ | ○ | ○ | ○ | x | | |
| Al (111) FWHM | 6.5° | 2.8° | 1.9° | 1.8° | 1.5° | 1.1° | 8.0° | | |
| EM endurance | x | Δ | ○ | ○ | ○ | ○ | x | | |

FWHM : Full Width at Half Maximum
EM endurance:
(Test temperature, 200° C.; Current density, $2 \times 10^6$ A/cm²)
Endurance of 1000 hours or more; ○
Endurance of 500 hours or more, but not more than 1000 hours; Δ
Endurance of 500 or less; x
Composition in at % unit.

EXAMPLE 54

A 1000Å thick thermal oxide film was formed on a Si (100) six-inch substrate. Films of various alloy compositions as shown in Table 18(a) to (n) were formed in a thickness of 1000 Å by using a mosaic target or multi-simultaneous sputtering. Keeping vacuum, a Cu film was continuously formed in a thickness of 4000 Å and then subjected to thermal treatment at 450° C. for 30 minutes. A rocking curve of Cu (111) Cu was measured by X-ray diffraction to examine the crystal orientation of the Cu film thus formed. The FWHMs were shown in Table 18(a) to (n).

For examining the crystalline properties of underlying films, samples fabricated only with the underlying materials were evaluated by X-ray diffraction. It was confirmed whether or not a halo peak caused by amorphous state existed.

Conditions for the Cu film formation were shown below.

Degree of vacuum: Less than $1 \times 10^{-7}$ Torr

Ar gas pressure: $1.0 \times 10^{-3}$ Torr

100 MHz rf output power: 400 W

Cathode bias voltage: −300 V

Film deposition rate: 40 Å/second

The composition of an underlying film which was formed by using a target of the poor purity was 3N in the worst case. An element of the same group (for example, Ta against Nb) was mainly contained as impurities, and it was difficult that the element was isolated at the time of purification. However, this adversely effects neither amorphous formability of the underlying film nor the crystal orientation of Cu thereon.

Figure 31:
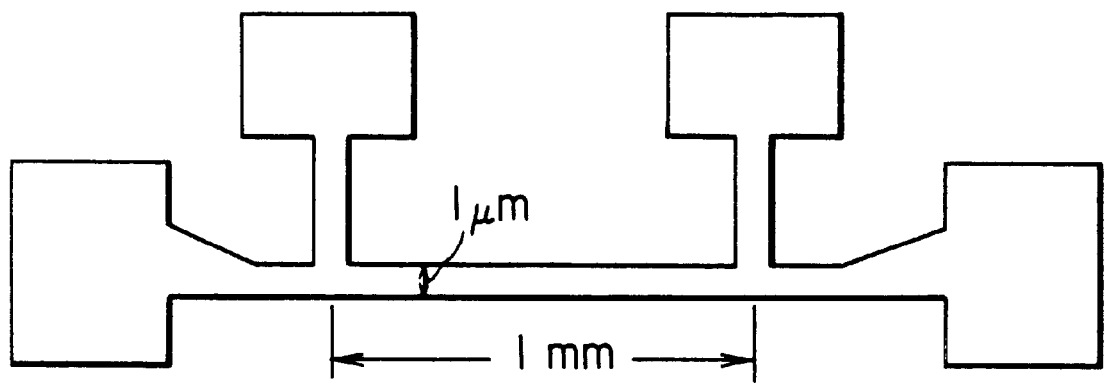
FIG. 31 is a view showing a four-terminal pattern according to Example 54.

For examining the reliability of the Cu wiring, a 3 μm thick $SiO_2$ film was formed on the Si substrate, and then the groove of a four-terminal electric resistance measurement pattern was provided on the $SiO_2$ film as shown in FIG. 31 by PEP and RIE steps. A resistance measurement part had groove 1.0 μm wide, 4500 Å deep and 1 mm long.

After the above $SiO_2$ processing, the various under films were formed in a thickness of 500 Å by collimated sputtering. Subsequently a Cu film was formed in a thickness of 6000 Å and subjected to thermal treatment at 450° C. for 30 minutes. Excess Cu was removed by chemical-mechanical polishing (CMP) to obtain a sample for a reliability test.

The reliability test was conducted at a test temperature of 300° C. at a current density of $2 \times 10^6$ A/cm$^2$ under vacuum. The results were also shown in Table 18. If the electrical resistance of the wiring after the thermal treatment was converted to specific resistance value, the value was about 1.7 μΩcm. This value was substantially the same as a bulk value of Cu. Accordingly this indicated that the thermal treatment did not cause reaction between the underlying film and Cu. Further, although the thermal treatment of this example was conducted under vacuum, the thermal treatment may be conducted at a hydrogen atmosphere or, a mixture of hydrogen and nitrogen gas (forming gas). Moreover, although in this example a Cu film was formed continuously after the formation of an under film, the Cu film does not need to be formed just after the formation of the under film. That is, after the formation of the under film, the sample may be exposed to the air and subjected to plasma cleaning of the under film surface in vacuum for removing a natural oxide film, followed the formation of the Cu film.

One of Ti, Zr, Hf, V, Nb, Ta or Cr elements was added to the underlying film in the amount of 1 to 10 at % keeping the amorphous formability. After the formation of Cu wiring, the sample was heated to 600 to 750° C. at a $NH_3$ or $N_2$ atmosphere to form a nitride film on the Cu wiring surface and in the interface between the underlying film and Cu film. As a result, even after a formation of a TEOS insulative film, the electrical resistance did not increase and the oxidation of Cu wiring was remarkably reduced.

If bias of −20 to −50 V was applied to a substrate at the time of forming a Cu film, the orientation of the Cu film was improved and a composition range allowing excellent EM endurance was enlarged, as shown in Table 18(m) (a substrate bias was −30 V).

As comparative samples, results of Cu films without an under film were shown in Table 18(l) and (m).

TABLE 18 (a)

$Ti_xCu_{100-x}$

| Underlying film composition, X | 10 | 18 | 30 | 50 | 70 | 80 |
|---|---|---|---|---|---|---|
| Existence of halo peak | x | o | o | o | o | x |
| Cu film FWHM | 7.2° | 1.6° | 1.4° | 1.1° | 1.0° | 7.8° |
| EM endurance | x | o | o | o | o | x |

TABLE 18 (b)

$Zr_xCu_{100-x}$

| Underlying film composition, X | 10 | 18 | 30 | 50 | 70 | 80 |
|---|---|---|---|---|---|---|
| Existence of halo peak | x | o | o | o | o | x |
| Cu film FWHM | 7.2° | 1.2° | 1.0° | 1.0° | 0.9° | 6.5° |
| EM endurance | x | o | o | o | o | x |

TABLE 18 (c)

$Hf_xCu_{100-x}$

| Underlying film composition, X | 10 | 20 | 40 | 50 | 70 | 80 |
|---|---|---|---|---|---|---|
| Existence of halo peak | x | o | o | o | o | x |
| Cu film FWHM | 6.5° | 1.2° | 1.0° | 0.9° | 0.9° | 6.7° |
| EM endurance | x | o | o | o | o | x |

TABLE 18 (d)

$Y_xCu_{100-x}$

| Underlying film composition, X | 5 | 10 | 12 | 33 | 50 | 53 | 60 |
|---|---|---|---|---|---|---|---|
| Existence of halo peak | x | o | o | o | o | o | x |
| Cu film FWHM | 7.0° | 3.4° | 1.4° | 1.4° | 1.1° | 1.0° | 7.2° |
| EM endurance | x | Δ | o | o | o | o | x |

TABLE 18 (e)

$V_xCo_{100-x}$

| Underlying film composition, X | 10 | 15 | 25 | 50 | 70 | 80 | 90 |
|---|---|---|---|---|---|---|---|
| Existence of halo peak | x | o | o | o | o | o | x |
| Cu film FWHM | 6.8° | 1.9° | 1.3° | 1.5° | 1.2° | 1.7° | 5.8° |
| EM endurance | x | o | o | o | o | o | x |

TABLE 18 (f)

$Nb_xCr_{100-x}$

| Underlying film composition, X | 20 | 25 | 35 | 40 | 45 | 60 |
|---|---|---|---|---|---|---|
| Existence of halo peak | x | ○ | ○ | ○ | ○ | x |
| Cu film FWHM | 6.1° | 1.6° | 1.0° | 1.1° | 1.5° | 7.2° |
| EM endurance | x | ○ | ○ | ○ | ○ | x |

TABLE 18 (g)

$Co_xNb_{100-x}$

| Underlying film composition, X | 30 | 40 | 45 | 60 | 70 | 78 | 85 |
|---|---|---|---|---|---|---|---|
| Existence of halo peak | x | ○ | ○ | ○ | ○ | ○ | x |
| Cu film FWHM | 2.8° | 2.5° | 1.0° | 1.1° | 1.2° | 1.8° | 6.5° |
| EM endurance | Δ | Δ | ○ | ○ | ○ | ○ | x |

TABLE 18 (h)

$Ta_xCr_{100-x}$

| Underlying film composition, X | 20 | 25 | 35 | 40 | 45 | 60 |
|---|---|---|---|---|---|---|
| Existence of halo peak | x | ○ | ○ | ○ | ○ | x |
| Cu film FWHM | 6.9° | 1.8° | 1.0° | 0.9° | 2.6° | 6.5° |
| EM endurance | x | ○ | ○ | ○ | Δ | x |

TABLE 18 (i)

$Ta_xCo_{100-x}$

| Underlying film composition, X | 20 | 25 | 33 | 40 | 45 | 50 | 60 |
|---|---|---|---|---|---|---|---|
| Existence of halo peak | x | ○ | ○ | ○ | ○ | ○ | x |
| Cu film FWHM | 6° | 1.1° | 0.8° | 1.0° | 1.2° | 2.7° | 7.8° |
| EM endurance | x | ○ | ○ | ○ | ○ | Δ | x |

TABLE 18 (j)

$Cr_xCo_{100-x}$

| Underlying film composition, X | 45 | 50 | 60 | 70 | 80 |
|---|---|---|---|---|---|
| Existence of halo peak | x | ○ | ○ | ○ | x |
| Cu film FWHM | 7.2° | 1.9° | 1.3° | 1.8° | 6.2° |
| EM endurance | x | ○ | ○ | ○ | x |

TABLE 18 (k)

$Mo_xCo_{100-x}$

| Underlying film composition, X | 10 | 20 | 35 | 45 | 60 | 80 |
|---|---|---|---|---|---|---|
| Existence of halo peak | x | ○ | ○ | ○ | ○ | x |
| Cu film FWHM | 6.5° | 1.0° | 0.9° | 0.8° | 1.2° | 6.2° |
| EM endurance | x | ○ | ○ | ○ | ○ | x |

TABLE 18 (l)

$V_xCo_{100-x}$

| Underlying film composition, X | 15 | 20 | 35 | 45 | 60 | 70 | 90 | on $SiO_2$ |
|---|---|---|---|---|---|---|---|---|
| Existence of halo peak | x | ○ | ○ | ○ | ○ | ○ | x | x |
| Cu film FWHM | 5.0° | 1.0° | 0.9° | 0.8° | 1.0° | 2.5° | 7.0° | 9.0° |
| EM endurance | x | ○ | ○ | ○ | ○ | Δ | x | x |

TABLE 18 (m)

$W_xCo_{100-x}$

| Underlying film composition, X | 15 | 20 | 35 | 45 | 60 | 70 | 90 | on $SiO_2$ |
|---|---|---|---|---|---|---|---|---|
| Existence of halo peak | x | ○ | ○ | ○ | ○ | ○ | x | x |
| Cu film FWHM | 2.8° | 0.6° | 0.5° | 0.5° | 0.6° | 1.8° | 6.2° | 7.0° |
| EM endurance | Δ | ○ | ○ | ○ | ○ | ○ | x | x |

TABLE 18 (n)

$Ta_xCu_{100-x}$

| Underlying film composition, X | 10 | 20 | 40 | 60 | 80 | 90 |
|---|---|---|---|---|---|---|
| Existence of halo peak | x | ○ | ○ | ○ | ○ | x |
| Cu film FWHM | 7.6° | 1.5° | 1.1° | 1.0° | 1.4° | 7.2° |
| EM endurance | x | ○ | ○ | ○ | ○ | x |

Table 18 (a) to 18 (n)
FWHM: Full Width at Half Maximum
EM endurance:
(Test temperature, 300° C.; Current density, $2 \times 10^6$ A/cm$^2$)
Endurance of 1000 hours or more; ○
Endurance of 500 hours or more, but not more than 1000 hours; Δ
Endurance of 500 or less; x
Composition in at % unit.

EXAMPLE 55

Grooves with a depth of 2000 Å and width of 1 μm in a shape similar to that as shown in FIG. 30(a) were formed on a six-inch silicon wafer with a 4000 Å thermal oxide film. Al was vapor deposited in a thickness of 2000 Å on this substrate. In the Al vapor deposition, a K-cell temperature was 1200° C. and a substrate temperature was room temperature. The Al film morphology was observed by a SEM. It was found that Al was uniformly deposited on the grooves and SiO$_2$ surface other than the grooves like the Al film as shown in FIG. 30(b).

Further, Al was vapor deposited in a thickness of 2000 Å on a similar substrate with grooves under the above conditions. A substrate temperature was room temperature. Subsequently, keeping vacuum, thermal treatment at 400° C. for 3 hours was conducted. It was found that the grooves of the substrate were substantially completely filled with Al, while Al hardly remained on SiO$_2$ surface other than the grooves like the Al film as shown in FIG. 30(c).

Next, Al deposited on a similar substrate with grooves in thicknesses of 2000 Å and 1 ML of Bi was simultaneously deposited at the beginning of the Al deposition. The Bi vapor deposition conditions were similar to those of Example 31. The Al vapor deposition conditions are shown above. A substrate temperature was room temperature. Subsequently, keeping vacuum, thermal treatment at 200° C. for 3 hours was conducted. It was found that the grooves of the substrate were substantially completely filled with Al, while Al hardly remained on the $SiO_2$ surface other than the grooves as shown in FIG. 30(d).

In the case of Ga, In, Cd, Sn, Pb or Tl, similar results were obtained.

EXAMPLE 56

Referring to FIG. 16, an embodiment will be described. Like Example 14, a six-inch silicon wafer 1 with a 4000 Å insulative film 5 formed of a thermal oxide film was used as a substrate. An AlPt amorphous thin film 3 was formed by means of a multi-target sputter apparatus as shown in FIG. 5. The sputter conditions are shown below.

Sputter system: RF magnetron system
Target: 100 mmφ AlPt mosaic target
Substrate temperature: Room temperature (25° C.)
Sputter gas: Ar
Gas pressure: 0.20 Pa
Applied power: 10 W/cm$^2$
Film thickness: 100 Å

Composition analysis revealed that the formed film 3 was $Al_{40}Pt_{60}$. X-ray diffraction analysis confirmed that the film 3 was amorphous.

Next, keeping vacuum, Pt was sputtered on the AlPt film. The sputter conditions are as shown below.

Sputter system: RF magnetron system
Target: 100 mmφ Pt target
Substrate temperature: Room temperature (25° C.)
Sputter gas: Ar
Gas pressure: 1 Pa
Applied power: 5 W/cm$^2$
Film thickness: 1000 Å

The Pt film 33 thus formed as an under electrode was evaluated for the orientation and crystalline properties by X-ray diffraction. The (111) orientation FWHW was 1.3° and satisfactory crystalline properties were observed.

Further, the laminated electrode film was heat-treated at 500° C. for 15 min. in a vacuum. As a result of the treatment, the amorphous AlPt layer 3 was disappeared by reacting with the Pt layer 33. The specific resistance of the electrode, however, did not increase after the reaction. The orientation thereof was improved to 1.0°.

Next, on the under electrode layer, a strontium titanate film 34 was formed as a dielectric thin film by sputtering. A sintered body of strontium titanate was used as a target. The sputter conditions are shown below.

Sputter system: RF magnetron system
Target: 100 mmφ $SrTiO_3$ target
Substrate temperature: 500° C.
Sputter gas: $Ar/O_2$
Gas pressure: 1 Pa
Applied power: 5 W/cm$^2$
Film thickness: 5000 Å

The orientation and crystalline properties of the dielectric thin film were evaluated by X-ray diffraction. The (111) orientation of Pt film 33 were continued and the (111) orientation of FWHM was 1.2°. A Pt film 35 was formed on the dielectric thin film 34 as an upper electrode by sputtering under the above-mentioned conditions and dielectric properties thereof were evaluated. It was found that dielectric constant and leak current exhibited satisfactory values.

On the other hand, for comparison, the orientation FWHM of a Pt film 33 directly formed on the thermal oxide film 5 was 8.6° after heat-treatment at 500° C. for 15 min. in a vacuum. When a strontium titanate film was formed thereon under the same conditions as mentioned above, the orientation FWHM was 9.0°. The dielectric properties thereof were evaluated. As a result, it was found that the dielectric properties were inferior to those of example 56 of the invention. That is, dielectric constant decreased and leak current increased.

EXAMPLE 57

Figure 32:
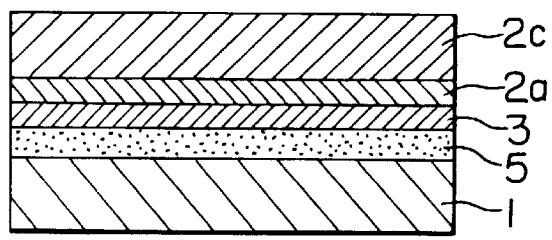
FIG. 32 is a sectional view according to Example 57.

We will describe this example referring to FIG. 32.

A six-inch silicon wafer 1 with a thermal oxide film 5 having a thickness of 1000 Å was used as a substrate. A TaAl film 3 was formed by means of a multi-target sputter apparatus as shown in FIG. 5. The base pressure was controlled to be $1 \times 10^{-6}$ Pa or less. The sputtering conditions are shown below.

Sputter system: RF magnetron system
Target: 100 mmφ Ta/Al binary targets
Substrate temperature: Room temperature (25° C.)
Sputter gas: Ar
Gas pressure: 0.20 Pa
Applied power: 10 W/cm$^2$
Film thickness: 100 Å

The TaAl film 3 thus formed was subjected to composition analysis. The analysis revealed that the composition thereof was $Ta_{75}Al_{25}$. X-ray diffraction revealed that the film 3 was an amorphous thin film and had an interatomic distance ds of 2.34 Å which was determined from a peak of halo pattern appearing in diffraction measurement.

Next, on the amorphous TaAl thin film 3, a Ti film 2a as a first layer of a metal wiring was formed by sputtering. The sputter conditions are shown below.

Sputter system: RF magnetron system
Target: 100 mmφ Ti target
Substrate temperature: Room temperature (25° C.)
Sputter gas: Ar
Gas pressure: 1 Pa
Applied power: 5 W/cm$^2$
Film thickness: 200 Å

A spacing dm of (002) plane of Ti was 2.34 Å. Thus, it was found that since |dm−ds|/ds=0, the interatomic distance ds of the amorphous thin film 3 almost matched with the spacing dm of (002) plane of Ti film 2a.

On the Ti intermediate layer 2a, Al was sputtered as a second layer of a metal wiring 2c. The sputter conditions are shown below.

Sputter system: RF magnetron system
Target: 100 mmφ Al target
Substrate temperature: Room temperature (25° C.)
Sputter gas: Ar
Gas pressure: 1 Pa
Applied power: 5 W/cm$^2$
Film thickness: 4000 Å

A spacing df of (111) plane of Al film 2c was 2.34 Å. Thus, it was found that since |df−ds|/ds=0 the interatomic distance ds of the amorphous film 3 matched with the spacing dt of (111) plane of Al film 2c.

All the above lamination of films were carried out under the same vacuum conditions. The Al film 2c thus formed was evaluated for the orientation property by X-ray diffraction.

The FWHM of a (111) rocking curve of the Al film 2c (orientation FWHM was 0.9°.

On the other hand, the FWHM of a rocking curve of an Al film 2c which was formed directly on the amorphous TaAl thin film 3 without the Ti first layer 2a was 1.3°. Thus, it was found that the first layer 2a contributed to the improvement of orientation property. Further, when the base pressure was not so high, high orientation Al film did not be formed, because an oxide film was formed on the surface of the amorphous film.

Next, this multi-layered film 2a and 2c was processed into a metal wiring for the electromigration test. Steps for preparing a test sample were as follows: As shown in FIG. 15, a test substrate 24 having an anode 21, a cathode 22, and a wiring part 23 connecting these electrodes was prepared by standard lithography and RIE steps. In this case, the width of the wiring part 23 was 0.5 µm. An electric current at a current density of $2 \times 10^6$ A/cm$^2$ was flown to the wiring part 23 of the test substrate 24 at a test temperature of 200° C. It was confirmed that even after the elapsed time of 2000 hours there was no failure. This exhibits that since the Al film 2c as the metal wiring was highly oriented the electromigration endurance was dramatically enhanced.

EXAMPLE 58

Like example 57, a six-inch silicon wafer 1 with a thermal oxide film 5 having a thickness of 1000 Å was used as a substrate. A NbAl film 3 was formed by means of a multi-target sputter apparatus as shown in FIG. 5. The base pressure was controlled to be $1 \times 10^{-6}$ Pa or less. The sputter conditions are shown below.

Sputter system: RF magnetron system
Target: 100 mmφ Nb/Al binary targets
Substrate temperature: Room temperature (25° C.)
Sputter gas: Ar
Gas pressure: 0.20 Pa
Applied power: 10 W/cm$^2$
Film thickness: 300 Å

The NbAl film 3 thus formed was subjected to composition analysis. The analysis revealed that the composition thereof was $Nb_{50}Al_{50}$. X-Ray diffraction revealed that the film 3 was an amorphous thin film and had an interatomic distance ds of 2.33 Å which was determined from a peak of halo pattern appearing in diffraction measurement.

Next, on the amorphous NbAl thin film 3, a TiN film 2a as a first layer of a metal wiring was formed by sputtering. The sputter conditions are shown below.

Sputter system; RF magnetron system
Target: 100 mmφ Ti target
Substrate temperature: Room temperature (25° C.)
Sputter gas: Ar/N$_2$
Gas pressure: 1 Pa
Applied power: 5 W/cm$^2$
Film thickness: 300 Å

A spacing dm of (111) plane of TiN was 2.44 Å. Thus, it was found that since |dm−ds|/ds=0.047, the interatomic distance ds of the amorphous thin film 3 approximately matched with the spacing dm of (111) plane of TiN 2a.

On the TiN film 2a, Al was sputtered as a second layer of a metal wiring, by the same conditions as those of example 57.

A spacing df of (111) plane of Al film 2c was 2.34 Å. Thus, it was found that since |df−ds|/ds=0.004 the interatomic distance ds of the amorphous this film 3 approximately matched with the spacing df of (111) plane of Al film 2c.

All the above lamination of films were carried out under the same vacuum conditions. The Al film 2c thus formed was evaluated for the orientation property by X-ray diffraction. It was confirmed that the Al film 2c was highly (111) oriented film having FWHM of a rocking curve of 1.0°.

On the other hand, the FWHM of a rocking curve of an Al film 2c which was formed directly on the amorphous NbAl thin film 3 without the TiN first layer 2a was 1.4°. Thus, it was found that the first layer contributed to more improvement of orientation property.

Further, this multi-layered film 2a and 2c was processed into a metal wiring and subject to an electromigration test by using the same conditions as those of example 57. The metal wiring also exhibited an excellent endurance.

EXAMPLE 59

Figure 33:
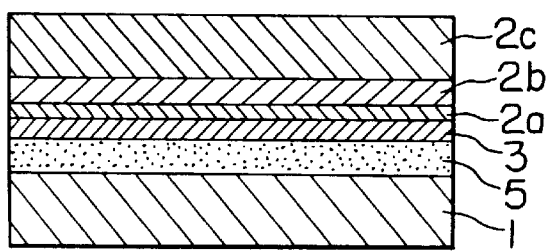
FIG. 33 is a sectional view according to Example 59.

We will describe this example referring to FIG. 33.

A six-inch silicon wafer 1 with a thermal oxide film 5 having a thickness of 1000 Å was used as a substrate. A CuTi film 3 was formed by using the same multi-target sputter apparatus as used in example 58. The base pressure was controlled to be $1 \times 10^{-6}$ Pa or less. The sputtering conditions are shown below.

Sputter system: RF magnetron system
Target: 100 mmφ Cu/Ti binary targets
Substrate temperature: Room temperature (25° C.)
Sputter gas: Ar
Gas pressure: 0.20 Pa
Applied power: 10 W/cm$^2$
Film thickness: 500 Å

The CuTi film 3 thus formed was subjected to composition analysis. The analysis revealed that the composition thereof was $Cu_{58}Ti_{42}$. X-ray diffraction revealed that the film 3 was amorphous and had an interatomic distance ds of 2.17 Å which was determined from a peak of halo pattern appearing in diffraction measurement.

After the amorphous Cu/Ti thin film 3 was once exposed in an air, it was cleaned by treating the surface with plasma. Then, the lamination film of TiN/Ti was formed as a first layer of a metal wiring by sputtering. First, a Ti film 2a was formed by sputtering Ti as a target in an Ar gas. Then, a TiN film 2b was formed in a mixed gas of Ar/N$_2$. The sputter conditions are shown below.

Sputter system: RF magnetron system
Target: 100 mmφ Ti target
Substrate temperature: Room temperature (25° C.)
Sputter gas: Ar, Ar/N$_2$
Gas pressure: 1 Pa
Applied power: 5 W/cm$^2$
Film thickness: TiN/Ti=700 Å/200 Å

First, a spacing dm1 of (002) plane of Ti film 2a was 2.34 Å. Thus, since |dm−ds|/ds=0.078, this approximately matched with the interatomic distance ds of the amorphous CuTi thin film 3. Further, since a spacing dm2 of (111) plane of TiN film 2b was 2.44 Å, |dm2−ds|/ds=0.124, it was found that these approximately matched with each other.

Next, an AlCu alloy as third layer of a metal wiring was sputtered. The sputter conditions are shown below.

Sputter system: RF magnetron system
Target: 100 mmφ AlCu alloy target
Substrate temperature: Room temperature (25° C.)
Sputter gas: Ar
Gas pressure: 1 Pa Applied power: 5 W/cm$^2$ Film thickness: 4000 Å

The above laminations were all carried out under the same vacuum condition. A spacing df of (111) plane of AlCu film 2c was 2.34 Å. Thus, |df−ds|/ds=0.078. It was found that these approximately matched with each other. The AlCu film 2c thus formed was evaluated for the orientation property by X-ray diffraction. It was found that the AlCu film 2c was highly (111) oriented film having FWHM of a rocking curve of 0.8°.

On the other hand, the FWHM of a rocking curve of an AlCu film 2c which was formed directly on the amorphous CuTi thin film 3 without the first and second layers 2a, 2b was 1.1° Thus, it was found that the first and second layers contributed to more improvement of orientation property.

Further, this laminated film was processed into a metal wiring and subjected to an electromigration test by using the same conditions as those of example 57. The metal wiring also exhibited an excellent endurance.

EXAMPLE 60–70

Figure 34:
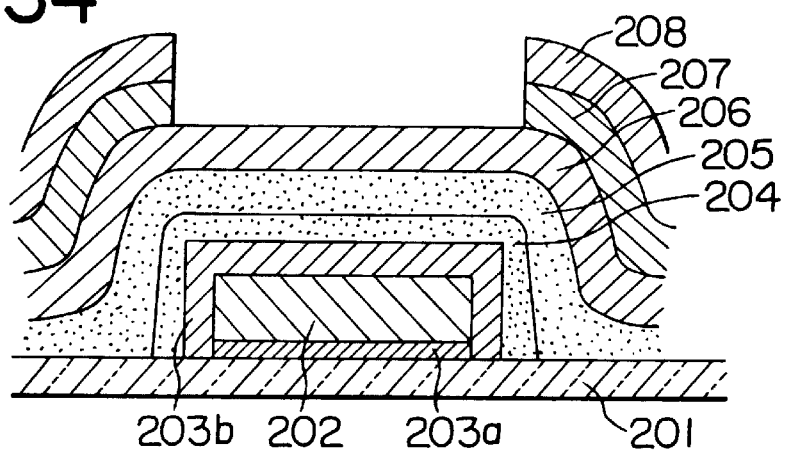
FIG. 34 is a sectional view showing an example of a wiring part of an active matrix type liquid crystal display apparatus according to the invention.

FIG. 34 is a sectional view showing an example of an active matrix type liquid crystal display apparatus of the invention. A method for forming the electrode structure is shown below.

First, an amorphous thin film 203a as an underlayer was formed on a transparent glass substrate 201 by a binary sputtering method. The compositions thereof are shown in Table 19. The thickness of the amorphous thin film 203a was about 100 Å. However, in examples 61 and 66, the amorphous thin film 203a as underlayer did not be formed.

On the amorphous thin film 203a, Al-0.5% Cu film was formed (in examples 61 and 66, directly on the glass substrate 201). Then, after the steps of PEP processing, patterning processing, and wiring sintering processing, metal wirings 202 made of a low resistant material and having a width of 6 μm and a thickness of 1500 Å were formed.

Next, an amorphous thin film 203b having a thickness of 1000 Å as an upperlayer was formed on the metal wiring 202 by using the same sputtering method as the method described above. However, in example 60, the amorphous thin film 203b as an upperlayer did not be formed. The compositions of the upperlayer are shown in Table 19. Then, after the steps of PEP processing, patterning processing, and tapering processing, an oxide film layer 204 by anodic oxidation was formed thereon. At this time, the anodic oxidation in the examples 61 to 65 was thoroughly carried out through the upper amorphous film 203b. And the anodic oxidation in the examples 66 to 70 was carried out from the surface of the upper amorphous film 203b to 900 Å depth, and the remaining part which did not be anodic-oxidized was formed as an intermediate metal layer 203b'. A thickness of the intermediate metal layer 203b' was measured by observing the cross-section, after all measurements were completed.

The following tests were conducted with the above samples.

Figure 35:
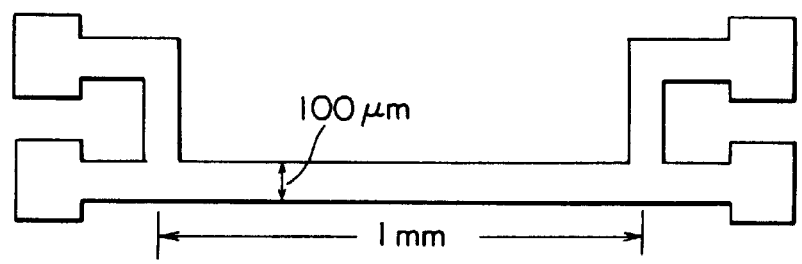
FIG. 35 is a view showing a pattern for measuring the resistivity of samples according to Example 60.
Figure 36:
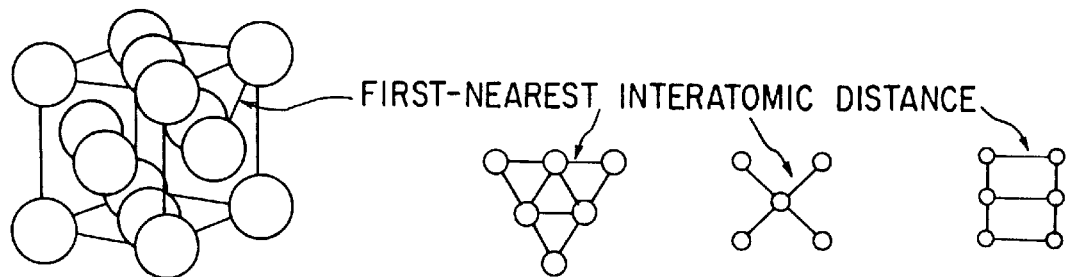
FIG. 36 is a typical view showing crystal structures of the metal wiring and to explain the first-nearest interatomic distance thereof.
Figure 36:
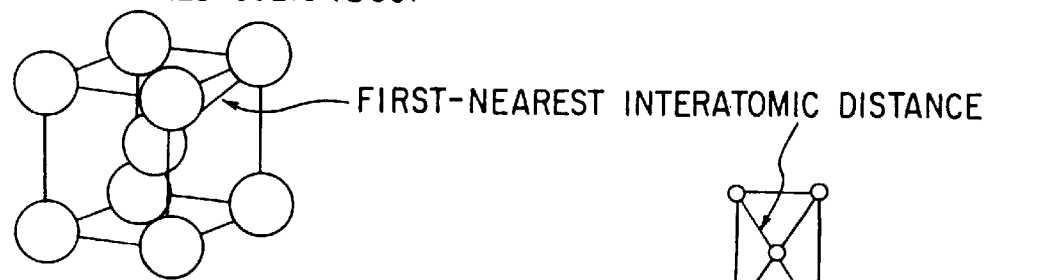
Figure 36:
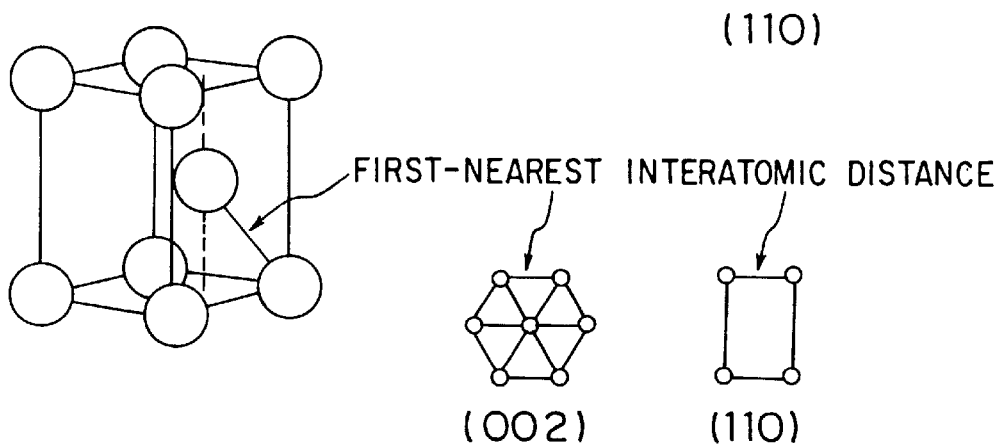

Test 1. The four probe method of the resistivity measurement was conducted for measuring the resistivity of individual samples having a shape as shown in FIG. 35. The distance of resistivity measurement was 1 mm.

Test 2. The chemical proof test was conducted by boiling treatment of individual samples in a cleaning liquid of $H_2SO_4+H_2O_2$.

Test 3. In order to examine occurrence frequency of hillocks in the metal film, the surface of individual samples thermally treated at 400° C. was observed with a microscope.

Test 4. Assuming LCD processing, a SiN passivation film 205 having a thickness of 2000 Å was formed on the oxide film layer 204, a non-doped amorphous Si film 206 having a thickness of 3000 Å was formed on the SiN passivation film 205, n$^+$type amorphous Si film 207 having a thickness of 5000 Å was formed on the non-doped amorphous Si film 206, and finally a Mo film 208 having a thickness of 500 Å was formed on the n$^+$type amorphous Si film 207, as shown in FIG. 34. The resulted model devices were evaluated. The test results are shown in Table 19.

As a comparison, comparatives 1 and 2 having similar structures providing that an electrode was composed of single layer of Ta (comparative 1) or Al (comparative 2) were prepared. The same test was conducted with these samples. The test results are shown in Table 19.

As clearly shown in Table 19, the formation of the amorphous thin film 202a as the underlayer contributes to improve the orientation of the electrode, and significantly improves the hillock endurance. In addition, the formation of the amorphous thin film 202b as the upperlayer improves the chemical endurance of the oxide film because there is no grain boundary. Further, the occurrence of hillocks can be prevented due to the absence of convergence of stress.

As described above, the electrode structure of the invention exhibits low resistivity, and has excellent chemical proof and hillock endurance.

TABLE 19

| | | Intermediate metal layer | Amorphous layer | | Chemical proofness | Hillock endurance | Resist. (Ω) |
|---|---|---|---|---|---|---|---|
| | Composition | | under | upper | | | |
| Example | | | | | | | |
| 60 | Ta$_{50}$Al$_{50}$ | none | yes | none | poor | good | 20.8 |
| 61 | Ta$_{50}$Al$_{50}$ | none | none | yes | good | good | 20.8 |
| 62 | Ta$_{50}$Al$_{50}$ | none | yes | yes | good | excellent | 20.7 |
| 63 | Nb$_{50}$Al$_{50}$ | none | yes | yes | good | excellent | 20.9 |
| 64 | W$_{50}$Al$_{50}$ | none | yes | yes | good | excellent | 20.9 |
| 65 | Mo$_{50}$Al$_{50}$ | none | yes | yes | good | excellent | 20.8 |
| 66 | Ta$_{50}$Al$_{50}$ | yes | none | yes | good | good | 20.6 |
| 67 | Ta$_{50}$Al$_{50}$ | yes | yes | yes | good | excellent | 20.5 |
| 68 | Nb$_{50}$Al$_{50}$ | yes | yes | yes | good | excellent | 20.8 |

TABLE 19-continued

| | Composition | Intermediate metal layer | Amorphous layer under | Amorphous layer upper | Chemical proofness | Hillock endurance | Resist. ($\Omega$) |
|---|---|---|---|---|---|---|---|
| 69 | $W_{50}Al_{50}$ | yes | yes | yes | good | excellent | 20.7 |
| 70 | $Mo_{50}Al_{50}$ | yes | yes | yes | good | excellent | 20.7 |
| Comparative | | | | | | | |
| 1 | Ta | none | none | none | good | good | 1280 |
| 2 | Al | none | none | none | failure | failure | 20.0 |

What is claimed is:

1. An electronic part comprising:
an amorphous thin film formed on a substrate; and
a metal wiring formed directly on a surface of the amorphous thin film;
wherein an interatomic distance ds of the amorphous thin film in an ordered structure in a short range, which is determined from a peak of halo pattern appearing in a diffraction measurement, approximately matches with a spacing df of a particular crystal plane including atoms with a first nearest interatomic distance of the metal wiring and wherein $|df-ds|/ds < 0.25$.

2. The electronic part of claim 1, wherein a titanium layer or a titanium nitride layer as a barrier layer is interposed between the substrate and the amorphous thin film.

3. The electronic part of claim 1, wherein grooves are provided on at least the surface of the amorphous thin film on which the metal wiring is formed.

4. The electronic part of claim 1 wherein the metal wiring is mainly formed of one metal element selected from Al, Cu, Au, Ag and W.

5. The electronic part of claim 1 wherein the metal wiring is mainly formed of one material selected from fcc structured pure Al, pure Cu, pure Au, pure Ag, an Al—Cu alloy, an Al—Ti alloy, an Al—Cr alloy, an Al—Ta alloy, an Al—Mg alloy, an Al—In alloy, an Al—Li alloy, a Cu—Be alloy, a Cu—Ag alloy, an Au—Pt alloy, an Au—Ag alloy, an Au—Pd alloy, an Au—Cu alloy, and bcc structured pure W.

6. The electronic part of claim 4 wherein the metal wiring contains Si in an amount of 1 Wt % or less.

7. The electronic part of claim 1, wherein a surface energy of a material constituting the amorphous thin film, when said material is in a crystal state, is larger than a surface energy of a material constituting the metal wiring.

8. An electronic part comprising:
an amorphous thin film formed on a substrate; and
a metal wiring formed directly on a surface of the amorphous thin film;
wherein an interatomic distance ds of the amorphous thin film in an ordered structure in a short range, which is determined from a peak of halo pattern appearing in a diffraction measurement, approximately matches with a spacing df of a particular crystal plane including atoms with a first nearest interatomic distance of the metal wiring and wherein $|df-ds|/ds < 0.25$, and
wherein the metal wiring is mainly formed of at least one metal element selected from the group of Al, Cu, Au, Ag and W, and the amorphous thin film contains in the range from 10 atomic percent to 90 atomic percent at least one element selected from the group consisting of the metal element or elements mainly forming the metal wiring.

9. The electronic part of claim 8, wherein the amorphous thin film contains at least two elements selected from the metal element mainly forming the metal wiring, III B group elements, IV B group elements, V B group elements, VI B group elements, VIII group elements, B, C, N, O, P, Si, and Ge.

10. An electronic part comprising:
an amorphous thin film formed on a substrate; and
a metal wiring formed directly on a surface of the amorphous thin film;
wherein an interatomic distance ds of the amorphous thin film in an ordered structure in a short range, which is determined from a peak of halo pattern appearing in a diffraction measurement, approximately matches with a spacing df of a particular crystal plane including atoms with a first nearest interatomic distance of the metal wiring and wherein $|df-ds|/ds < 0.25$, and
wherein the metal element mainly forming the metal wiring is Al, and the amorphous thin film is mainly formed of one alloy selected from $Ta_xAl_{1-x}$ ($0.20 \leq x \leq 0.85$), $Nb_xAl_{1-x}$ ($0.20 \leq x \leq 0.85$), $V_xAl_{1-x}$ ($0.20 \leq x \leq 0.60$), $W_xAl_{1-x}$ ($0.15 \leq x \leq 0.50$), $Mo_xAl_{1-x}$ ($0.25 \leq x \leq 0.80$).

11. An electronic part comprising:
an amorphous thin film formed on a substrate; and
a metal wiring formed directly on a surface of the amorphous thin film;
wherein an interatomic distance ds of the amorphous thin film in an ordered structure in a short range, which is determined from a peak of halo pattern appearing in a diffraction measurement, approximately matches with a spacing df of a particular crystal plane including atoms with a first nearest interatomic distance of the metal wiring and wherein $|df-ds|/ds < 0.25$, and
wherein the metal element mainly forming the metal wiring is Cu, and the amorphous thin film is mainly formed of one alloy selected from $V_xCo_{1-x}$ ($0.15 \leq x \leq 0.80$), $Nb_xCr_{1-x}$ ($0.25 \leq x \leq 0.45$), $Nb_xCo_{1-x}$ ($0.22 \leq x \leq 0.55$), $Ta_xCr_{1-x}$ ($0.25 \leq x \leq 0.40$), $Ta_xCo_{1-x}$ ($0.25 \leq x \leq 0.45$), $Cr_xCo_{1-x}$ ($0.50 \leq x \leq 0.70$), $Mo_xCo_{1-x}$ ($0.20 \leq x \leq 0.60$), $W_xCo_{1-x}$ ($0.20 \leq x \leq 0.60$), $Ti_xCu_{1-x}$ ($0.18 \leq x \leq 0.70$), $Zr_xCu_{1-x}$ ($0.18 \leq x \leq 0.70$), $Hf_xCu_{1-x}$ ($0.20 \leq x \leq 0.70$), $Y_xCu_{1-x}$ ($0.10 \leq x \leq 0.53$), and $Ta_xCu_{1-x}$ ($0.20 \leq x \leq 0.80$).

12. The electronic part of claim 1, wherein the metal wiring comprises a plurality of metal wiring layers.

* * * * *

UNITED STATES PATENT AND TRADEMARK OFFICE
CERTIFICATE OF CORRECTION

PATENT NO. : 6,001,461
DATED : December 14, 1999
INVENTOR(S) : Hiroshi Toyoda et al.

It is certified that error appears in the above-identified patent and that said Letters Patent is hereby corrected as shown below:

Claim 11, column 58, line 54, change "$V_xCo_{1.}$" to --$V_xCo_{1-x}$--;

line 55, change "$Nb_xCr_{1.}$" to --$Nb_xCr_{1-x}$--;
change "$Nb_xCo_{1.}$" to --$Nb_xCo_{1-x}$--;

line 56, change "$Ta_xCr_{1.}$" to --$Ta_xCr_{1-x}$--;
change "$Ta_xCo_{1.}$" to --$Ta_xCo_{1-x}$--;

line 57, change "$Cr_xCo_{1.}$" to --$Cr_xCo_{1-x}$--;
change "$Mo_xCo_{1.}$" to --$Mo_xCo_{1-x}$--;

line 58, change "$W_xCo_{1.}$" to --$W_xCo_{1-x}$--;
change "$Ti_xCu_{1.}$" to --$Ti_xCu_{1-x}$--;

line 59, change "$Zr_xCu_{1.}$" to --$Zr_xCu_{1-x}$--;
change "$Hf_xCu_{1.}$" to --$Hf_xCu_{1-x}$--;

line 60, change "$Y_xCu_{1.}$" to --$Y_xCu_{1-x}$--; and
change "$Ta_xCu_{1.}$" to --$Ta_xCu_{1-x}$--.

Signed and Sealed this

Second Day of January, 2001

Attest:

Q. TODD DICKINSON

*Attesting Officer*         *Commissioner of Patents and Trademarks*